United States Patent [19]
Glover et al.

[11] Patent Number: 5,844,919
[45] Date of Patent: *Dec. 1, 1998

[54] SECTOR AND TRACK LEVEL ERROR CORRECTION SYSTEM FOR DISC STORAGE SYSTEMS

[75] Inventors: Neal Glover, Broomfield; Christopher P. Zook, Longmont; John Schadegg, Littleton; William L. Witt, Broomfield, all of Colo.

[73] Assignee: Cirrus Logic, Inc., Fremont, Calif.

[ * ] Notice: The term of this patent shall not extend beyond the expiration date of Pat. No. 5,701,304.

[21] Appl. No.: 697,686

[22] Filed: Sep. 16, 1996

[51] Int. Cl.$^6$ .................................................. G11C 29/00
[52] U.S. Cl. ................. 371/40.14; 371/10.2; 395/182.04
[58] Field of Search .................. 371/40.14, 40.11–40.13, 371/10.2, 40.4; 395/182.04, 182.06, 183.18; 360/53

[56] References Cited

U.S. PATENT DOCUMENTS

| | | | |
|---|---|---|---|
| 4,949,326 | 8/1990 | Takagi et al. | 369/53 |
| 5,077,720 | 12/1991 | Takagi et al. | 369/59 |
| 5,239,640 | 8/1993 | Froemke et al. | 395/425 |
| 5,392,290 | 2/1995 | Brown et al. | 371/10.1 |
| 5,446,743 | 8/1995 | Zook | 371/37.1 |
| 5,450,251 | 9/1995 | Kitagawa | 360/48 |
| 5,467,361 | 11/1995 | Shipman, Jr. | 371/40.1 |
| 5,499,337 | 3/1996 | Gorden | 395/182.04 |
| 5,517,484 | 5/1996 | Takagi et al. | 369/275.3 |
| 5,530,948 | 6/1996 | Islam | 395/182.04 |
| 5,602,857 | 2/1997 | Zook et al. | 371/40.3 |

OTHER PUBLICATIONS

Neal Glover "An Overview of Error Detection and Correction Technology For Storage Device", Aug. 18, 1988, Data Systems Technology, Corp.

Neal Glover and Trent Dudley, *Practical Error Correction Design For Engineers*, 1988, Data Systems Technology Corp., pp. 270–271.

*Primary Examiner*—Emmanuel L. Moise
*Attorney, Agent, or Firm*—Howard H. Sheerin; Dan A. Shifrin

[57] ABSTRACT

A disc storage system comprising a sector level ECS for correcting errors within a sector during readback, and a track level ECS for correcting a sector that becomes unrecoverable at the sector level either because the number of hard errors exceeds the error correction capability of the sector redundancy, or because the sector is unreadable due, for instance, to an inability to synchronize to the sector data. A data buffer stores the data sectors, and a redundancy buffer stores the track level redundancy data. If during a read operation a data sector is determined to be unrecoverable using the sector level redundancy, the storage system corrects the unrecoverable sector using the track level redundancy.

23 Claims, 32 Drawing Sheets

SECTOR AND TRACK LEVEL ERROR CORRECTION SYSTEM FOR DISC STORAGE SYSTEMS

FIELD OF INVENTION

The present invention relates to disc storage systems (such as magnetic and optical), particularly to an error detection and correction system that employs sector level redundancy for detecting and correcting errors within a data sector, and track level redundancy for correcting a data sector unrecoverable at the sector level.

CROSS REFERENCE TO RELATED APPLICATIONS AND PATENTS

This application is related to co-pending U.S. patent application Ser. No. 08/326,126 entitled "Error Correction Method and Apparatus." now U.S. Pat. No. 5,602,857. This application is also related to U.S. Pat. No. 5,446,743 entitled "Coefficient Updating Method and Apparatus for Reed-Solomon Decoder." The above referenced U.S. patent application and U.S. patent are assigned to the same entity and are hereby incorporated by reference.

BACKGROUND OF THE INVENTION

Disc drive storage devices typically store binary data onto the surface of a rotating disc in divisible units referred to as tracks, where each track is divided into a number of data units referred to as sectors. In magnetic storage devices, for example, the digital data serves to modulate a write current in a inductive recording head in order to write a series of magnetic flux transitions onto the surface of a magnetizable disc in a series of concentric, radially spaced tracks. And in optical recording systems, the digital data may modulate the intensity of a laser beam in order to record a series of "pits" onto the surface of an optical disk in spiral tracks.

The host system connected to the storage device accesses the disc drive by writing and reading data to and from a particular sector. The disc drive positions a recording head (or transducer) over the track containing the requested sector, waits for the disc to rotate until the recording head is over the requested sector within the track, and then performs a write or read operation on the sector. The latency associated with spinning the disc to the requested sector is a significant factor in the overall operation speed (access time) of the disc drive. Once the transducer reaches the target track, the storage system must wait for the disc to complete one-half a revolution on average to reach the target sector for every read and write operation requested.

The sectors on a track typically include user data and appended sector level redundancy symbols for detecting and correcting errors in the user data when reading the sector from the disc. During a read operation, a sector level error correction system (ECS) uses the sector level redundancy symbols to detect and correct errors in the user data that occur due, for example, to noise or defects in the recording/reproduction process. If the number of errors detected exceeds the error correction capability of the sector level ECS, then depending on the nature of the errors, the entire sector may be unrecoverable. Random errors caused by noise in the reproduction process (e.g., electronic noise induced in the read signal) are referred to as "soft errors" because they may not necessarily render the sector permanently unrecoverable. That is, the storage system can "retry" the read operation until the number of soft errors is within the error correction capability of the sector level ECS.

Permanent errors, or "hard errors", are typically associated with defects (drop-outs, aberrations, etc.) on the surface of the disc which render the medium permanently unrecoverable if the number of hard errors exceeds the error correction capability of the sector level ECS. Further, every sector typically includes a preamble field and a sync mark for use by timing recovery in synchronizing to the data in the sector. If a hard error corrupts this timing information, then the entire sector may become completely unreadable due to the inability to synchronize to the data.

In the context of this application, an unrecoverable sector refers either to a readable but uncorrectable sector at the sector level, or an unreadable sector due, for example, to an inability to synchronize to the sector data.

There are prior art disc storage systems which attempt to protect against losing an entire sector that has become unrecoverable at the sector level. For example, U.S. Pat. No. 5,392,290 entitled "System and Method for Preventing Direct Access Data Storage System Data Loss from Mechanical Shock During Write Operation," suggests using a parity sector within each track, wherein the parity sector comprises the XOR (parity) of all of the data sectors for that track. In this manner, if any one of the data sectors becomes unrecoverable, it can be completely reconstructed using the parity sector.

The parity sector in the above scheme is updated during each write operation by first reading the sector that is to be over written and "backing out" its contribution to the parity sector (by XORing it with the parity sector). Then, the new sector is written to the disc and added (XORed) into the parity sector. The updated parity sector is then written back to the disc. If a particular sector is determined unrecoverable during a read operation, then to recover that sector the storage system reads and XORs the other sectors in the track (including the parity sector), and the result of the XOR operation is the unrecoverable sector.

This track level parity sector scheme for recovering an unrecoverable sector has not been widely employed in disc storage systems due to the intolerable increase in latency associated with updating the parity sector during each write operation. That is, the storage system must seek to the sector to be over written, read that sector (or sectors), and "back out" its contribution to the parity sector. Then, it must wait for a complete revolution in order to write the new sector (or sectors). Finally, the storage system must wait for the disc to spin to the parity sector so that it can over write it with the updated parity sector. Further, the revolution of latency associated with backing out the contribution of the target data sectors from the redundancy sector applies even if the write range spans one less sector than the entire track.

Another problem inherent in the prior art track level parity sector scheme is that it can correct only one unrecoverable sector per track. Thus, if two or more sectors on a track become unrecoverable, the prior art parity sector scheme is rendered useless.

Yet another problem not addressed by the prior art parity sector scheme is that a sector can become unrecoverable due to errors associated with a write operation on that sector. For example, a defect on the medium may result in a hard error depending on how the sector data is written to the disc. That is, a corrupted write operation may result in excessive hard errors which render the sector uncorrectable, whereas another write operation may not. For example, a phenomena that can result in an unrecoverable sector, known as "high write", occurs when an anomaly on the medium causes the fly height of the recording head to increase, thereby decreasing the magnetization strength of the inductive write signal. Thus, if a first sector on a track becomes unrecoverable due to a corrupted write operation, and no attempt is made to read that first sector before a second sector becomes unrecoverable due to a subsequent corrupted write operation, then the prior art parity sector scheme will be unable to recover either sector.

Consequently, most disc storage systems do not employ a track level parity sector; instead, they take other precautions to protect against influences which may render a sector unrecoverable. Namely, to protect against hard errors which may render a sector unreadable due to defects in the medium at the preamble or sync mark fields, the entire disc is tested during manufacturing. If it is determined that the preamble or sync mark field cannot be read due to defects in the medium, then that sector is mapped to a spare sector. A similar "defect scan" and "defect mapping" can be performed for the entire sector to determine if the number of resulting hard errors will exceed the error correction capability of the sector level ECS. Alternatively, a system designer may increase the error correction capability of the sector level ECS to decrease the probability that a sector will become uncorrectable.

The problem with scanning the medium for defects during the manufacturing process and mapping bad sectors to spare sectors is that it does not account for "grown defects", defects that arise during the lifetime of the storage system. Grown defects include, for example, invading foreign particles which become embedded onto the surface of the disc, or external shocks to the storage system which can cause the transducer to nick the surface of the disc. Furthermore, there are problems associated with increasing the error correction capability of the sector level ECS to overcome grown defects. Namely, it becomes prohibitively complex and expensive to implement, and it reduces the capacity of the storage system due to the increase in the sector level redundancy bytes.

There is, therefore, a need for a disc storage system that can protect against read errors rendering a sector unrecoverable, without increasing the cost and complexity of the sector level ECS, and without the above mentioned problems associated with the prior art track level ECC scheme.

SUMMARY OF THE INVENTION

A disc storage system is disclosed which comprises a sector level ECS for correcting errors within a sector during readback, and a track level ECS for correcting a sector that becomes unrecoverable at the sector level either because the number of hard errors exceeds the error correction capability of the sector redundancy, or because Lithe sector is unreadable due, for instance, to an inability to synchronize to the sector data. The sector level ECS is preferably implemented using a high order Reed-Solomon code capable of correcting multiple random burst errors, and the track level ECS is preferably implemented using a less complex error correction code such as byte XOR or a first order Reed-Solomon code.

The storage system comprises a data buffer for storing the data sectors, and a redundancy buffer for storing the track level redundancy data. During a write operation, the new data sectors are received from the host system and stored in the data buffer. Then, as each data sector is retrieved from the data buffer and written to the disc after appending the sector level redundancy, the data sectors are combined according to an error correction operation to form the track level redundancy data stored in the redundancy buffer. Once all of the data sectors in the buffer have been written to the disc, the redundancy data is retrieved from the redundancy buffer, sector level redundancy is added, and the redundancy data is written to a redundancy sector for the track.

If during a read operation a data sector is determined to be unrecoverable using the sector level redundancy, the storage system corrects the unrecoverable sector according to the following steps:

1. read all of the sectors on the track including the redundancy sector;
2. as each sector is read, combine the sectors according to a predetermined error correction operation (e.g., byte XOR) to generate a sector of syndromes stored in the redundancy buffer;
3. if the sector level error correction system detects a correctable error in one of the sectors read, use the correction information to correct the contents of the redundancy buffer;
4. if the unrecoverable sector is readable but uncorrectable using the sector level redundancy, then use the syndromes stored in the redundancy buffer to correct the unrecoverable sector; and
5. if the unrecoverable sector is unreadable due, for example, to an inability to synchronize to the sector data, then replace the unrecoverable sector with the contents of the redundancy buffer.

The track level error correction capability is increased by interleaving the track level redundancy. In the preferred embodiment, each sector is divided into three interleaves or codewords with sector level redundancy generated for each interleaved codeword. The track level redundancy is then generated by combining the interleaved codewords separately according to a predetermined error correction operation (e.g., byte XOR) to form an interleaved redundancy sector. During readback, the sector level ECS generates an erasure pointer corresponding to an uncorrectable codeword within a sector for use by the track level ECS. In this manner, the track level ECS can correct up to three uncorrectable sectors (as opposed to one uncorrectable sector in the above prior art implementation) when three sectors contain a single uncorrectable codeword in separate interleaves.

BRIEF DESCRIPTION OF THE DRAWINGS

The above and other aspects and advantages of the present invention will be better understood by reading the following detailed description of the invention together with the drawings, wherein.

DETAILED DESCRIPTION OF THE PREFERRED EMBODIMENT

Overview

Figure 1A:
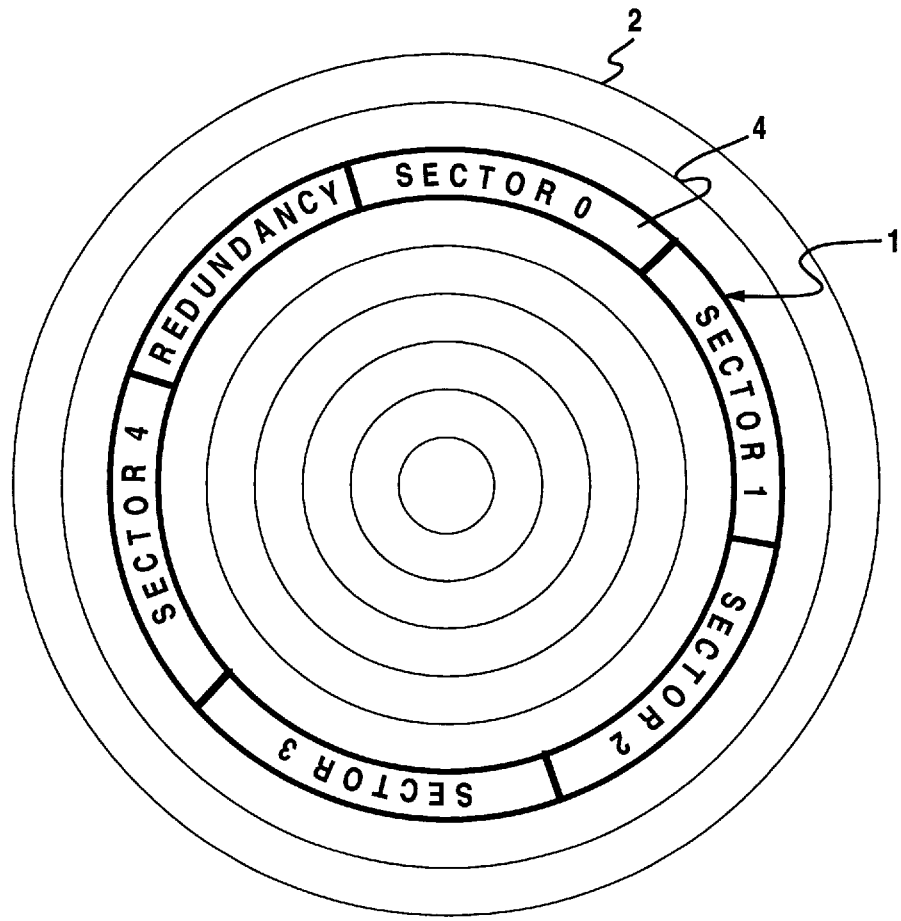
FIG. 1A shows an exemplary format of a disc partitioned into a plurality of tracks, where each track comprises a redundancy sector used to correct an unrecoverable data sector.

FIG. 1A shows the general format of a disc 2 comprising a number of data tracks where each track comprises a number of data sectors and a redundancy sector. The redundancy sector has the same format as the data sectors except it may optionally contain a few extra bytes for storing status as described below. The redundancy sector is generated according to a predetermined error correction operation (e.g., byte XOR) over the data sectors for use in correcting a data sector that has become unrecoverable at the sector level.

Figure 1B:
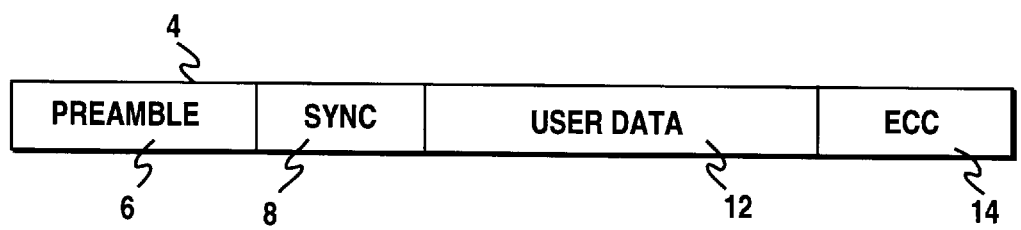
FIG. 1B shows the format of each sector in a track.

An example track 1 on the disc 2 comprises five sectors, where each sector 4 (as shown in FIG. 1B) comprises a preamble 6 for use in synchronizing timing recovery, a sync mark 8 for use in synchronizing to the user data 12, and ECC redundancy bytes 14 for use in detecting and correcting errors in the user data 12 at the sector level. Each sector may optionally comprise an ID field for storing the sector number, but most disc storage systems have moved to an ID-less format wherein the sector numbers are derived from information stored in embedded servo wedges (not shown). If the preamble 6 or sync mark 8 become unreadable due, for example, to a defect in the medium, then the storage system may be unable to synchronize to the user data 12 and the entire sector may become unreadable. The sector may also become uncorrectable at the sector level if the number of hard errors exceeds the error detection and correction capabilities of the sector ECC redundancy bytes 14.

Referring again to FIG. 1A, the operation and drawbacks of prior art attempts to incorporate a track level parity sector for recovering a sector, as compared to the method of the present invention, will now be described. Consider, for example, that the host system directs the storage device to write new data to SECTOR 0. If the recording head arrives at the target track 4 just after the beginning of SECTOR 0, then the storage system must wait for the disc to complete a full revolution in order to read the current content of SECTOR 0. Then, the disc must make another revolution so that the storage system can read the parity sector (redundancy sector), back out the current content of SECTOR 0 from the parity sector (by XORing it with the parity sector), XOR the new information into the parity sector and over write SECTOR 0 with the new information. Then, the storage system must wait for the disc to make yet another revolution so that it can write the updated parity sector to the disc. In the worst case, then, a write operation in the prior art implementations of a parity sector requires three revolutions of latency, and over two revolutions on average to write a single sector. Further, the revolution of latency associated with backing out the old contribution of the target data sectors from the redundancy sector applies even if the write range spans one less sector than the entire track.

In addition to the above described latency problem, the prior art implementations are capable of correcting only one unrecoverable data sector per track. Furthermore, the prior art makes no attempt to verify the validity of the data sectors before writing new information to the track. Thus, if there is already an unrecoverable data sector on a track and a corrupted write operation renders another sector unrecoverable, then both sectors are lost permanently. The present invention addresses these problems, and provides other unexpected benefits and advantages over the prior art.

Error Correction System

Figure 1C:
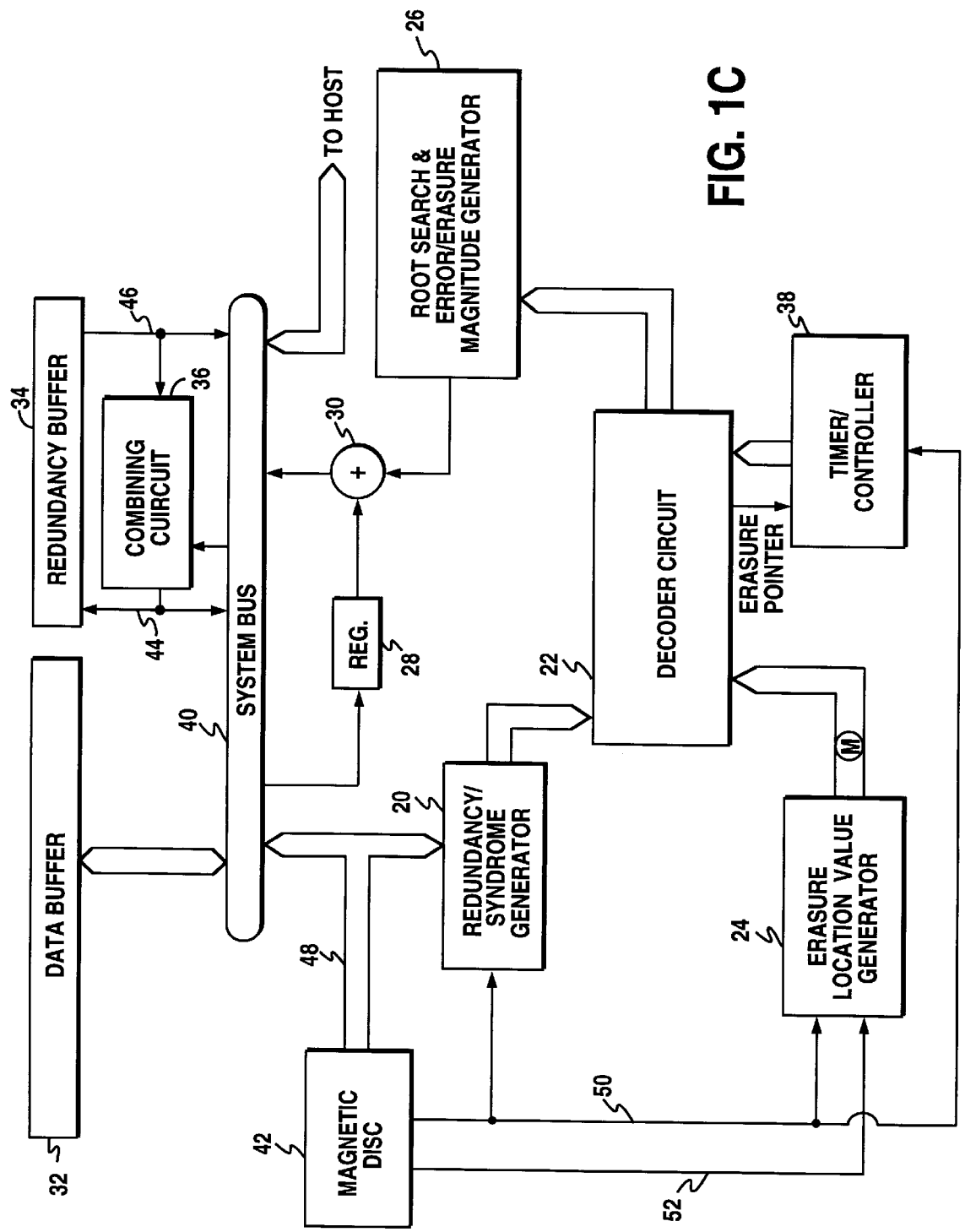
FIG. 1C is an overview of the sector level and track level error correction systems.

FIG. 1C schematically illustrates the error correction system (ECS) according to an embodiment of the present invention, including a sector level ECS and a track level ECS. The sector level ECS comprises a redundancy/syndrome generator 20, a Reed-Solomon decoder 22 an erasure location value generator 24, a root search and error/erasure magnitude generator 26, and a register 28 and an XOR gate 30 for correcting data symbols in a codeword stored in data buffer 32. The track level error correction system comprises a redundancy buffer 34 for storing the redundancy sector as it is generated, and a combining circuit 36 for combining the data sectors and redundancy sector according to a predetermined error correction operation, such as byte XOR. A timer/controller 38 controls the overall operation of the system by executing the sector level and track level error correction operations described below.

During a write operation, the storage system receives user data from a host system over a system bus 40 and stores the data in a data buffer 32 with a capacity to hold several sectors of data. When the system is ready to write a sector of data to the disc 42, the timer/controller 38 clears the redundancy buffer and reads a sector of user data from the data buffer 32. As the sector is read from the buffer, the redundancy/syndrome generator 20 generates sector level redundancy bytes 14 (shown in FIG. 1B) which are appended to the sector as it is written to the disc 42. Concurrently, the redundancy sector stored in the redundancy buffer 34 is updated by combining it (e.g., XORing) 36 with the user data. This is accomplished by reading an appropriate byte from the redundancy buffer 34 and combining 36 it with the corresponding user data byte applied over the system bus 40. The result is then written back to the redundancy buffer 34 over line 44. Depending on whether the storage system is configured into a "immediate redundancy regeneration" write mode or "deferred redundancy regeneration" write mode, as described below, the contents of the redundancy buffer after processing all of the user data to be written to the disc will be either the redundancy for the entire track, or the redundancy for the sectors written. In either case, the redundancy sector itself is applied to the system bus 40 over line 46 and processed by the syndrome/redundancy generator 20 to generate sector level redundancy bytes which are appended to the redundancy sector as it is written to the disc.

During a read operation a sector of data is read from the disc 42 and applied over line 48 to the system bus 40. A sector reset signal on line 50 resets the redundancy/syndrome generator 20, the erasure location value generator 24 and the timer/controller 38 every time a new sector is about to be read from the disc 42. Then, as the next sector is read, the redundancy/syndrome generator 20 generates error syndromes for use by the decoder circuit 22 and the sector is stored in the data buffer 32 for subsequent correction in the event that errors are detected (i.e., non-zero syndromes are generated). As described below, the decoder circuit 22 processes the error syndromes to generate an error location polynomial which is processed by the root search and error/erasure magnitude generator 26 to determine the location and correction values for the errors in the sector. In addition, the decoder circuit 22 may utilize erasure pointer information generated by the erasure location value generator 24. For instance, a read channel may generate a thermal asperity erasure pointer applied over line 52.

To correct a sector using the sector level ECS, a codeword symbol in error is read from the data buffer 32 into register 28 and XORed 30 with the error correction value. The corrected symbol is then restored to the data buffer 32 and the corrected sector transferred to the host system. The sector level error correction operations described above are carried out in asynchronous and overlapping steps in order to facilitate un-interrupted, or "on-the-fly", transfer of data from the disc 42.

As mentioned above, there are two situations where a data sector on the disc may become unrecoverable. First, the sector may become entirely unreadable due to an inability to synchronize to the sector data (because, for example, the preamble 6 or sync mark 8 have been corrupted by a defect on the medium). The other possibility is that the sector becomes uncorrectable; that is, the number of hard errors exceeds the error correction capability of the sector level ECS. In these situations, the storage system pauses the data transfer and executes the track level error correction steps to recover the lost sector using the redundancy sector.

The track level sector recovery steps are disclosed in detail below, but the general operation is as follows. First, the recording head is oriented over the first sector in the track (SECTOR 0). Then the storage system attempts to read all of the sectors in the track including the unrecoverable sector and the redundancy sector. As each sector is read, the sector data is combined 36 according to a predetermined error correction operation (e.g., byte XOR) and the result stored in the redundancy buffer 34. The sector data can be combined 36 into the redundancy buffer 34 after it has been corrected by the sector level ECS, but in the preferred embodiment, the sector data is combined 36 with the redundancy buffer 34 as the sector is read from the disc 42 (i.e., the uncorrected sector data is combined with the redundancy buffer). In the latter embodiment, the error correction values generated by the sector level ECS are combined 36 "on-the-fly" with the redundancy buffer 34 so that the track level redundancy data accounts for corrections made at the sector level.

After reading the sectors on the disc, the redundancy buffer 34 contains either error syndromes for correcting a data sector uncorrectable at the sector level, or it contains a reconstructed image of an unreadable data sector.

If the data sector is uncorrectable at the sector level, then it is corrected by combining it with the error syndromes in the redundancy buffer 34. This is accomplished by reading each symbol of the uncorrectable sector from the data buffer 32 and combining it 36 with the corresponding syndrome stored in the redundancy buffer 34 The corrected symbol is then restored to the data buffer 32. If the data sector is unreadable, then it is simply replaced by transferring the contents of the redundancy buffer 34 to the data buffer 32.

Write Operation

Figure 2:
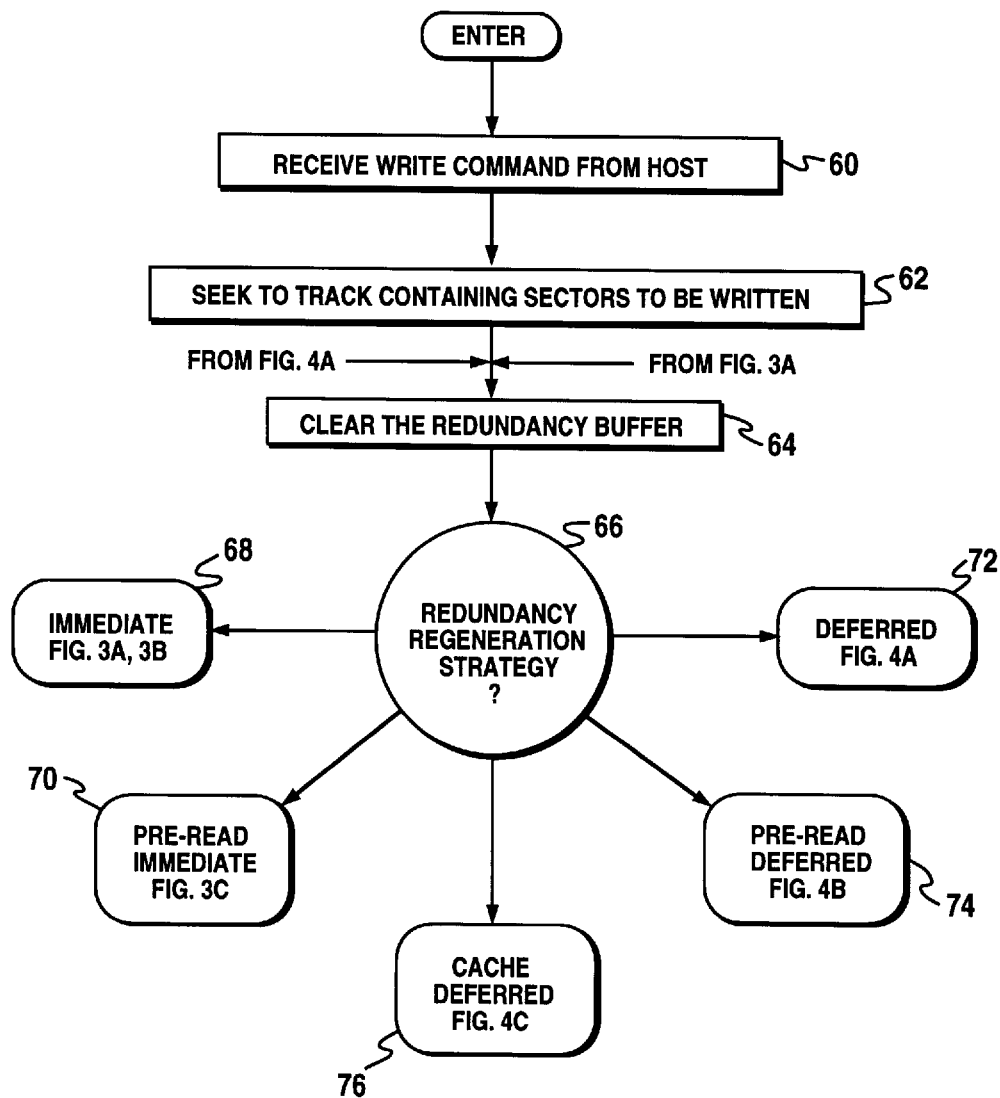
FIG. 2 is a flow chart of the steps executed in the method of the present invention for writing a data sector to the disc.

FIG. 2 is a flow chart illustrating the general steps executed by the present invention when writing user data to the disc. When the storage system receives a write command from the host 60, which includes the user data and the target sectors to write the data, the storage system seeks to the corresponding target track 62 that contains the target sectors. As the recording head traverses radially across the disc surface, it reads information typically contained in embedded servo wedges (not shown in FIG. 1A) to determine if the recording head has reached the target track. Once at the target track, the redundancy buffer 34 of FIG. 1C is cleared 64 and the user data is written to the disc according to a pre-selected write mode 66.

The write modes provided by the present invention include "immediate redundancy regeneration" 68, "pre-read immediate redundancy regeneration" 70, "deferred redundancy regeneration" 72, "pre-read deferred redundancy regeneration" 74 and "cache deferred redundancy regeneration" 76. Each of the above write operations will now be described seriatim-the preferred operating mode depends on system dynamics such as the desired performance level or whether the recording head is capable of switching between a read and write operation between sectors.

Immediate Redundancy Regeneration

A method for performing a write operation according to the present invention will now be described with reference again to FIG. 1A and with reference to FIG. 3A. As compared to the above described prior art implementation which requires over two revolutions of latency on average, the following method requires only 1.5 revolutions of latency on average to write a single data sector and update the redundancy sector. Further, as the write range approaches the entire track, the overhead associated with updating the redundancy sector approaches zero; that is, it requires no more latency than a storage system that does not employ a redundancy sector. This is a significant advantage over the prior art backing out technique which requires an additional revolution of latency even if the write range is one sector less than the entire track.

In short, the present invention decreases the write latency by regenerating the redundancy sector for the entire track during each write operation rather than backing out the old information in the over written sectors. For example, if SECTOR 1 is to be over written and the recording head arrives at the target track just after the beginning of SECTOR 0, then the storage system waits one revolution to reach the beginning of the track (i.e., SECTOR 0). The storage system then reads SECTOR 0 and begins to combine the data sectors into a regenerated redundancy sector (stored in the redundancy buffer 34) according to a predetermined error correction operation, such as byte XOR. After reading SECTOR 0, the storage system switches to a write operation, writes the user data to SECTOR 1, and combines the user data into the regenerated redundancy sector. Then, the storage system switches back to a read operation, reads the rest of the sectors on the track (sectors 2–4) and combines their contents into the regenerated redundancy sector. Finally, the storage system switches to a write operation and over writes the redundancy sector with the regenerated redundancy sector stored in the redundancy buffer 34.

The above described write operation requires a half a revolution on average to reach the beginning of the track (i.e., SECTOR 0), and one revolution to read the data sectors on the track and write the user data to the target sector(s). Thus, the present invention requires only 1.5 revolutions of latency on average to complete a write operation. Furthermore, if a data sector preceding the target sector (e.g., SECTOR 0) was determined to be unrecoverable during the write operation, it could be corrected using the redundancy sector before writing the user data to the disc. That is, the data sectors on the track can be at least partially verified before over writing the target sector, thereby protecting against the catastrophic error event due to a write operation rendering a newly written data sector unrecoverable when the track already contains an unrecoverable data sector.

Figure 3A:
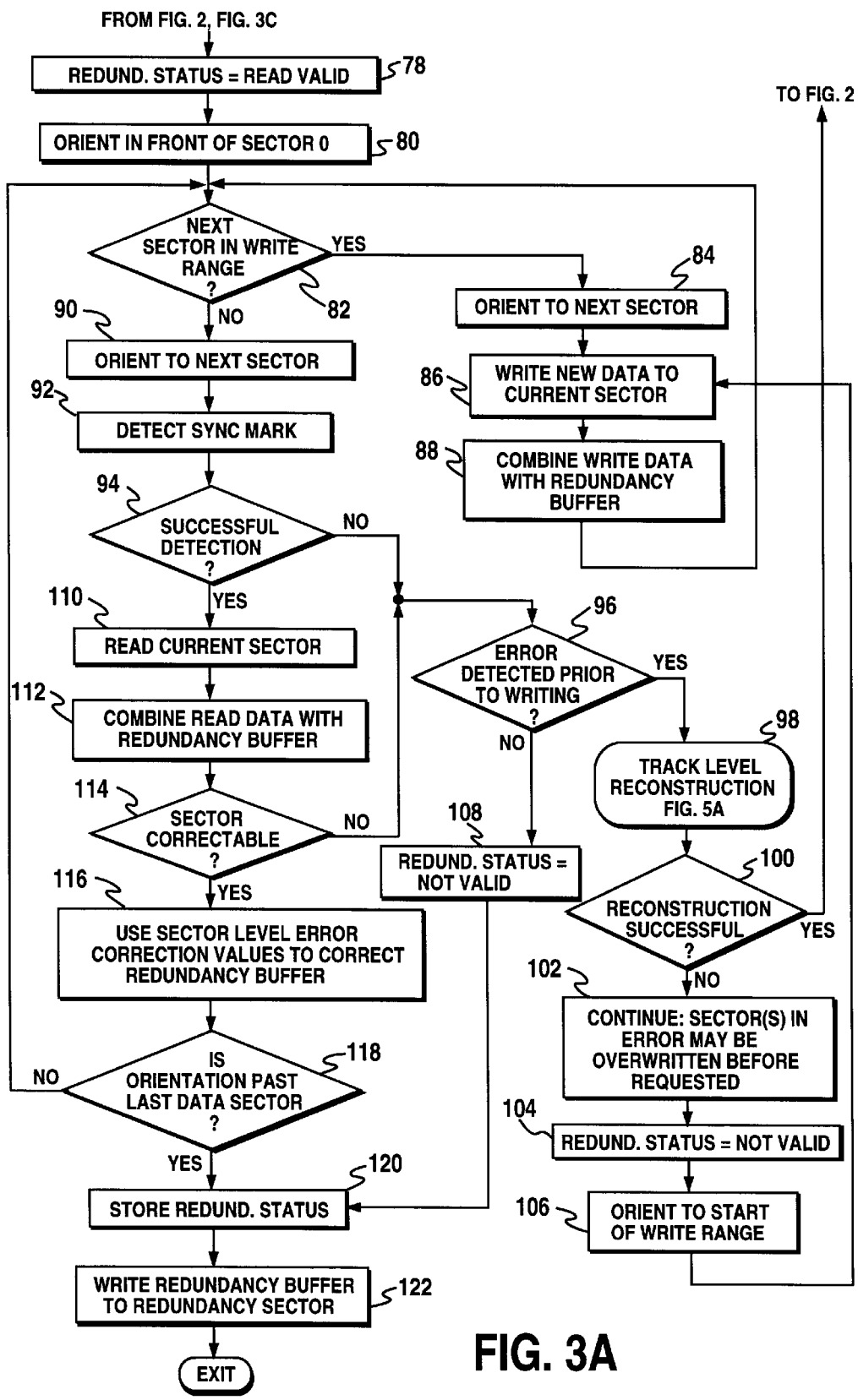
FIG. 3A shows the steps executed according to an embodiment of the present invention wherein the redundancy sector is regenerated immediately as part of a write operation.

FIG. 3A shows a flow chart of the write operation of the present invention wherein the redundancy sector is regenerated immediately as the user data is written to the disc without "backing out" the overwritten information as in the prior art. A variable, REDUND. STATUS, is associated with each track which indicates the status of the redundancy sector for the track. For the "immediate" write mode of FIG. 3A, the REDUDN. STATUS can be either READ VALID or NOT VALID, where READ VALID means that the redundancy sector is valid for recovering a data sector on the track, and NOT VALID means that the redundancy sector cannot be used to recover a data sector. As described below, the redundancy status is set to NOT VALID if an unrecoverable sector is detected after writing the user data to the target sectors.

After setting the REDUND. STATUS=READ VALID 78, the storage system orients in front of the first sector on the track (i.e., sector 0) 80. Then, a loop is executed to read all of the data sectors on the track except for the target sector(s). The storage system determines whether the next sector is in the write range 82—if not, the storage system orients to the next sector 90 and attempts to read the sync mark 92. If the sync mark is successfully detected 94, then the storage system reads the current sector 112 and simultaneously combines the data read with the redundancy buffer to regenerate the track level redundancy data. Also while reading the sector data, the sector level ECS detects and corrects errors in the sector data. If the sector is correctable at the sector level 114, then the data sector correction values generated by the sector level ECS are combined with the redundancy buffer 116 so that the regenerated track level redundancy data accounts for the corrections at the sector level.

After processing the current sector, the storage system checks whether the next sector is in the write range 82—if so, the storage system orients to the next sector 84 and switches to a write operation to write the user data to the disc by over writing the target data sectors 86. While writing the user data to the target sectors, the write data is combined with the redundancy buffer 88 to further generate the new track level redundancy data.

If the sync mark is not successfully detected 94 or if the sector is uncorrectable 114, then the storage system determines whether the unrecoverable sector was detected prior to over writing the target data sectors 96. If so, then the storage system executes a track level reconstruction operation 98 described below in an attempt to recover the data sector using the redundancy sector. If the track level sector reconstruction is successful 100, then the write operation is restarted (i.e., starting at FIG. 2). If the sector reconstruction operation is not successful, then the write operation continues because the unrecoverable sector may be over written before the host system attempts to read it. However, the REDUND. STATUS is set to NOT VALID to indicate that the redundancy sector could not be successfully regenerated for the track. Also, the storage system immediately orients to the first sector in the write range 106 since the redundancy sector can no longer be regenerated.

If an unrecoverable data sector is detected subsequent to over writing the target data sectors 96, then again the REDUND. STATUS is set to NOT VALID since the redundancy sector cannot be regenerated.

Once the storage system has processed the last data sector in the track 118, the REDUND. STATUS for the track is stored in non-volatile memory. Preferably, the status is stored on the disc as an extra byte appended to the redundancy sector, but it could also be stored in semiconductor memory and written to a table on the disc periodically or during a power down procedure, for example. The redundancy data stored in the redundancy buffer is then written to the redundancy sector for the track after appending sector level ECC bytes (and the REDUND. STATUS), thus concluding the "immediate redundancy regeneration" write operation.

It should be noted that in order to achieve minimum latency for the above "immediate" write operation, a recording device is required that can switch between reading and writing within the gap between sectors. For example, many systems employing thin-film recording heads are capable of switching operations within the sector gap, whereas many systems employing magnetoresistive (MR) recording heads are not.

The "immediate" write operation can still be implemented in a storage system that cannot switch between a read and write operation within the sector gap, but it requires up to an additional revolution of latency. That is, in a first revolution the storage system reads the data sectors outside the write range and develops the track level redundancy. Then in a second revolution, the storage system writes the target data sectors and combines the write data with the track level redundancy data which is then written to the redundancy sector.

Figure 3B:
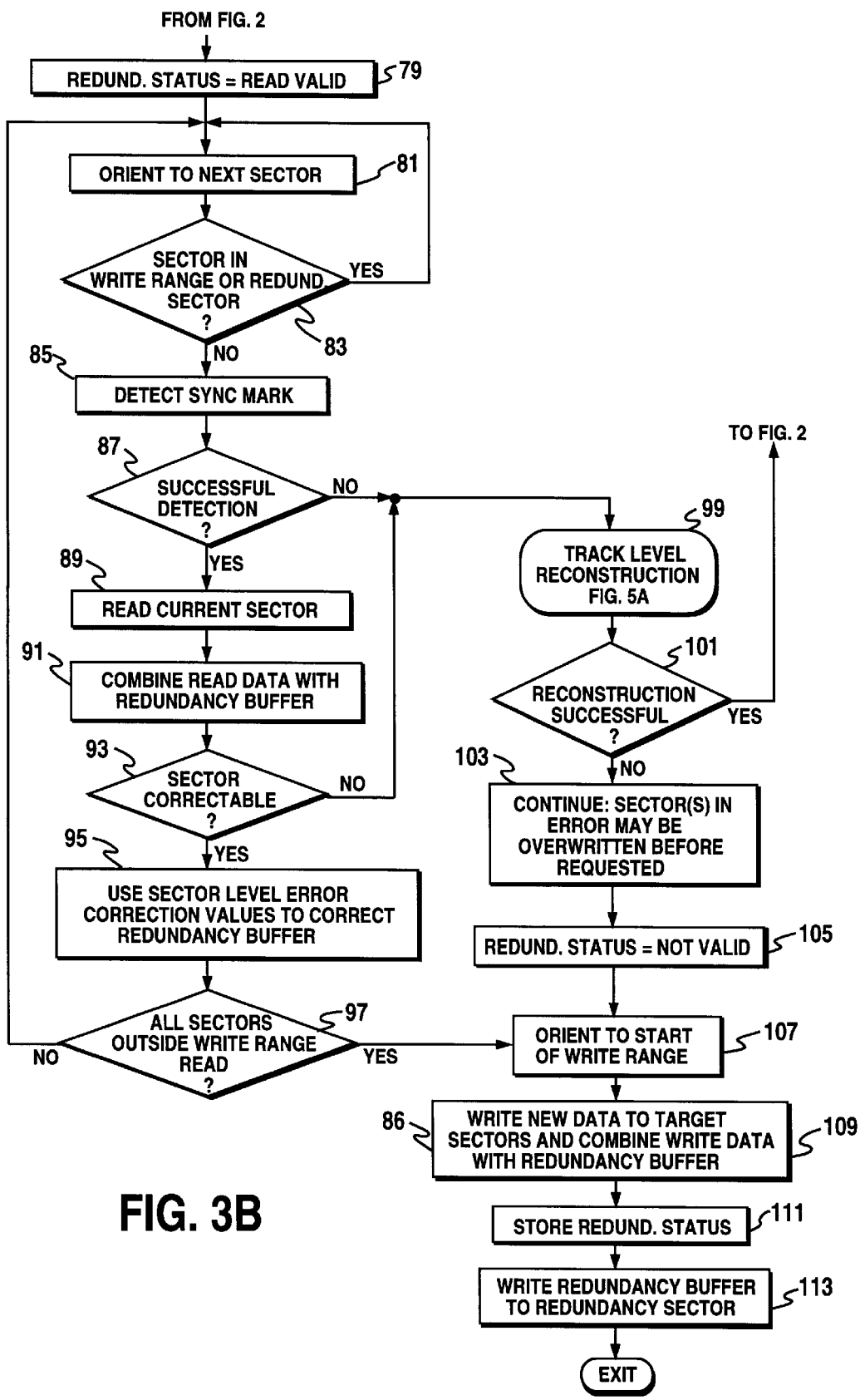
FIG. 3B shows an alternative embodiment of the "immediate" write operation of FIG. 3A.

A flow chart of this alternative embodiment of the "immediate" write operation is shown in FIG. 3B. After the recording head reaches the target track, the storage system sets the REDUND. STATUS to READ VALID 79 and immediately orients to the next sector 81 rather than orient to sector 0 80 as in FIG. 3A. If the current sector is in the write range or is the redundancy sector 83, then the storage system skips the sector and orients to the next sector 81. If the current sector is outside the write range, then the storage system attempts to detect the sync mark 85 and, if successful 87, read the sector data 89 and combine it with the redundancy buffer 91. If the current sector is correctable at the sector level 93, then the sector level correction values are used to correct the redundancy buffer 95.

If the sync mark was not successfully detected 87 or if the current sector cannot be corrected at the sector level 93, then the storage system performs a track level reconstruction procedure 99 to recover the sector using the redundancy sector. If the reconstruction is successful 101, then the write operation is restarted (i.e., starting at FIG. 2). Otherwise, the REDUND. STATUS is set to NOT VALID 105 and the storage system orients to the start of the write range 107; an error event is not sent to the host since the unrecoverable data sector may be over written before the host requests it.

Once all of the data sectors outside the write range have been successfully read 97, the storage system orients to the first sector in the write range 107 and writes the new data to the target sector while simultaneously combining the write data with the redundancy buffer 109. Then the redundancy status is stored 111 (e.g., appended to the track level redundancy data as it is written to the disc) and the redundancy buffer is written to the redundancy sector 113.

Pre-read Immediate Redundancy Regeneration

In the above-described "immediate redundancy regeneration" write operation of FIG. 3A, there is a possibility that an unrecoverable data sector on the track will be lost permanently due to over writing a data sector without first backing-out its contribution to the redundancy sector as in the prior art implementation. That is, an unrecoverable data sector detected after over writing a target data sector on the track will be lost permanently because the redundancy sector is invalid.

The present invention provides an option to protect against losing an unrecoverable data sector: read the data sectors in the track after the write range to verify they are recoverable before over writing any of the target data sectors. Although when writing a single sector this method results in as much write latency as the above-described prior art implementation (unless the pre-read is deemed unnecessary as described below), the protection provided against losing an unrecoverable data sector outside the write range is not provided by the prior art "backing out" technique. The "pre-read" method of the present invention could be used to modify the prior art such that all the data sectors in the track were read in addition to backing out the target sectors from the redundancy sector. This modification to the prior art "backing out" technique, however, should be considered a novel, non-obvious aspect of the present invention.

Figure 3C:
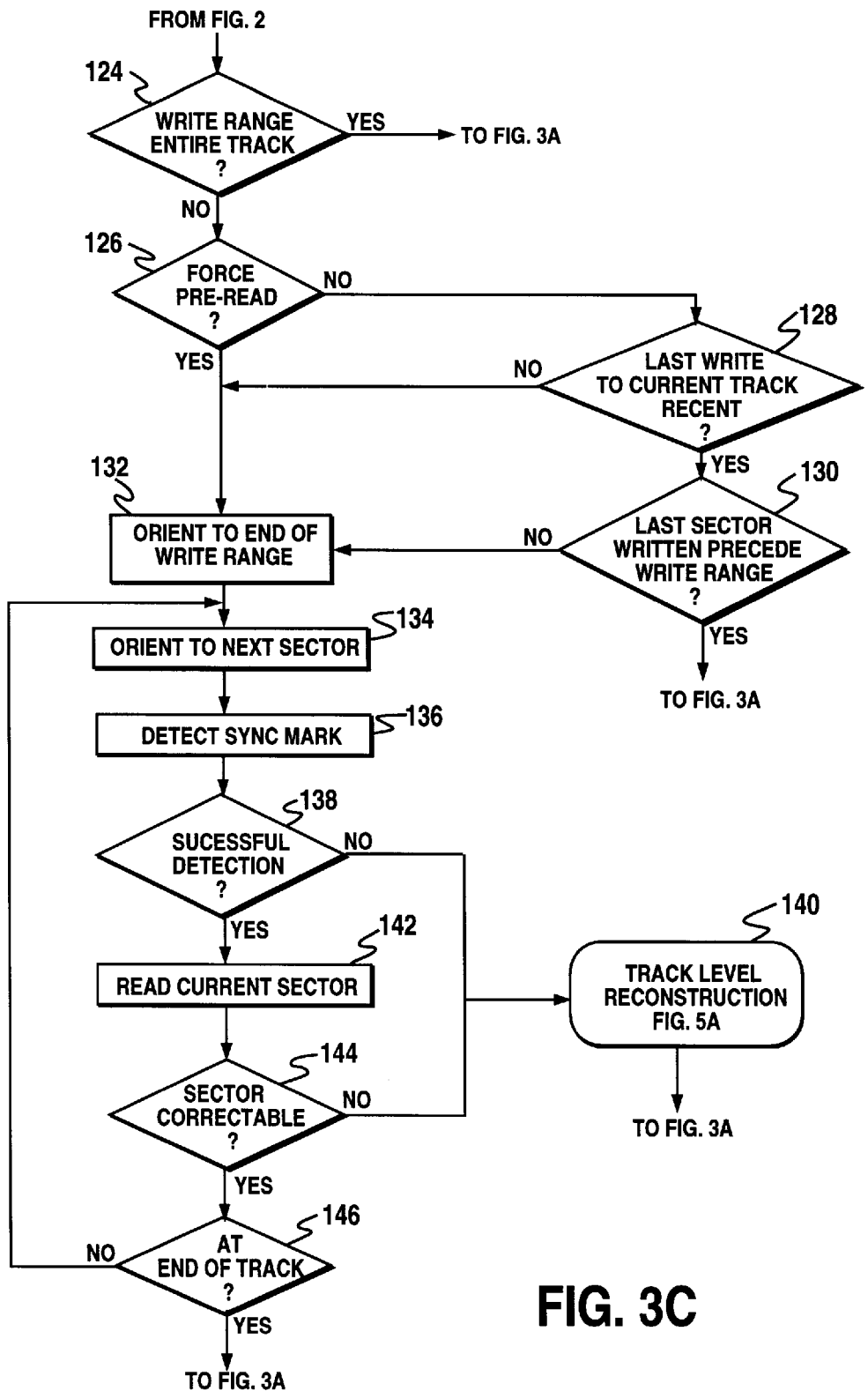
FIG. 3C is a flow chart for pre-reading the data sectors on the track that follow the write range of a write operation to verify their recoverability before over writing the target data sectors using the write method of FIG. 3A.

The flow chart description for the "pre-read immediate redundancy regeneration" method of the present invention is shown in FIG. 3C. First, the storage system checks whether the write range spans the entire track 124. If so, then a pre-read is unnecessary since all of the data sectors are about to be over written with new user data. If not over writing the entire track, then there is an option to force a pre-read 126 or, if not, to determine whether a pre-read is necessary. For example, the storage system may inquire into the time elapsed since the last write to the track 128; if too much time has elapsed, then a pre-read may be forced. Otherwise, the storage system checks whether the last sector written to the track precedes the write range for the current write operation 130. If so, then a pre-read is unnecessary since the sectors over written in the previous write operation will be read before over writing the current target data sectors, and the data sectors following the write i range will have been pre-read during the recent, previous write operation.

If a pre-read is deemed necessary, then the storage system orients to the end of the write range 132 since the sectors preceding the write range will be read as part of the write operation described with reference to FIG. 3A above. The storage system orients to the next data sector 134 and attempts to detect the sync mark 136. If the sync mark is successfully detected 138, then the storage system reads the current sector and determines if it is correctable at the sector level. If the sync mark cannot be detected or if the data sector is uncorrectable, then a track level reconstruction procedure is executed 140 in an attempt to recover the sector using the redundancy sector. If the sector reconstruction procedure is successful, then it means all of the data sectors on the track have been read successfully and the "pre-read" is complete. If the sector reconstruction was not successful, then the "pre-read" is futile since there is an unrecoverable sector on the disk. If an unrecoverable data sector is not encountered, the "pre-read" operation returns normally to the "immediate redundancy regeneration" operation of FIG. 3A after reaching the end of the track 146.

Deferred Redundancy Regeneration

An alternative method provided by the present invention for writing data sectors to the disc, referred to as "deferred redundancy regeneration", generates a redundancy sector over the write data. Then, during idle time, the storage system regenerates the redundancy sector over the entire track. If the write operation results in an unrecoverable sector, then the write redundancy sector is used to recover the sector. Again, this method reduces the write latency because the over written data sectors are not "backed out" of the redundancy sector as in the above-described prior art implementation. In fact, this method requires only one revolution on average to write a single target data sector and the write redundancy sector. Further, as the write range approaches the entire track, the overhead associated with updating the redundancy sector approaches zero; that is, it requires no more latency than a storage system that does not employ a redundancy sector. This is a significant advantages over the prior art backing out technique which requires an additional revolution of latency even if the write range is one sector less than the entire track.

A drawback of the present invention, however, is that if an unrecoverable data sector exists outside the range of data sectors written, then it will be permanently lost after the write operation. As described in more detail below, the present invention provides an option to protect against losing a data sector outside of the write range by verifying (reading) all of the data sectors in the track outside the write range before performing the write operation.

To illustrate the write verify method with reference to FIG. 1A, consider that sectors 3 and 4 are to be over written and the recording head reaches the target track in the middle of SECTOR 2. When the recording head reaches SECTOR 3, it over writes SECTOR 3 and SECTOR 4 with the new user data and simultaneously combines the write data into the redundancy buffer 34 according to a predetermined error correction operation, such as byte XOR. Then, when the recording head reaches the redundancy sector, it over writes it with the contents of the redundancy buffer 34. During idle time, the storage system reads all of the data sectors on the track and regenerates the redundancy sector in the redundancy buffer 34 for the entire track. If SECTOR 3 or SECTOR 4 is determined to be unrecoverable while regenerating the redundancy sector for the entire track, then the operation is aborted and the redundancy sector on the disc (write redundancy) is used to recover the sector. In this manner, the storage system can verify the validity of a write operation which may render a sector unrecoverable due, for example, to a "high write" . That is, the storage system can rectify the situation before another corrupted write operation renders yet another sector unrecoverable, thereby losing both sectors permanently.

Figure 4A:
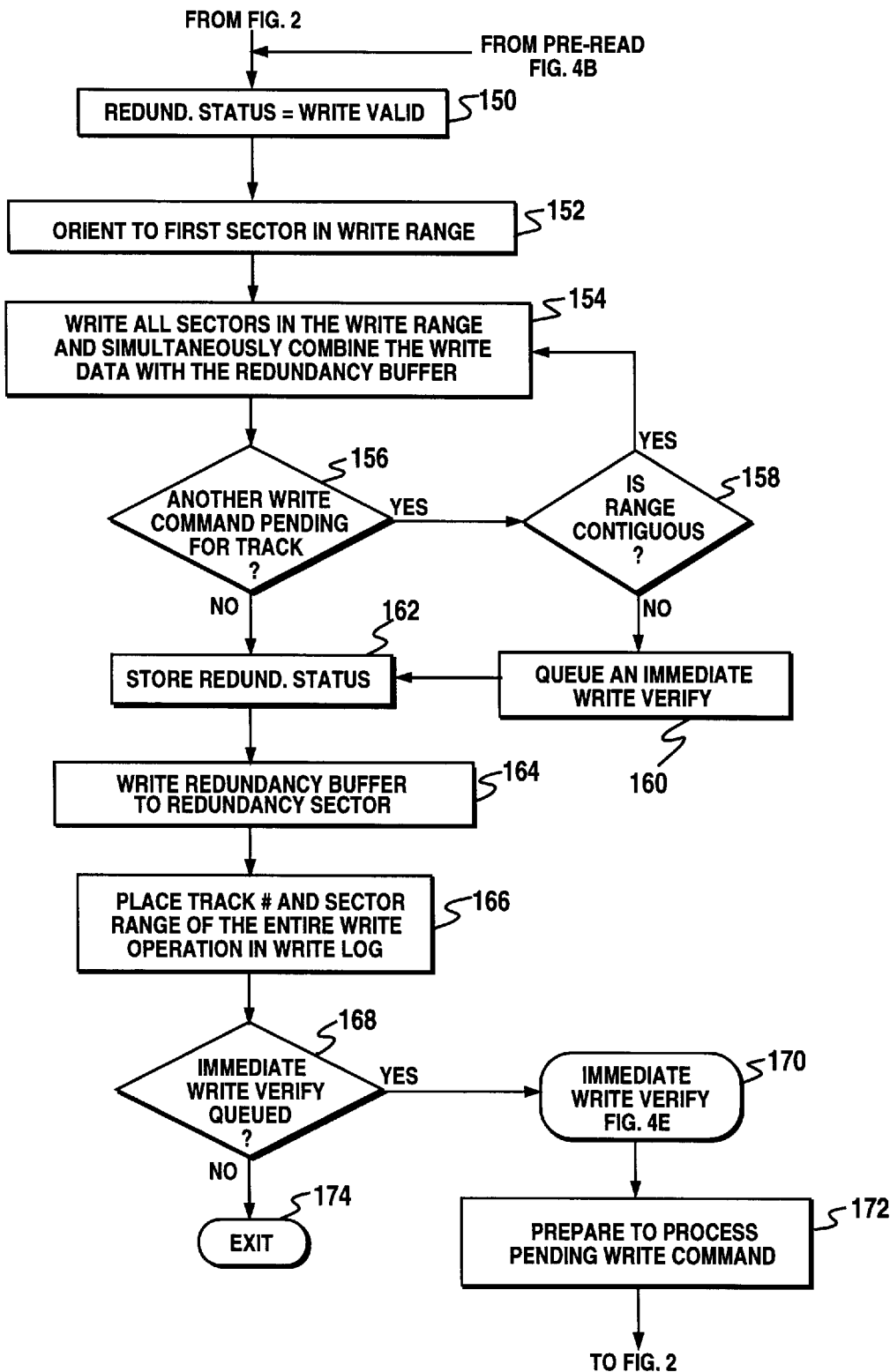
FIG. 4A shows the steps executed according to an alternative embodiment of the present invention wherein the redundancy sector is generated for the write range, and then the redundancy sector is regenerated for the entire track during idle time of the storage system.

Turning now to FIG. 4A which is a flow chart description of the deferred redundancy regeneration method of the present invention, the storage system initializes a status variable, REDUND. STATUS, to WRITE VALID 150. The REDUND. STATUS indicates whether the redundancy sector contains redundancy data associated with the over written data sectors (i.e., WRITE VALID), or for the entire track (i.e., READ VALID). As explained below, the REDUND. STATUS may also be set to NOT VALID if the redundancy sector is cached in the data buffer 32. The state of the REDUND. STATUS for each track must be preserved in order to ensure the integrity of the track level ECS. Thus, these variables must be stored in non-volatile memory such as on the disc. In the preferred embodiment, the redundancy sector contains an extra byte for storing the REDUND. STATUS, and the status is updated whenever the redundancy sector is updated.

Continuing with FIG. 4A, the storage system orients to the first sector in the write range 152, writes the user data to the target data sectors and simultaneously combines the user data with the redundancy buffer 34 to generate the write redundancy 154. If after writing the target data sectors there is another write command pending for the track 156, then the storage system checks whether the write range for the next command is contiguous with the current command 158. If so, then the storage system processes the next write command by writing the user data to the contiguous target data sectors and updating the write redundancy stored in the redundancy buffer 34. If the next write range is not contiguous, then the storage system optionally queues an immediate write verify command 160 which is processed 170 at the conclusion of the current write command.

As explained below, the immediate write verify 170 verifies the current write operation before processing the next write command. If the immediate write command is not queued 160, then the current write is not verified since the write verify is otherwise performed during idle time of the storage system; however, the latency associated with the immediate write verify 170 is also avoided. Thus, queuing an immediate write verify is optional as configured by the system designer according to the desired level of performance.

Continuing now with FIG. 4A, after writing the user data to the target data sectors and generating the write redundancy in the redundancy buffer 34, the redundancy status is stored in non-volatile memory 162 (e.g., stored in a byte appended to the redundancy sector when it is written to the disc). The storage system then writes the redundancy buffer (write redundancy) to the redundancy sector 164 and places the track number and the sector write range for the entire write operation in a write log 166. The "entire write range" includes all write commands processed having contiguous write ranges 158.

The write log, which is preferably stored in the data buffer 32, is preferably implemented as a circular list or buffer of data structures. The write log stores the track number and sector range for every write operation, and as explained below, it is used during idle time to verify that the sectors written are recoverable. Since the write log is stored in the data buffer 32, it is not protected against a power failure. Thus, if the write log is erased, the ability to verify the write operations is lost. This is not a fatal error, however, since the redundancy sector for the entire track can still be regenerated as long as all the sectors are recoverable. In other words, losing the write log is only a fatal error if a logged write operation rendered a written sector unrecoverable. In an alternative embodiment, the write log is stored in non-volatile memory such as on the disc. For example, the sector write range for a track is stored in the redundancy sector so that if the write log is lost due to a power failure, the sector write range can still be determined.

The capacity of the write log is finite meaning that it will eventually overflow if the pending entries are not processed in time. If the write log is a circular buffer, then the oldest entries in the log will be over written first. If an entry is over written, the corresponding write command cannot be verified but the redundancy for the entire track can still be regenerated during idle time. Also, if there are consecutive write commands to the same track such that a previous write command has not been verified before processing a current write command, then the previous write command cannot be verified unless it is processed before processing the current write command. Thus, an option not shown in the flow charts is to force an immediate write verify operation (see FIG. 4E) on any entry in the write log matching the current track number before executing the current write command. Also, as explained above, an immediate write verify can be queued 160 if a new, consecutive write command is detected during a current write operation. Thus, after processing the current write command, the storage system immediately verifies the write operation 170 before processing the next write command 172.

If an immediate write verify has not been queued 168, then the "deferred" write operation exits 174 and returns control to the storage system's operational firmware. Then, as described below, during idle time the storage system processes the entries in the write log to verify the write operations, and it simultaneously regenerates the redundancy sector for the entire track.

Pre-read Deferred Redundancy Regeneration

Similar to the "immediate redundancy regeneration" write method described above, the "deferred" write method is subject to the catastrophic error event of a write command rendering a written sector unrecoverable when the target track already contains an unrecoverable data sector outside the write range. To protect against this situation, the "deferred" write method of the present invention optionally pre-reads all of the data sectors in the target track outside the write range. Pre-reading the target track results in as much latency as the above-described prior art "backing out" technique (unless the pre-read is deemed unnecessary as described below), but unlike the prior art the present invention protects against the above catastrophic error event.

Figure 4B:
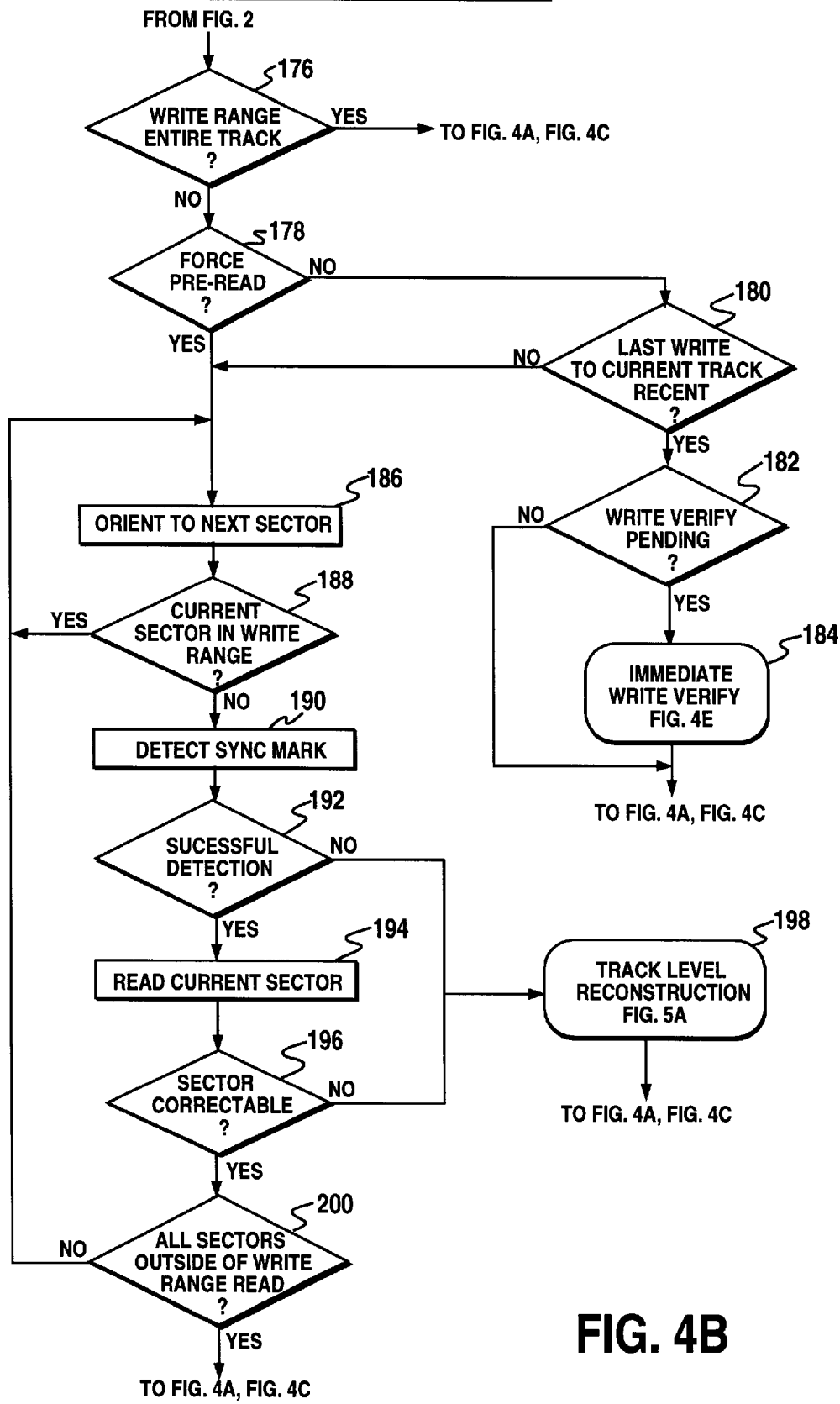
FIG. 4B is a flow chart illustrating a "pre-read" operation wherein the data sectors outside the write range are read to verify recoverability before over writing data sectors using the "deferred" write method of FIG. 4A.

A flow chart for the "pre-read" operation performed before a "deferred" write operation is shown in FIG. 4B. First the storage system checks whether the write range is the entire track 176—if so, then the pre-read is unnecessary since all of the data sectors are about to be over written. Otherwise, the storage system checks whether the pre-read should be forced 178 as configured by the system designer. If not, then the storage system optionally checks whether the last write command to the current track was recent 180 since the pre-read is optionally forced if a considerable length of time has elapsed since the last write command to the track. If the last write to the track was recent, then the storage system checks whether a write verify is pending for the track 182 (i.e., whether there is a write log entry for the track). If so, then an immediate write verify 184 is performed for the previous write; otherwise, the pre-read is unnecessary since the previous write command has already been verified during idle time which means the entire track was already successfully read.

If the pre-read is deemed necessary, then the storage system orients to the next sector in the track 186 and checks whether the sector is within the write range 188. If so, the storage system skips the sector and continues to the next sector until the first sector beyond the write range is reached. Then, the storage system attempts to detect the sync mark 190 for the current sector and if successful 192, it attempts to read the current sector 194. If the sync detection fails 192 or if the current sector is uncorrectable at the sector level 196, then the storage system executes the track level reconstruction method 198, as described below, in an attempt to reconstruct the unrecoverable data sector. If the track level reconstruction routine is executed, then the pre-read is complete because all of the sectors in the track will have been read. Otherwise, the pre-read continues until all of the sectors outside of the write range have been read 200.

Cache Deferred Redundancy Regeneration

Figure 4C:
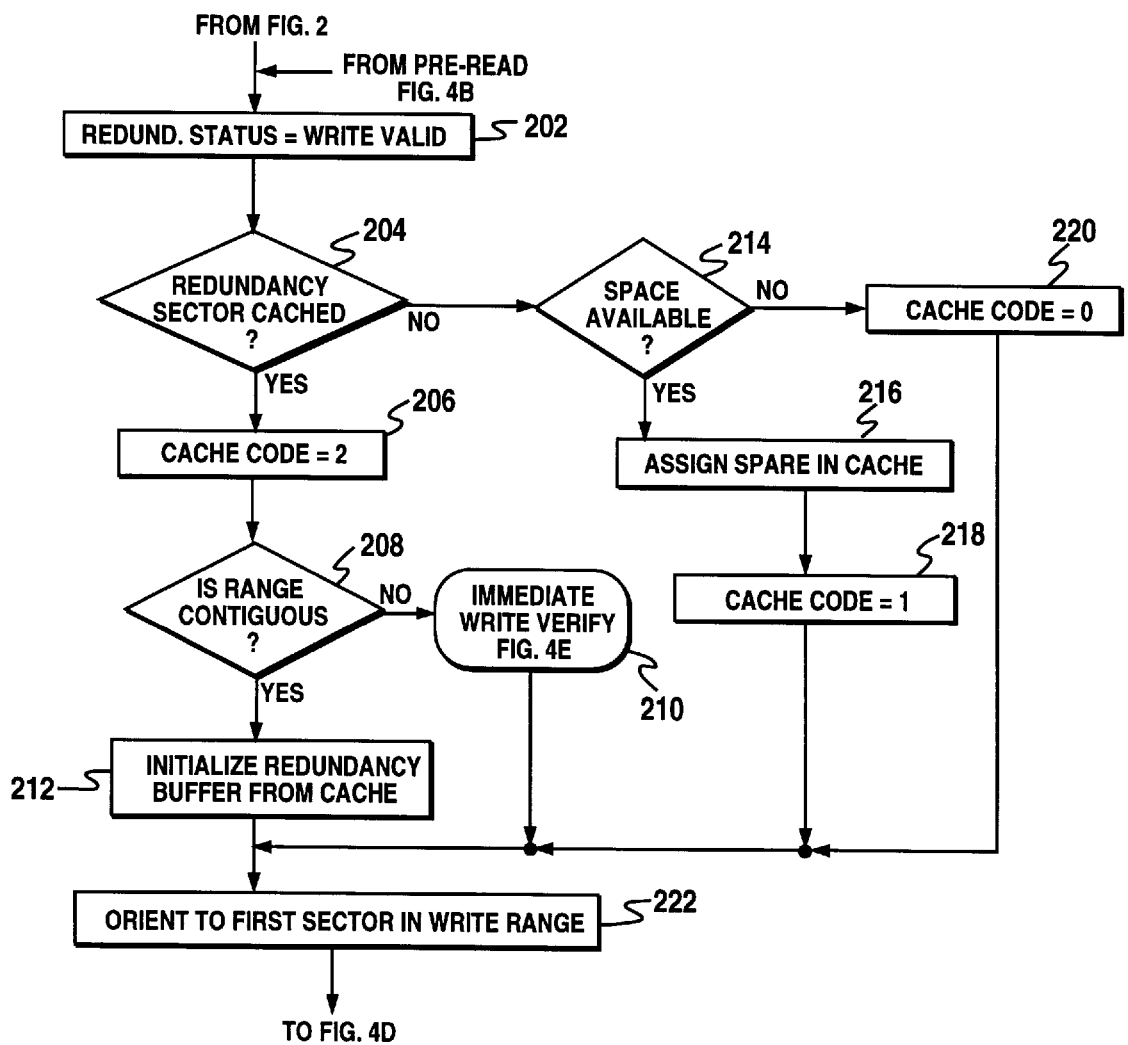
FIGS. 4C–4D show a flow chart similar to the "deferred" write operation of FIG. 4A except that the redundancy sector is cached to improve performance.
Figure 4D:
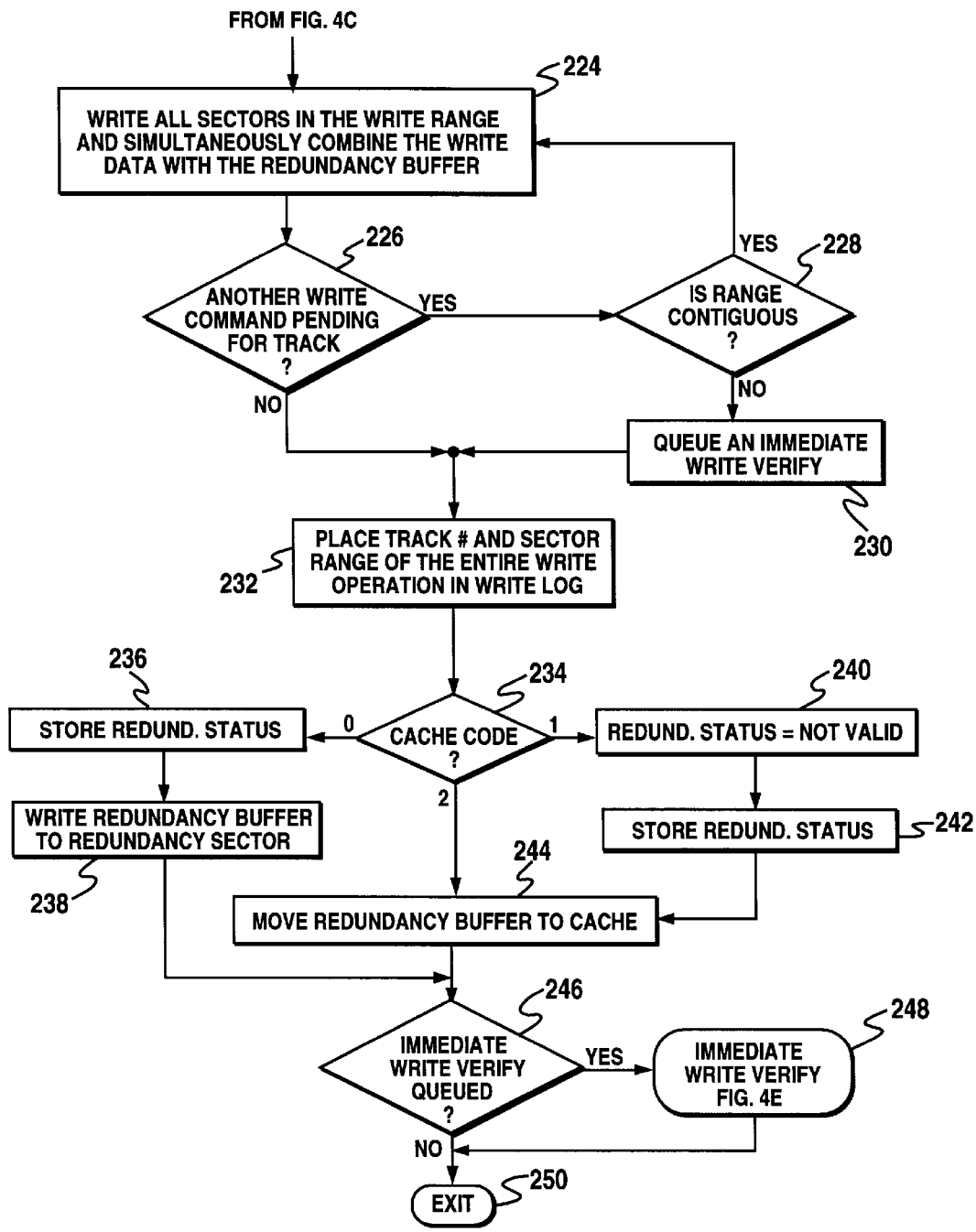

The performance of the above-described "deferred redundancy regeneration" write method can be improved by caching the redundancy sectors in the data buffer 32. In fact, after a redundancy sector has been cached for a particular track, the latency for subsequent write operations is not increased over methods that do not employ a redundancy sector. The flow charts for the "cached deferred" method of the present invention are shown in FIGS. 4C and 4D. The method can be executed directly from FIG. 2, or it can be executed after performing the pre-read operation of FIG. 4B.

Starting at FIG. 4C, the REDUND. STATUS is initialized to WRITE VALID 202. Then the storage system checks wether the redundancy sector for the target track is already in the cache 204. If it is, then a status variable, CACHE CODE, is set to 2 to indicate that the redundancy sector was cached during a previous write operation. Then the storage system checks whether the current write range is contiguous with the previous write operation 208. If not, then an immediate write verify 210 is optionally executed to verify the previous write; otherwise, the storage system initializes the redundancy buffer 34 with the cached redundancy sector 212. An alternative embodiment to executing an immediate write verify 210 is to reserve another redundancy sector for the target track in the cache corresponding to the non-contiguous write operation. In yet another embodiment, both the cached redundancy sector and the redundancy sector on the disc are used to account for a non-contiguous write to the same track.

If the redundancy sector is not already cached 204, then the storage system checks wether there is space available in the cache 214. If so, then space is reserved in the cache for the redundancy sector and the CACHE CODE is set to 1 to indicate that redundancy sector was cached during the current write operation. If there is not space available in the cache 214, then the storage system sets the CACHE CODE to 0 to indicate that the redundancy sector is not cached.

The final step shown in FIG. 4C is to orient to the first sector in the write range 222 so that the user data can be written to the track.

Continuing now to FIG. 4D, when the recording head reaches the target sectors, the storage device writes all of the sectors in the write range and simultaneously combines the write data with the redundancy buffer 224. Then the storage system checks whether a subsequent write command is pending for the current track 226. If so, then the storage system checks whether the write range of the pending write command is contiguous with the current write operation 228. If the write range is contiguous, then the storage system processes the pending write command by writing the additional sectors and updating the write range 224. If the write range is not contiguous, then the storage system optionally queues an immediate write verify 230 as described with reference to FIG. 4A above.

Once the user data has been written to the target sectors, then the track number and write range for the entire write operation is stored in the write log 232. Then a branch is executed depending on the state of the CACHE CODE as set above. If the CACHE CODE is 0, indicating that the redundancy sector is not cached, then the storage system stores the REDUND. STATUS 236 (e.g., appends it to the redundancy sector) and then writes the redundancy sector to the target track 238. If the CACHE CODE is 1, indicating that the redundancy sector should now be cached, then the REDUND. STATUS is set to NOT VALID 240 and stored in non-volatile memory 242 (e.g., on the disc at the end of the redundancy sector). The NOT VALID status indicates that the redundancy sector stored on the disc is no longer valid since it is cached in the data buffer 32. If the CACHE CODE is 2, indicating that the redundancy sector was cached during a previous write operation to the target track, or if the CACHE CODE is 1 as describe above, then the redundancy buffer 34 is transferred to the cache in the data buffer 244.

After updating the cached redundancy sector, the storage system checks whether an immediate write verify was queued 246 as described above and, if so, executes an immediate write verify operation 248 described below with reference to FIG. 4E. If an immediate write verify was not queued 246, then the "cached deferred" write operation exits 250 and returns control over to the storage system's operational firmware.

Immediate Write Verify

There are instances during the "deferred" and "cached deferred" write methods of the present invention as described above with reference to FIG. 4A, 4C and 4D where a consecutive write to a target track is requested before a previous write to the same track has been verified during idle time. For instance, in the flow chart of FIG. 4A an immediate write verify may be queued 160 if a pending write command to the same track 156 having a non-contiguous write range 158 is detected. And in FIG. 4C, there may be consecutive write to a track with a cached redundancy sector wherein the write range is not contiguous 208 and an optional immediate write verify 210 is performed for the previous write operation. And in FIG. 4D, an immediate write verify may be queued 230 if a subsequent write command is pending 226 similar to FIG. 4A. In these situations, the immediate write verify operation verifies the recoverability of the previously written data sectors without regenerating the redundancy sector for the entire track as in the idle time write verify method of FIG. 4F.

Figure 4E:
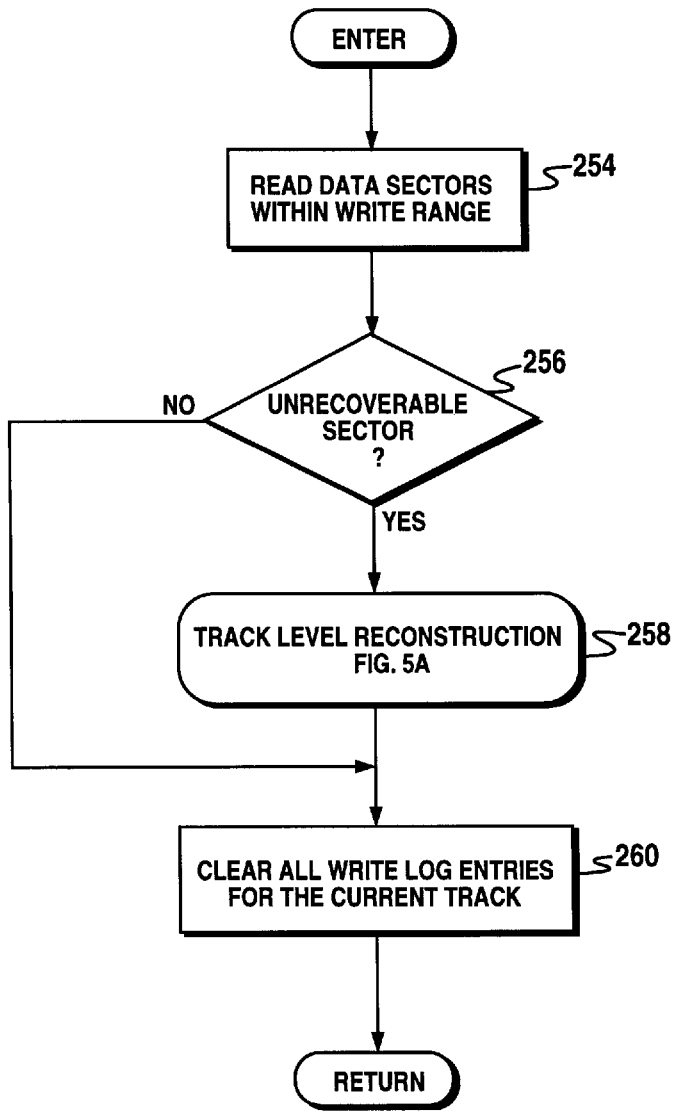
FIG. 4E is a flow chart of the steps executed to perform an immediate write verify operation on a track that has not been write verified and is about to be over written by a current write operation.

Referring now to FIG. 4E, which is a flow chart description of the immediate write verify operation, the storage system orients and attempts to read the target data sectors within the write range of the previous write operation (the write range is passed as a parameter retrieved from the write log or from a current write operation). If an unrecoverable sector is encountered 256 while reading the sectors in the write range, then the storage system attempts to reconstruct the unrecoverable sector 258 using the redundancy sector. Finally, before returning from the immediate write verify operation, all entries in the write log for the current track are cleared 260.

Idle Time Write Verify

In the "deferred" write method of FIG. 4A and the "cached deferred" method of FIG. 4B, the redundancy sector covers the write data after performing a write operation on a track. During idle time, the storage system executes a "write verify" operation intended to regenerate the redundancy sector for the entire track and, and the same time, verify the validity of the previous write operation. That is, if while regenerating the redundancy sector for the entire track an unrecoverable data sector is encountered within the write range of the previous write operation, then the storage system uses the redundancy sector to reconstruct the unrecoverable data sector. If the data sectors in the write range are recoverable, then the storage system over writes the redundancy sector with the regenerated redundancy sector.

Figure 4F:
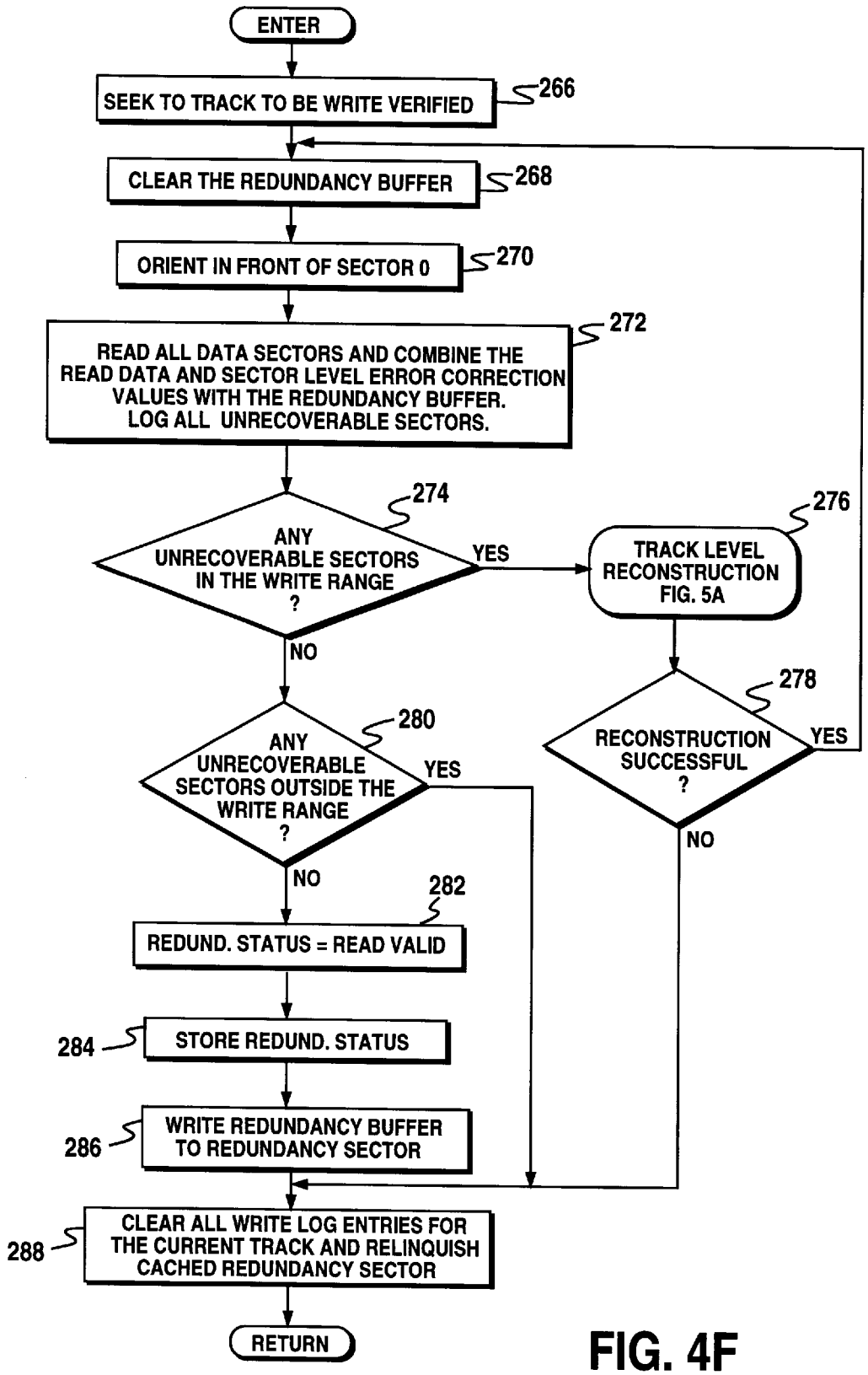
FIG. 4F shows the steps executed during idle time of the storage system to verify the write operation of FIG. 4A and regenerate the redundancy for the entire track.

The flow chart executed by the storage system during the idle time write verify operation is shown in FIG. 4F. First the storage system seeks to the track to be write verified 266. Then the redundancy sector is cleared 268 and the storage system orients to the first sector in the track 270 (i.e., sector 0). Once at sector 0, the storage system reads all of the data sectors in the track and combines the sector data and sector correction values with the redundancy buffer 272. Also while reading the entire track, all unrecoverable data sectors encountered are logged 272. Thus, if an unrecoverable data sector is encountered before reaching the write range of the previous write operation, which is potentially a catastrophic error since the redundancy sector at this time covers only the write range, the write verify operation is not aborted because an unrecoverable data sector in the write range can still be corrected. Further, an unrecoverable data sector encountered outside the write range may be over written before read by the host system; i.e., the catastrophic error event may be avoided.

After reading the entire track, the storage system checks whether there were any unrecoverable data sectors encountered within the write range 274. If so, the storage system executes a track level reconstruction operation 276 in an attempt to recover the data sector using the redundancy sector. If the sector reconstruction was successful 278, then the write verify operation is re-executed and the redundancy sector regenerated for the entire track. If the sector reconstruction was not successful 278, then the write verify operation is aborted after clearing the write log and relinquishing the cached redundancy sector 288.

If there are no unrecoverable sectors within the write range 274, the storage system checks if there were any unrecoverable sectors encountered outside the write range 280. If not, then the REDUND. STATUS is set to READ VALID 282 and then stored 284 (e.g., appended to the redundancy sector as it is written to the disc). The redundancy buffer is then written to the redundancy sector 286, thereby updating the redundancy sector to cover the entire track. If unrecoverable data sectors are encountered outside the write range 280, then the redundancy status is not changed (i.e., left WRITE VALID) so that an unrecoverable sector in the write range can be corrected in the future, if necessary. Finally, the write log is cleared for all entries matching the current track and the cached redundancy sector 288.

Track Level Sector Reconstruction

Figure 5A:
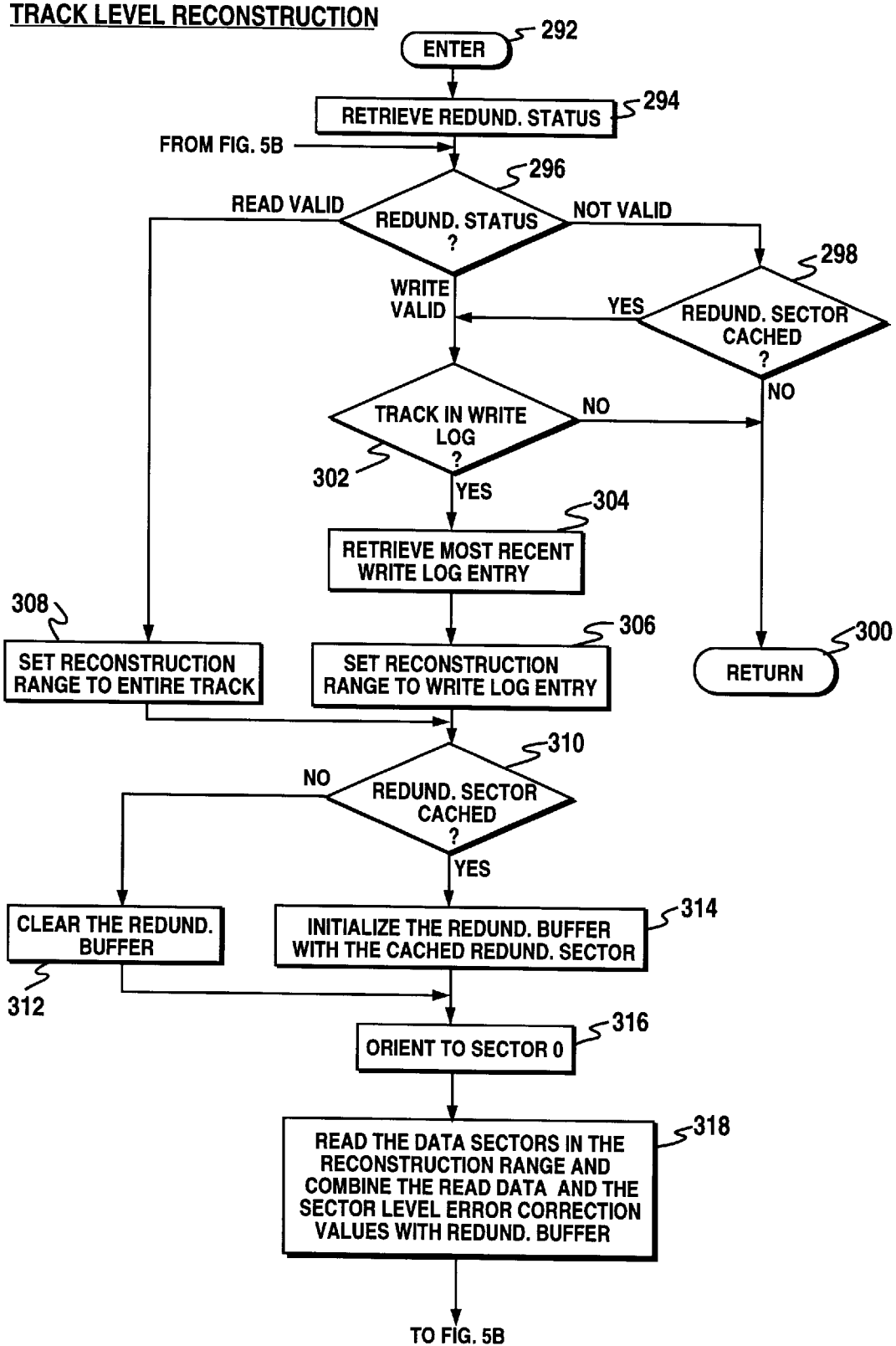
FIGS. 5A–5C show a flow chart of the present invention for reconstructing a data sector unrecoverable at the sector level using the redundancy sector.
Figure 5B:
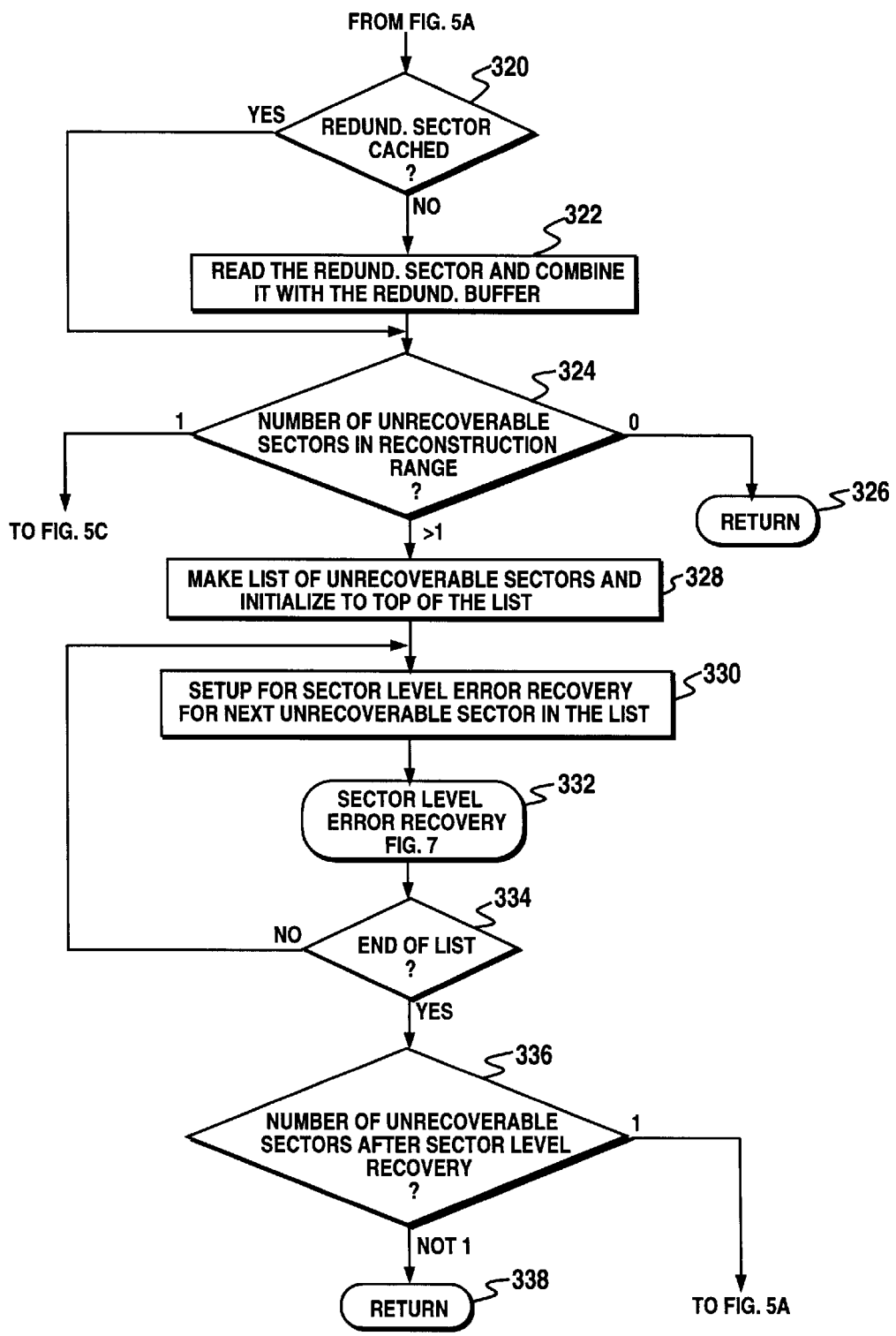
Figure 5C:
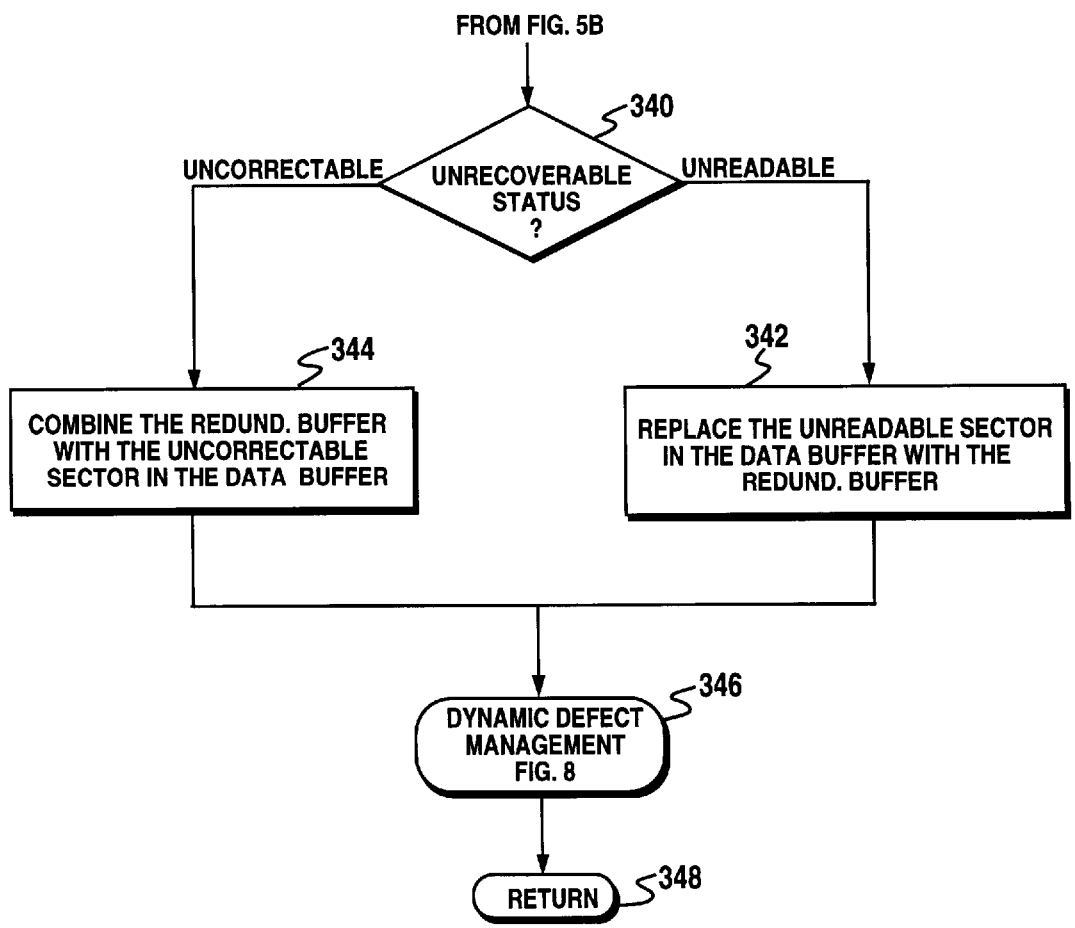

The method for reconstructing an unrecoverable data sector is set forth in the flow charts at FIGS. 5A–5C. Starting with FIG. 5A, the storage system retrieves the redundancy status for the track containing the unrecoverable data sector 294 (e.g., reads the redundancy status byte appended to the redundancy sector). If the REDUND. STATUS is READ VALID 296, then the reconstruction range is set to the entire track 308. If the REDUND. STATUS is WRITE VALID 296 or if it is NOT VALID and the redundancy sector is cached 298, then if the current track is in the write log 302 the most recent write log entry for the track is retrieved 304 and the reconstruction range set to the write range in the write log entry 306. If the current track is not in the write log 302, it means the write log entry was lost for the current track (e.g., over written) so the operation is aborted 300. If the REDUND. STATUS is NOT VALID 294 and the redundancy sector is not cached 298, then the operation is aborted 300 because there is no valid redundancy sector to perform the reconstruction operation.

If the redundancy sector is cached 310, then the redundancy buffer is initialized with the cached redundancy sector 314; otherwise, the redundancy buffer is cleared 312. Then the storage system orients to the first sector on the track (i.e., sector 0) 316. Once at sector 0, the storage system reads the data sectors in the reconstruction range and combines the read data and the sector level error correction values with the redundancy buffer 318.

Continuing now to FIG. 5B, if the redundancy sector is not cached 320, then the storage system reads the redundancy sector and combines it with the redundancy buffer 322. At this point, the redundancy buffer either contains syndromes for correcting a data sector uncorrectable at the sector level, or it contains an unreadable data sector.

If the number of unrecoverable sectors encountered after reading the reconstruction range is zero 324, then the operation is aborted 326 since sector reconstruction is unnecessary. If the number of unrecoverable data sectors is greater than one 324, then the storage system makes a list of the unrecoverable data sectors 328 and, for each entry in the list, sets up 330 to perform a sector level error recovery operation 332 (see FIG. 7). When finished with the unrecoverable entries in the list 334, if the number of unrecoverable data sectors after the sector level recovery 332 is not one, then the operation is aborted 338 because the sectors cannot be reconstructed.

If after attempting the sector level recovery 336 the number of unrecoverable data sectors is one, then the sector recovery procedure restarts at FIG. 5A. If after reading the data sectors in the write range 324 the number of unrecoverable data sectors is one, then continuing to FIG. 5C the contents of the redundancy buffer is used to reconstruct the sector. If the unrecoverable data sector is uncorrectable at the sector level 340, then the redundancy buffer contains error syndromes which are combined with the uncorrectable data sector stored in the data buffer 344 to correct the sector. If the unrecoverable data sector is unreadable 340, then the redundancy buffer contains the reconstructed data sector and the storage system merely replaces the unreadable sector in the data buffer with the contents of the redundancy buffer. After correcting the unrecoverable data sector in the data buffer, the storage system executes a dynamic defect management operation described below with reference to FIG. 8.

Idle Time Functions

When the storage system is idle (i.e., not reading or writing), it either processes entries in the write log, if any are pending, to verify previous write operations, or it scans the entire disc looking to correct data sectors that have become unrecoverable at the sector level due, for example, to grown defects in the medium. The flow charts describing the idle time operations are set for at FIGS. 6A–6C.

Figure 6A:
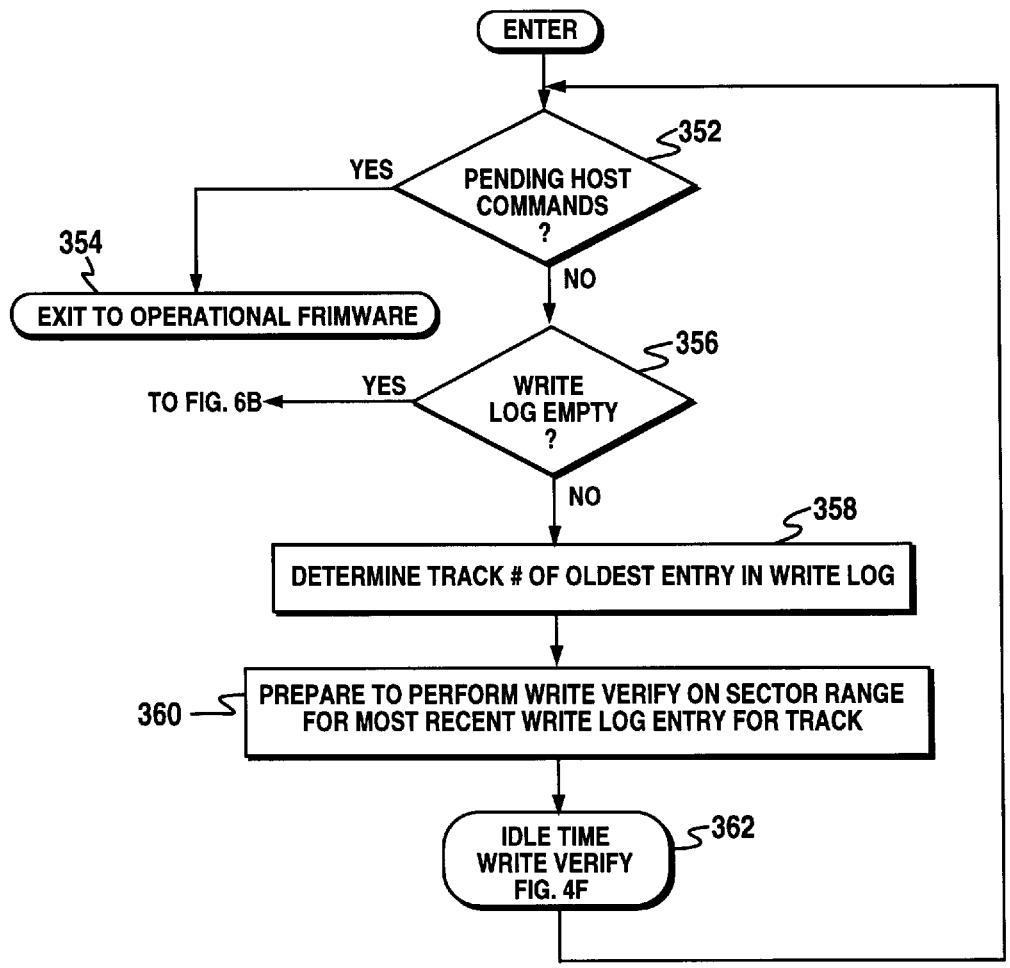
FIGS. 6A–6C show a flow chart of the operations performed by the storage system during idle time to verify the validity of write operations and scan the entire track to reconstruct data sectors that have become unrecoverable at the sector level using the redundancy sector.

Starting with FIG. 6A, if the storage system detects a pending host command 352 (e.g., read or write request), it exits the idle mode and returns control to the operational firmware 354. If no host commands are pending, then the storage system checks whether there are any entries in the write log (i.e., if there is a previous write command that needs to be write verified). If there are, then the track number for the oldest write log entry is retrieved 358 and the storage system prepares to perform a write verify on the sector range for the most recent write log entry for that track 360. The storage system processes the most recent write log entry since it corresponds to the most recent write operation (i.e., it corresponds to the redundancy sector currently stored on the track). The storage system then performs an idle time write verify 362 for the write log entry, the operation of which is described above with reference to FIG. 4F. After the write verify, the storage system continues the idle time operation for the next entry in the write log.

Figure 6B:
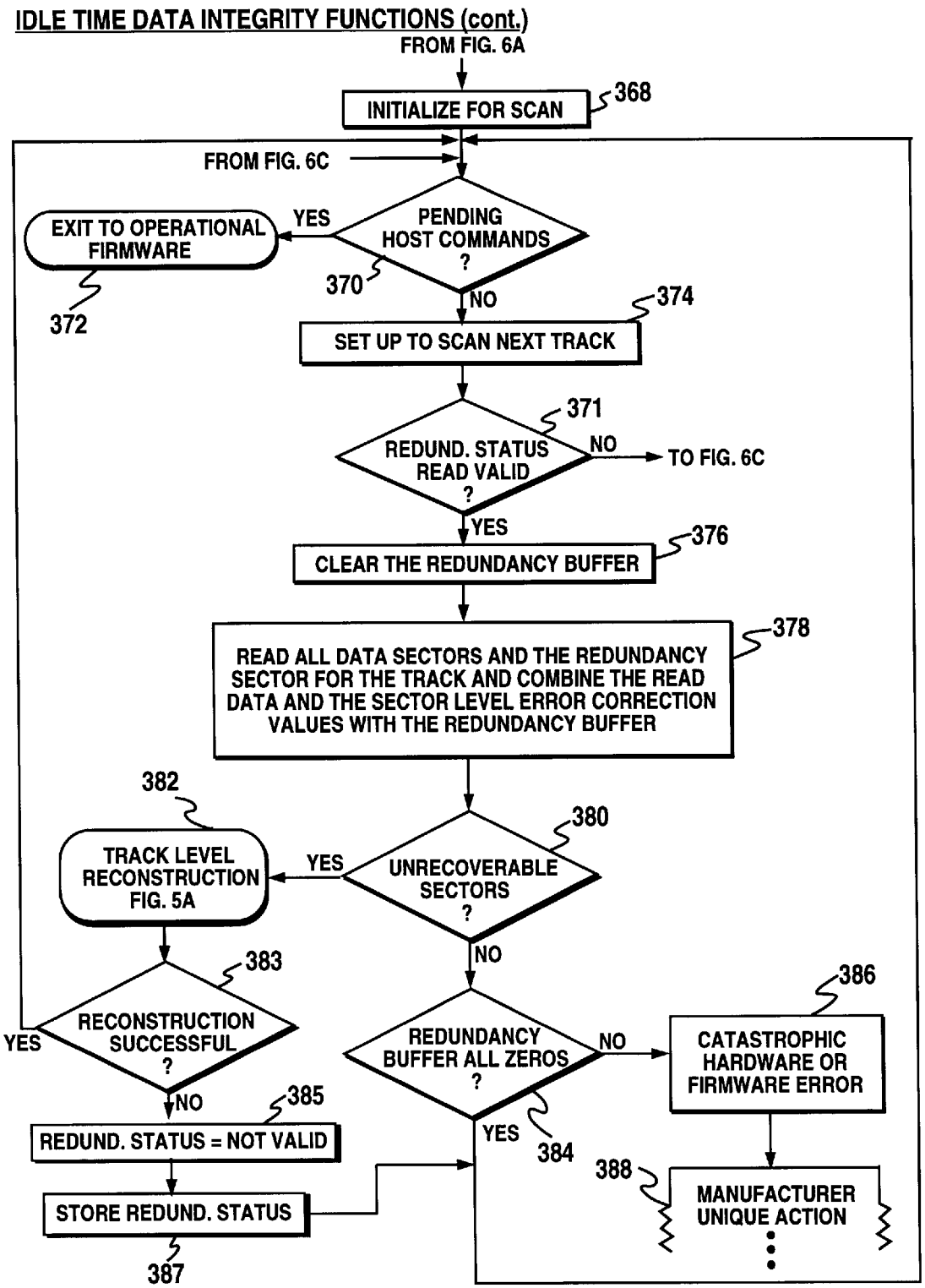
Figure 6C:
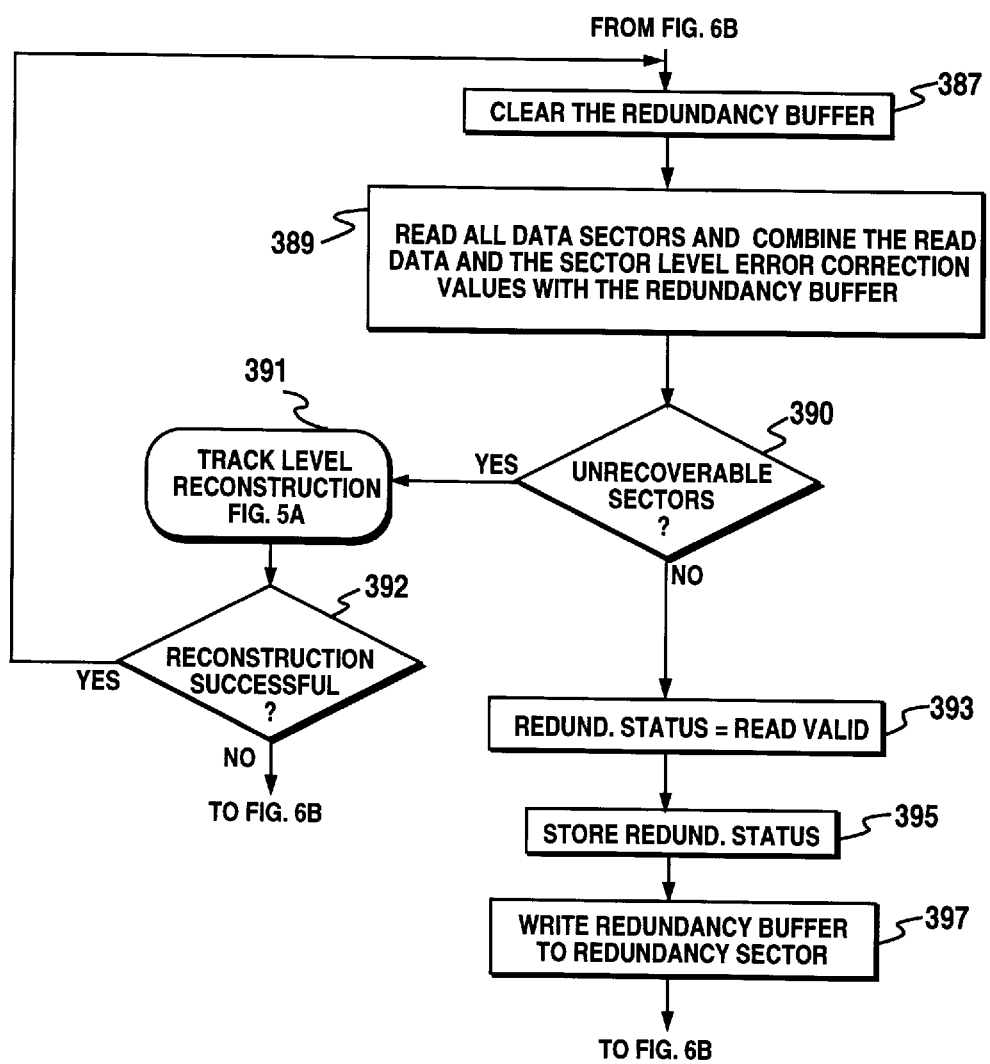

Once all of the write log entries have been processed, then Continuing to FIG. 6B, the storage system prepares to scan the entire disc looking for data sectors that have become unrecoverable. Since this scan will be periodically interrupted by a host command 370 and return to the operational firmware 372, the storage system saves a "place holder" so that the scan will continue where it left off. The flow charts show that the data integrity scan will continue indefinitely, but the storage system may alternatively be configured to perform the scan of the entire disc periodically.

If no host commands are pending 370, then the storage system sets up to scan the next track 374 by retrieving the redundancy status for the track (e.g., reading the redundancy status byte stored at the end of the redundancy sector). If the REDUND. STATUS is READ VALID 371, indicating that the redundancy sector covers the entire track, then the storage system clears the redundancy buffer 376 and reads all of the sectors on the track (data sectors and redundancy sector) and combines the read data and sector level error correction values with the redundancy buffer 378. If an unrecoverable data sector is encountered 380, then the storage system executes the above track level reconstruction operation (FIG. 5A) 382 in attempt to recover the sector. If the reconstruction is successful 383, then the scan continues with the next track; otherwise, the REDUND. STATUS is set to NOT VALID 385 and stored 387 (e.g., written to the redundancy sector) to indicate the redundancy sector is no longer valid.

After reading all of the data sectors on the track 378, the redundancy buffer should contain all zeros 384 if there were no unrecoverable data sectors encountered 380. If the redundancy buffer is not all zeros, it is tantamount to a catastrophic problem with the operation of the hardware or firmware 386 that requires appropriate action by the manufacturer 388.

If the REDUND. STATUS for a track is not READ VALID 371, then continuing to FIG. 6C, the storage system clears the redundancy buffer 387 and reads all of the data sectors and combines the read data and the sector level error correction values with the redundancy buffer 389. If an unrecoverable data sector is encountered, then the storage system executes the above track level reconstruction operation (FIG. 5A) 391 in attempt to recover the sector. If the sector reconstruction operation 391 is successful 392, then the storage system again attempts to regenerate the redundancy sector for the entire track; otherwise, the scan continues at FIG. 6B. If no unrecoverable sectors are encountered 390, the REDUND. STATUS is set to READ VALID 393, the REDUND. STATUS is stored 395 (e.g., written to the redundancy sector) and the redundancy buffer is written to the redundancy sector 397 before continuing the scan at FIG. 6B.

Sector Level Error Recovery

In the track level reconstruction procedure of FIG. 5B described above, if a track contains more than one unrecoverable data sector (thereby exceeding the correction capability of the track level redundancy) the storage system performs a sector level error recovery procedure 332 on the unrecoverable data sectors. If after this procedure there is only one remaining unrecoverable data sector, it can be recovered using the track level reconstruction procedure.

Figure 7:
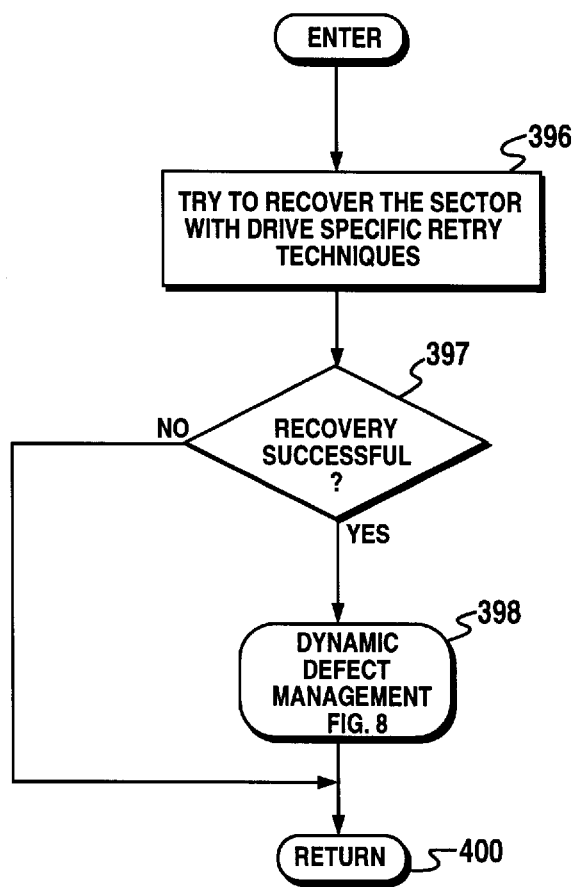
FIG. 7 shows a flow chart of a sector level error recovery method of the present invention which is executed when the number of data sectors unrecoverable at the sector level exceeds the error correction capability of the track level redundancy.

A flow chart of the sector level error recovery procedure 332 is shown in FIG. 7, wherein the storage system attempts to recover a sector using drive specific "retry" techniques 396. For example, the storage system may repeatedly reread an uncorrectable sector until the number of errors is within the error correction capability of the sector level redundancy. In addition, varying certain system dynamics may aid the sector recovery process; for example, offsetting the centerline servo tracking system or adjusting parameters in the read channel's gain control or timing recovery may increase the SNR enough to recover the sector. And a method for recovering an unreadable sector caused by an obliterated sync mark is to repeatedly reread the sector and time when the sync mark should occur relative to a particular point on the track, such as an embedded servo wedge.

If the sector level retry techniques are successful 397, then the storage system maps the unrecoverable data sector to a spare sector according to a dynamic defect management procedure 398 described below with reference to FIG. 8. Ideally, there will remain at most one unrecoverable data sector after the drive specific retry techniques, so that when control is returned 400 to the track level reconstruction procedure (FIG. 5B), the last remaining unrecoverable data sector can be recovered using the redundancy sector.

Dynamic Defect Management

Figure 8:
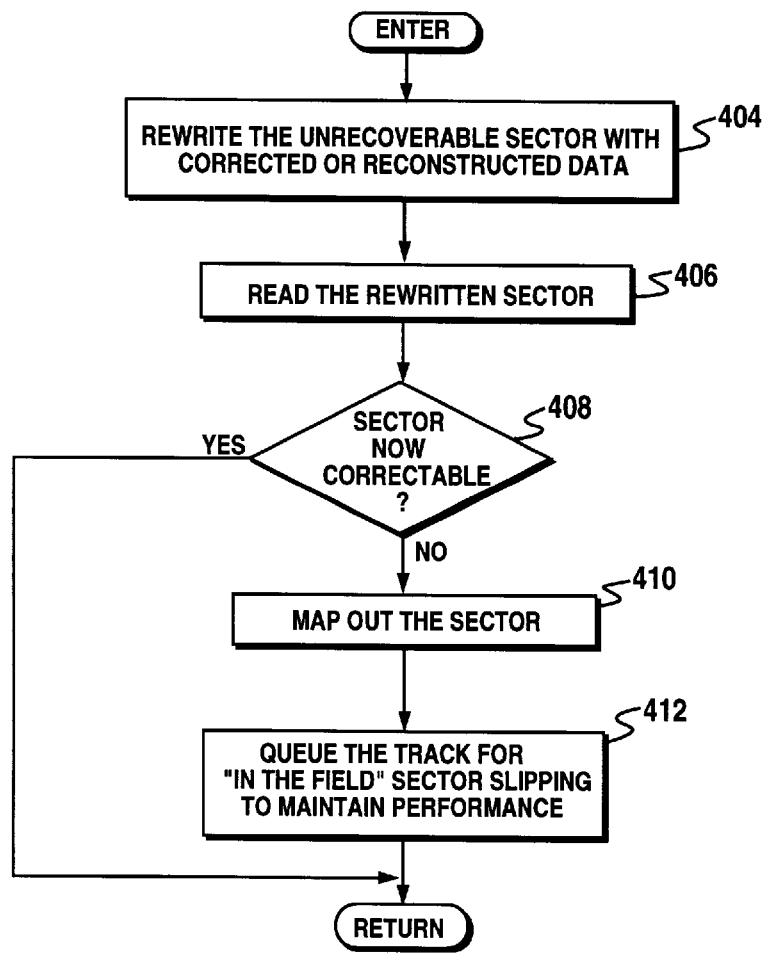
FIG. 8 is a flow chart showing the steps executed to perform a dynamic defect management procedure for mapping a defective sector to a spare sector, and to perform "in the field" sector slipping to maintain performance.

If a data sector is recovered using the track level reconstruction procedure of FIG. 5A or using the sector level error recovery procedure of FIG. 7, the storage system will execute a dynamic defect management procedure shown in FIG. 8. Before mapping to a spare sector, the storage system first rewrites the corrected or reconstructed data to the unrecoverable data sector 404. Then, the storage system attempts to read the unrecoverable data sector 406 to determine if the unrecoverability persists 408. If it does persist, the unrecoverable data sector is mapped to a spare sector on the disc 410, and preferably to a spare sector on the same track.

Once the unrecoverable data sector has been mapped to a spare sector on the track, the track is queued for "in the field" sector slipping 412. Sector slipping is a technique employed to maintain performance after defect mapping by, for example, "slipping" the logical sector numbers past a mapped sector (defective sector) so that the sector sequence remains contiguous around the track. Any well known technique of sector slipping after defect mapping may be employed, but an important aspect of the present invention is that the sector slipping is performed "in the field" during idle time of the storage system, as opposed to when the disc is formatted as in the prior art.

Sector slipping addresses the following problem: after a defective sector has been mapped to a spare sector on a track, the logical sector sequence will no longer be contiguous. Consider, for example, that SECTOR 4 in FIG. 1A is a spare sector and SECTOR 2 becomes unrecoverable. After mapping SECTOR 2 to SECTOR 4, the logical sector numbers are no longer contiguous and it is not possible to consecutively read or write the sectors in one revolution.

To implement "in the field" sector slipping, the storage system reserves a spare track preferably in the outer zone of the disc. The disc is normally partitioned into a number of zones where each zone comprises a predetermined group of adjacent tracks. This "zoning" technique allows the storage density to be increased at the outer zones due to the increase in the circumferential recording area. Thus, the number of sectors per track can be increased from the inner zone to the outer zone.

In the present invention, if an unrecoverable sector is mapped to a spare sector on a given track, then the storage system performs sector slipping on that track using the spare track. This is accomplished during idle time by transferring the sectors of the noncontiguous track to the spare track, and then copying in a contiguous order the sectors from the spare track back to the target track (i.e., slipping the defective sector).

The process of copying the sectors to the spare track can be interrupted by a host command to the track being slipped. If the host command is not a write command, then the state of the track copy is saved and restored when the operation is re-initiated. If the host command is a write command, the copying operation is simply restarted. Once all of the sectors have been successfully copied to the spare track, all host commands are mapped to the spare track until the sectors are successfully copied back to the target track in a contiguous order. Again, the process of copying the sectors from the spare track back to the target track can be interrupted by a host command wherein the state of the copy operation is saved unless it is a write command to the spare sector, in which case the copying operation is simply restarted.

Interleaved Redundancy Sector

The prior art track level error correction systems are limited to correcting only one unrecoverable data sector per track because the redundancy sector is generated as the byte XOR of the respective data bytes in the data sectors. This severely limits the benefit of using a redundancy sector, especially in cases where a burst error spans two sectors, thereby rendering both sectors unrecoverable at the sector level and at the track level. The present invention improves the error correction capability of the track level ECS by dividing a sector into three interleaved codewords and generating the redundancy sector by combining the respective symbols in each codeword according to a predetermined error correction operation (e.g., byte XOR).

Figure 9:
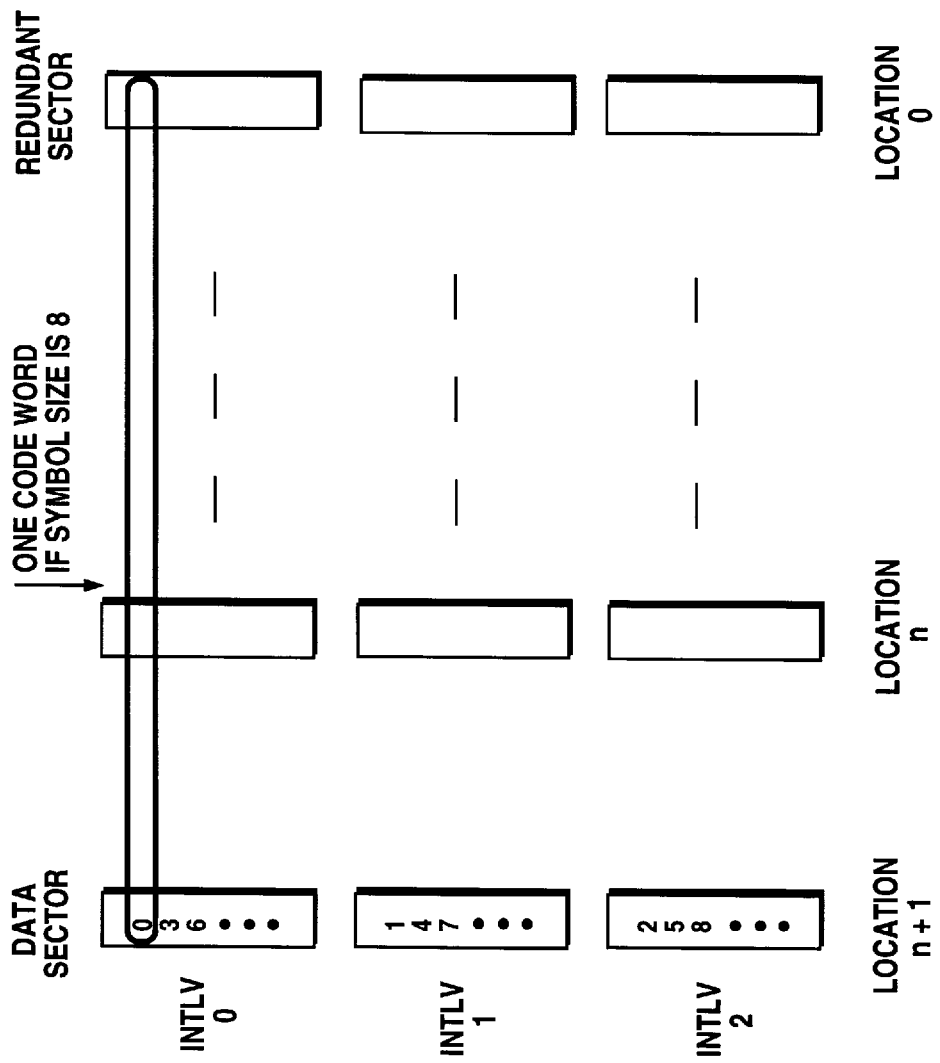
FIG. 9 shows an embodiment of the present invention wherein each data sector is divided into a number of interleaved codewords, and the redundancy sector generated by combining the sector codewords separately in order to increase the error correction capability of a single redundancy sector.

This aspect of the present invention is understood with reference to FIG. 9 which shows each data sector divided into three codewords, and the codewords being combined (XORed) across three interleaves (designated INTLV 0, INTLV 1 and INTLV 2) to generate an interleaved redundancy sector. The data sector itself is interleaved to generate the three codewords; that is, symbol 0 is placed in the first codeword, symbol 1 is placed in the second codeword, symbol 2 is placed in the third codeword, symbol 3 is placed in the first codeword, etc . . . Then, sector level redundancy is generated for each of the three codewords and stored in the data sector. Upon read back, the data symbols read from the disc are de-interleaved into the three codewords and each codeword is processed by the sector level ECS separately. In this manner, the sector level ECS can generate an erasure pointer corresponding to an unrecoverable codeword within a sector (i.e., an unrecoverable codeword in INTLV0, INTLV1 or INTLV2). Using the erasure pointers, the track level ECS is capable of correcting a single unrecoverable codeword in each interleave, and the unrecoverable codewords can occur in different sectors. Thus, using the interleave technique of the present invention, the track level ECS is capable of correcting up to three unrecoverable data sectors containing a single uncorrectable codeword in separate interleaves.

Preferably, the redundancy sector is generated according to: $2^m$–the sum modulo $2^m$ of the respective codeword symbols in an interleave (i.e., INTLV0, INTLV1 or INTLV2), where m is the size in bits of a codeword symbol. Then, the track level error syndromes for correcting a codeword are generated as the sum modulo $2^m$ of the respective codeword symbols in an interleave, including the redundancy sector codeword. The error syndromes are then used to correct a data codeword uncorrectable at the sector level that corresponds to the erasure pointer generated by the sector level ECS. That is, the erasure pointer identifies the sector and interleave location of the uncorrectable codeword, and the track level ECS uses the erasure pointers to correct up to three codewords in separate interleaves which can occur in three different sectors.

Multiple Redundancy Sectors

The above aspects of the present invention are extendable to a storage system that employs two or more redundancy sectors geographically distributed over a track in order to further improve performance and reduce the write latency.

In one embodiment, each of the redundancy sectors covers the entire track; that is, after the redundancy is regenerated for an entire track, the redundancy data is stored in the nearest redundancy sector in order to minimize the revolution latency. The storage system maintains a variable to indicate which of the plurality of redundancy sectors per track is valid, that is, which redundancy sector was updated last.

In an alternative embodiment, each of the plurality of redundancy sectors covers a subset of the data sectors on a track. Again, this reduces the latency in the present invention write operations described above because the storage system can regenerate the redundancy sector and write the target data sectors in one pass. This is not true in the above described prior art "backing out" technique because it requires an extra revolution of latency to back out the old contribution of the target sectors from the redundancy sector.

Sector Level Ecs

In the sector level ECS, the data to be stored onto the disk is processed to obtain additional data symbols (called check symbols or redundancy symbols). The data and check symbols together make up a codeword. When reading from the disk, the codeword is mathematically processed to obtain error syndromes which contain information about locations and values of errors.

The Reed-Solomon codes are a class of multiple-error correcting codes. One of the most popular methods of decoding is to generate the error locator polynomial $\sigma(x)$ [i.e the connection polynomial using the Berlekamp-Massey algorithm]; generate the error evaluator polynomial $\omega(x)$ from the error locator polynomial; perform a root search for the error locator polynomial to detect error locations; and then evaluate the error evaluator polynomial at the error locator polynomial root to calculate an error value.

Most logic circuits for error detection and correction implement the Berlekamp-Massey algorithm. Each iteration of the Berlekamp-Massey algorithm has two parts or stages:
1) calculate $d_n$: $d_n = \Sigma \sigma_k S_{n-k}$
2) update $\sigma$: $\sigma^{(n+1)}(x) = \sigma^{(n)}(x) - d_n d_r^{-1} x \tau^{(n)}(x)$
   update $\tau$: $\tau^{(n+1)}(x) = x\tau^{(n)}(x)$ or $\sigma^{(n)}(x)$ As used herein, $d_n$ is a discrepancy number and $\tau$ is an intermediate polynomial used in calculating. The choice of the two alternate expressions for $\tau$ depends on whether or not the $\sigma(x)$ update results in an increase in the order of $\sigma(x)$. When an increase results, $\tau(x)$ is set to $\sigma(x)$ and $d_r$ is set to $d_n$. If $\tau(x)$ is instead set to $d_n^{-1} x\sigma(x)$, then $d_r$ can be eliminated and the recursions become:

EQUATIONS. 1:
1) calculate $d_n$: $d_n = \Sigma \sigma_k S_{n-k}$
2) update $\sigma$: $\sigma^{(n+1)}(x) = \sigma^{(n)}(x) - d_n \tau^{(n)}(X)$
   update $\tau$: $\tau^{(n+1)}(X) = x\tau^{(n)}(x)$ or
   $\tau^{(n+1)}(X) = d_n^{-1} x \sigma^{(n)}(x)$
   and $d_r = d_n$ The second stage requires the result of the first stage. To minimize circuitry size it is desirable to perform all arithmetic in a serial manner and to make updates in a serial manner (as opposed to a parallel manner requiring space-consuming parallel buses). Assuming the field used is $GF(2^m)$, the minimum number of clock cycles needed for a serialized implementation is 2m clocks per iteration, i.e. m clocks per stage.

U.S. Pat. No. 4,845,713, issued Jul. 4, 1989 to Zook, shows a method which uses 2m+1 clocks per iteration and bit-serial multipliers and adders. However, it uses 4t+1 m-bit registers and a $2^m \times m$ ROM look-up table for inversion (t being the number of correctable errors). Also, the update for $\tau^{(n+1)}(x)$ is done in a parallel manner.

Various decoding methods are described in Whiting's PhD dissertation for the California Institute of Technology entitled "Bit-Serial Reed-Solomon Decoders in VLSI," 1984. Whiting's preferred implementation uses the following modified set of recursion equations:

EQUATIONS 2:
1) calculate $d_n$: $d_n = \Sigma \sigma_k S_{n-k}$
2) update $\sigma$: $\sigma^{(n+1)}(X) = \sigma^{(n)}(x)$ or
   $\sigma^{(n+1)}(x) = d_n^{-1} \sigma^{(n)}(x) - x\tau^{(n)}(x)$
   update $\tau$: $\tau^{(n+1)}(x) = x\tau^{(n)}(x)$ or
   $\tau^{(n+1)}(x) = d_n^{-1} \sigma^{(n)}(x)$ Whiting's implementation can perform an iteration in 2m clocks if a $2^m \times m$ ROM look-up table is used for inversion. The updates can be done serially, but $d_n^{-1}$ must be parallel bussed to each multiplier. Whiting's overall implementation would use 5(t+1) m-bit registers. The reason that the number of registers is proportional to t+1 instead of t is because $\sigma_0$ is not identically equal to 1, i.e. the $\sigma(x)$ generated by EQUATIONS 2 is the $\sigma(x)$ generated by EQUATIONS 1 multiplied by some constant. Whiting also mentions using the following modified set of recursion equations:

EQUATIONS 2A:
1) calculate $d_n$: $d_n = \Sigma_k S_{n-k}$
2) update $\sigma$: $\sigma^{(n+1)}(X) = d_r \sigma^{(n)}(x) - xd_n \tau^{(n)}(x)$
   update $\tau$: $\tau^{(n+1)}(X) = x\tau^{(n)}(x)$ or
   $\tau^{(n+1)}(x) = \sigma^{(n)}(x)$ Whiting's second method uses no inversions, but for serial updates it requires 6(t+1)+2 m-bit registers and $d_n$ and $d_r$ must be parallel bussed to each multiplier.

All known implementations for the Berlekamp-Massey algorithm use some combination of a $2^m \times m$ ROM, symbol-wide signal paths, and an excessive number of m-bit registers in order to perform an iteration in 2m clock cycles. An inherent problem with all of the above sets of iteration equations is that $\sigma^{(n+1)}(x)$ depends on $\tau^{(n)}(x)$ and, in turn, $\tau^{(n+1)}(x)$ depends on $\sigma^{(n)}(x)$. Since one or both of them depend upon $d_n$, consequentially $d_n$ must be calculated during the first m clock cycles and then $\sigma^{(n+1)}(x)$ and $\tau^{(n+1)}(x)$ must both be calculated during the second m clock cycles. This implies the need for temporary storage for one or both of $\sigma^{(n)}(x)$ and $\tau^{(n)}(X)$ when used in multiplications to produce $\sigma^{(n+1)}(x)$ or $\tau^{(n+1)}(X)$. Thus there is a need for a more efficient method.

The Reed-Solomon decoder of the present invention processes a codeword containing n m-bit symbols to determine coefficients of an error locator polynomial $\sigma(x)$, and thereafter generates an error evaluator polynomial $\omega(x)$. The decoder comprises a bank of syndrome registers for storing syndrome values; a bank of error locator registers for accumulating therein coefficients of an error locator polynomial $\sigma(x)$; a bank of intermediate registers for accumulating therein coefficients of an intermediate polynomial $\tau(x)$. The decoder further includes a register update circuit which, for a given codeword, conducts t number of error locator iterations in order to update values in the error locator registers and the intermediate registers. Each error locator iteration includes two phases, specifically a first phase or phase A and a second phase or phase B. Each phase comprises m clock cycles. Upon completion of the error locator iterations, two-phased error evaluator iterations are conducted to determine coefficients of the error evaluator polynomial $\omega(x)$ which are stored in the intermediate registers.

In contrast to prior art techniques wherein coefficients of the error locator polynomial $\sigma(x)$ and coefficients of the intermediate polynomial $\tau(x)$ are both updated during the same phase (e.g., the second phase of an error locator iteration), the register update circuit of the present invention updates coefficients of the intermediate polynomial $\tau(x)$ during the first phase of each error locator iteration, and updates coefficients of the error locator polynomial $\sigma(x)$ during the second phase of each error locator iteration. A current discrepancy value $d_n$, required for updating the coefficients of the error locator polynomial $\sigma(x)$, is also obtained during the first phase of each error locator iteration.

The decoder of the present invention thus implements the following recursion rules:

PHASE A:

update $\tau$: $\tau^{(n)}(x) = x\tau^{(n-1)}(x)$ or
$\tau^{(n)}(x) = x(\tau^{(n-1)}(x) + d_{n-1}^{-1}\sigma^{(n)}(X))$ calculate $d_n$: $d_n = \Sigma \sigma_k S_{n-k}$

PHASE B:

update $\sigma$: $\sigma^{(n+1)}(x) = \sigma^{(n)}(x) - d_n\tau^{(n)}(x)$

The register update circuit includes a discrepancy determination circuit for determining, during the first phase of each error locator iteration, the current discrepancy $d_n$. The discrepancy determination circuit adds multiplicative products from a plurality of "slices" to obtain the current discrepancy $d_n$. Each slice comprises one of the syndrome registers, one of the error locator registers, one of the intermediate registers, and one modified syndrome register.

The multiplicative product of each slice is generated by a discrepancy-generating inner product generator circuit. The discrepancy-contributing inner product generator circuit of a slice takes the inner product of the modified syndrome register of the slice (in second or $\beta$ basis representation) and the contents of the intermediate register of the slice (in first or $\alpha$ basis representation). The product of two elements of $GF(2^m)$, where one element is represented in the standard or $\alpha$ basis and one element is represented in the dual or $\beta$ basis, can be produced serially, i.e. one output bit per clock, by taking the inner product of the two elements and multiplying one of the elements by $\alpha$ on each clock. Thus, in connection with the inner product generated by the discrepancy-contributing inner product generator circuit, the modified syndrome register initially receives the syndrome value of its corresponding syndrome register, but is updated to contain an $\alpha$-multiple of the syndrome value by virtue of a multiplier feedback circuit connected around each modified syndrome register. Thus, each multiplicative product (i.e., the multiplicative product produced by a slice) is derived from a first term (the coefficient of the error locator register of the slice) and a second term (an $\alpha$-multiple of the syndrome value of the slice [the $\alpha$-multiple being stored in the modified syndrome register]). These first and second terms are multiplied by the discrepancy-contributing inner product circuit included in the slice.

The register update circuit also includes a discrepancy inversion circuit which determines an inverse of the current discrepancy (i.e., $d_n^{-1}$) in first basis representation. This inverse becomes the inverse of a prior discrepancy (i.e., $d_{n-1}^{-1}$ in an immediately succeeding error locator iteration). The discrepancy inversion circuit does not utilize a ROM-stored look up table, but instead serially receives the discrepancy in the second basis representation and generates its inverse.

The register update circuit also includes a discrepancy register DM which selectively has stored therein the inverse of the prior discrepancy (i.e., $d_{n-1}^{-1}$) during the first phase of each error locator iteration and the current discrepancy ($d_n$) during the second phase of each error locator iteration. Both the inverse of the prior discrepancy (i.e., $d_{n-1}^{-1}$) and the current discrepancy ($d_n$) are stored in the discrepancy register in first basis (i.e., $\alpha$ basis) representation, the prior discrepancy (i.e., $d_{n-1}^{-1}$) having been generated in the first basis representation by the discrepancy inversion circuit and the current discrepancy ($d_n$) having been converted from second basis (i.e., $\beta$ basis) representation to first basis representation by a conversion circuit for converting $d_n$ from a second basis representation to a first basis representation.

The register update circuit also includes an updating multiplier or inner product circuit which, during the first phase of each error locator iteration, selectively multiplies a value derived from the inverse of the prior discrepancy ($d_{n-1}^{-1}$), e.g., an $\alpha$-multiple of $d_{n-1}^{-1}$ [stored in the discrepancy register during the first phase of the error locator iteration] by the coefficients in the error locator registers to obtain values for use in updating the coefficients stored in the intermediate registers. Thereafter (e.g., during the second phase of each error locator iteration), the updating multiplier circuit multiplies a value derived from the current discrepancy dn, e.g., an $\alpha$-multiple of dn [stored in the discrepancy register during the second phase of the error locator iteration] by the coefficients in the intermediate registers to obtain values for updating the coefficients stored in the error locator registers. The $\alpha$-multiple of the current discrepancy $d_n$ is obtained by a multiplier feedback circuit connected to the discrepancy register for repetitively multiplying the value in the discrepancy register by the field element.

Importantly, in contrast to prior art techniques, the decoder of the present invention requires only one bank of error locator registers and one bank of intermediate registers. Prior art techniques of necessity included two banks of error locator registers: a first bank for maintaining the updated (new) coefficients of the error locator polynomial and a second bank for storing the old coefficients of the error locator polynomial (which were used to update the coefficients of the intermediate polynomial). Similarly, the prior art technique employed two banks of intermediate registers: a first bank for maintaining the new (updated) coefficients of the intermediate polynomial and a second bank for storing the old coefficients of the intermediate polynomial (which were used to update the coefficients of the error locator polynomial). Thus, the decoder of the present invention advantageously eliminates two banks of registers. In addition, the decoder of the present invention facilitates serial data shifting rather than parallel data transfer, thereby reducing circuit real estate which would otherwise be increased by parallel bus structure.

Reed-Solomon Decoder

Referring again to FIG. 1C, a decoder circuit 22 receives t m-bit syndromes from a syndrome generator 20 and m-bit erasure location values from an erasure location value generator 24. In addition, the operation of the decoder circuit 22 is sequenced by signals applied thereto by a timer/controller 38. After a series of error locator iterations, the decoder circuit 22 obtains final values for the t m-bit coefficients of the error locator polynomial. Upon completion of the series of error locator iterations for a codeword, the decoder circuit 22 executes a series of error magnitude iterations to generate an error evaluator polynomial for the codeword. The coefficients of the error evaluator polynomial are transmitted to a root search and error/erasure magnitude generator 26 where an error/erasure magnitude E is calculated. After calculating the error/erasure magnitude E, it is added to the original data at adder 30, resulting in the corrected byte. In the buffering scheme herein illustrated, the corrected byte is then returned to the data buffer 32.

The product of two elements of $GF(2^m)$, where one element is represented in the standard (or $\alpha$ basis) and one element is represented in the dual (or $\beta$ basis), can be produced serially, i.e. one output bit per clock, by taking the inner product of the two elements and multiplying one of the elements by $\alpha$ on each clock. Accordingly, as used herein, such values as the syndromes, the current discrepancy $d_n$, and the prior discrepancy $d_{n-1}$ are represented in the $\alpha$ basis while such values as the coefficients of $\sigma(x)$ and $\tau(x)$ are represented in the $\beta$ basis. Such representation allows all of the multiplications of EQUATIONS 3 (hereinafter discussed) to be performed serially using inner products.

Figure 10:
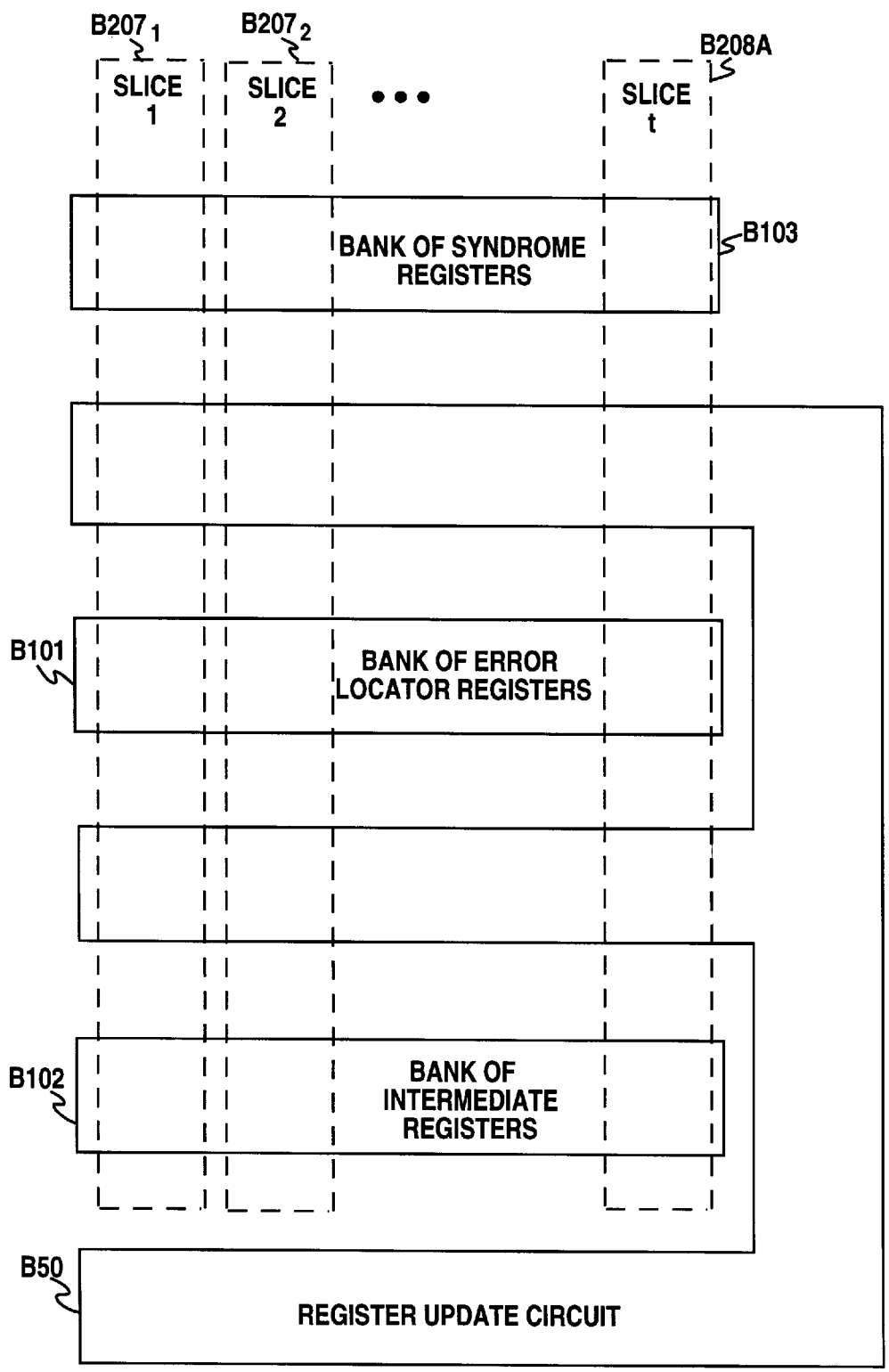
FIG. 10 shows a block diagram of the Reed-Solomon decoder circuit of FIG. 1C.

FIG. 10 is a block diagram of decoder circuit 22 generally. Decoder circuit 22 comprises a bank B101 of error locator or $\sigma$ registers; a bank B102 of intermediate or $\tau$ registers; a bank B103 of syndrome registers; and, a register update circuit B50. Details of differing embodiments of decoder circuit 22 are provided with respect to FIG. 11A and 11B. It will subsequently be seen that portions of decoder circuit 22 form a plurality of "slices" $B207_1$, $B207_2$, ... $B207_{t-1}$, B208A. The slices are discussed in more detail below, particularly with reference to FIGS. 12A–12D.

Figure 11A:
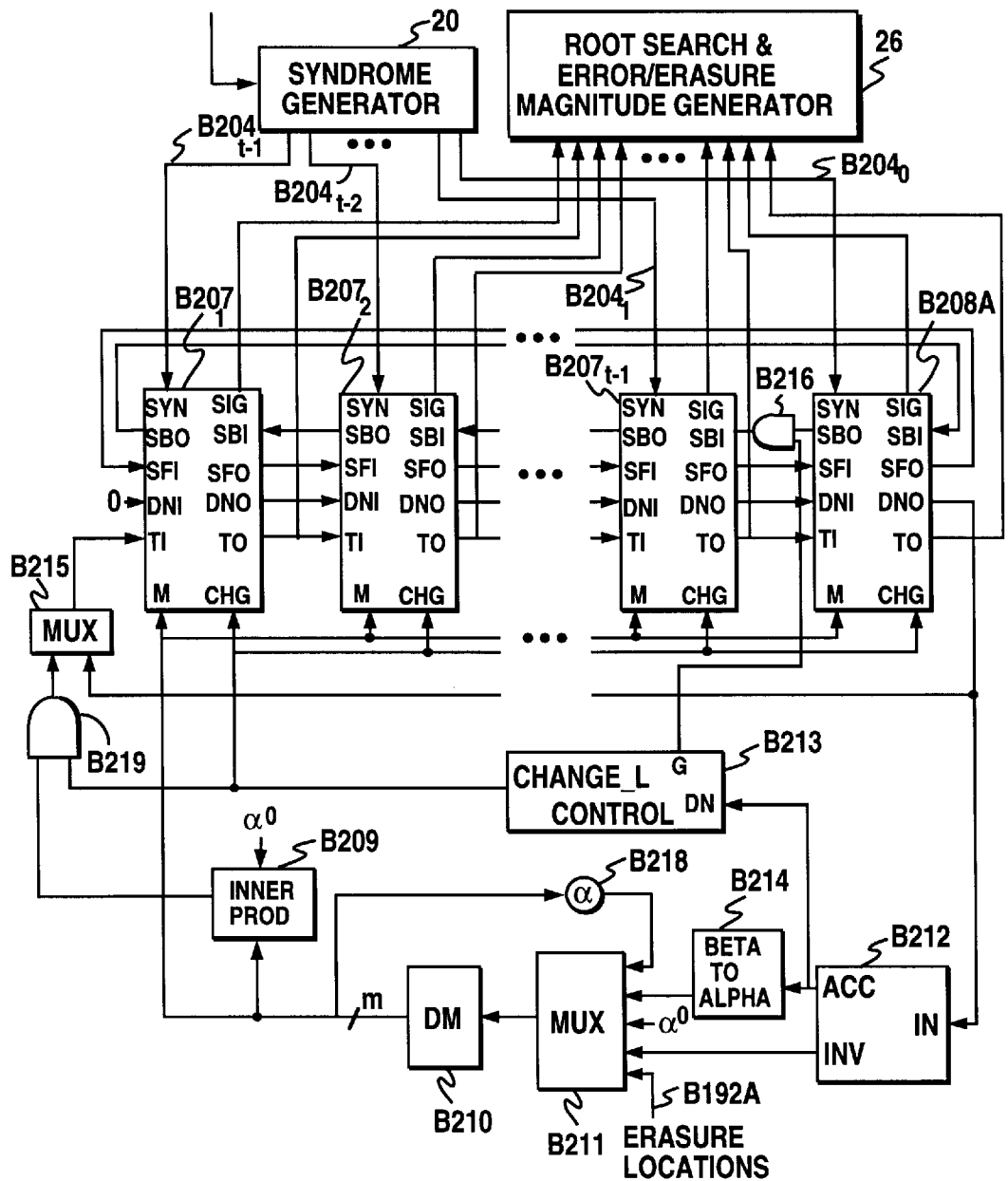
FIG. 11A show a schematic view of a decoder circuit according to an embodiment of the invention (which operates in an errors and erasure mode) along with a syndrome generator and which incorporates erasure correction.
Figure 11B:
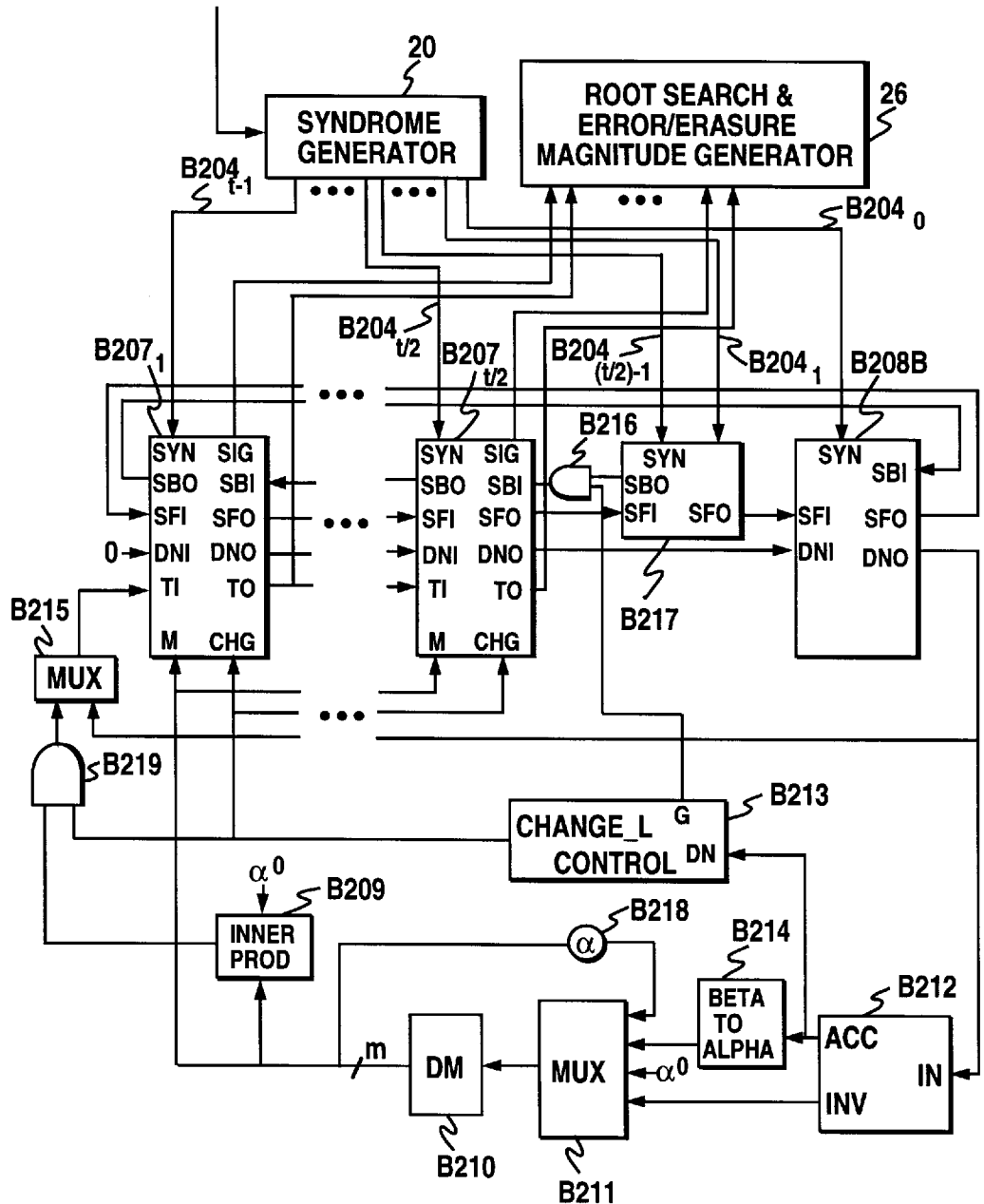
FIG. 11B is schematic view of a decoder circuit according to an embodiment of the invention (which operates in an errors only mode) along with a syndrome generator and error/locator generator and which does not incorporate erasure correction.

Decoder circuit 22 operates in one of two modes: decoding of errors and erasures (errors and erasures mode), or decoding of errors only (errors only mode). FIG. 11A shows details of the decoder circuit for the errors and erasures mode, and FIG. 11B shows details of the decoder circuit for the errors only mode. Decoder circuit 22 of FIG. 11A can simultaneously correct u errors and v erasures (errors whose locations are known) as long as 2u+v is not greater than t.

FIG. 11A shows signals which are input to and output from slices $B207_k$ and B208A in an errors and erasures mode. These signals include the following m-bit signals:

SYN—syndrome data signal;
SBO—syndrome shifted backwards output signal;
SBI—syndrome shifted backwards input signal;
SFI—syndrome shift forward input signal;
SFO—syndrome shift forward output signal
TI—$\tau$ input signal TI;

TO—$\tau$ output signal TO;
M—discrepancy-related input signal M;
DNI—a one bit discrepancy-forming input signal input into each slice $B207_k$, B208A;
DNO—a one bit discrepancy-forming output signal output from each slice $B207_k$, B208A; and
SIG—a one bit coefficient output line SIG connected from each slice to error locator generator B203 so that output from error locator register B101 can be serially outputted.

FIG. 11A shows some of the elements included in register update circuit B50 of FIG. 10. These elements include an inner product circuit B209; a discrepancy-related register DM B210; a DM register-controlling MUX B211; a discrepancy inversion circuit B212; a controller B213; a $\beta$ to $\alpha$ basis conversion circuit B214; a TI input-controlling MUX B215; a zero backward fill AND gate B216; a multiplier feedback circuit B218; and a first slice $\tau$-AND gate B219. Yet other elements included in register update circuit B50 include the non-register components of slices $B207_k$ and B208A, which are discussed below.

As shown in FIG. 11A, output signal DNO from slice B208A is applied both to an input of discrepancy inversion circuit B212 and to a first input pin of MUX B215. Discrepancy inversion circuit B212 has two m-bit output ports: a first output port labeled ACC, and a second output port labeled INV. As hereinafter described, a current discrepancy value $d_n$ (in $\beta$ basis representation) is output from port ACC during the first phase of an error locator iteration. From port ACC the current discrepancy value $d_n$ is applied both to input pin DN of controller B213 and to $\beta$ to $\alpha$ basis conversion circuit B214. Upon completion of a second phase of an error locator iteration, discrepancy inversion circuit B212 outputs an inverted value of the discrepancy ($d_n^{-1}$) determined during the first phase, which inverted value then becomes an inverted prior discrepancy (e.g., $d_{n-1}^{-1}$) during the first phase of the next iteration.

Figure 16:
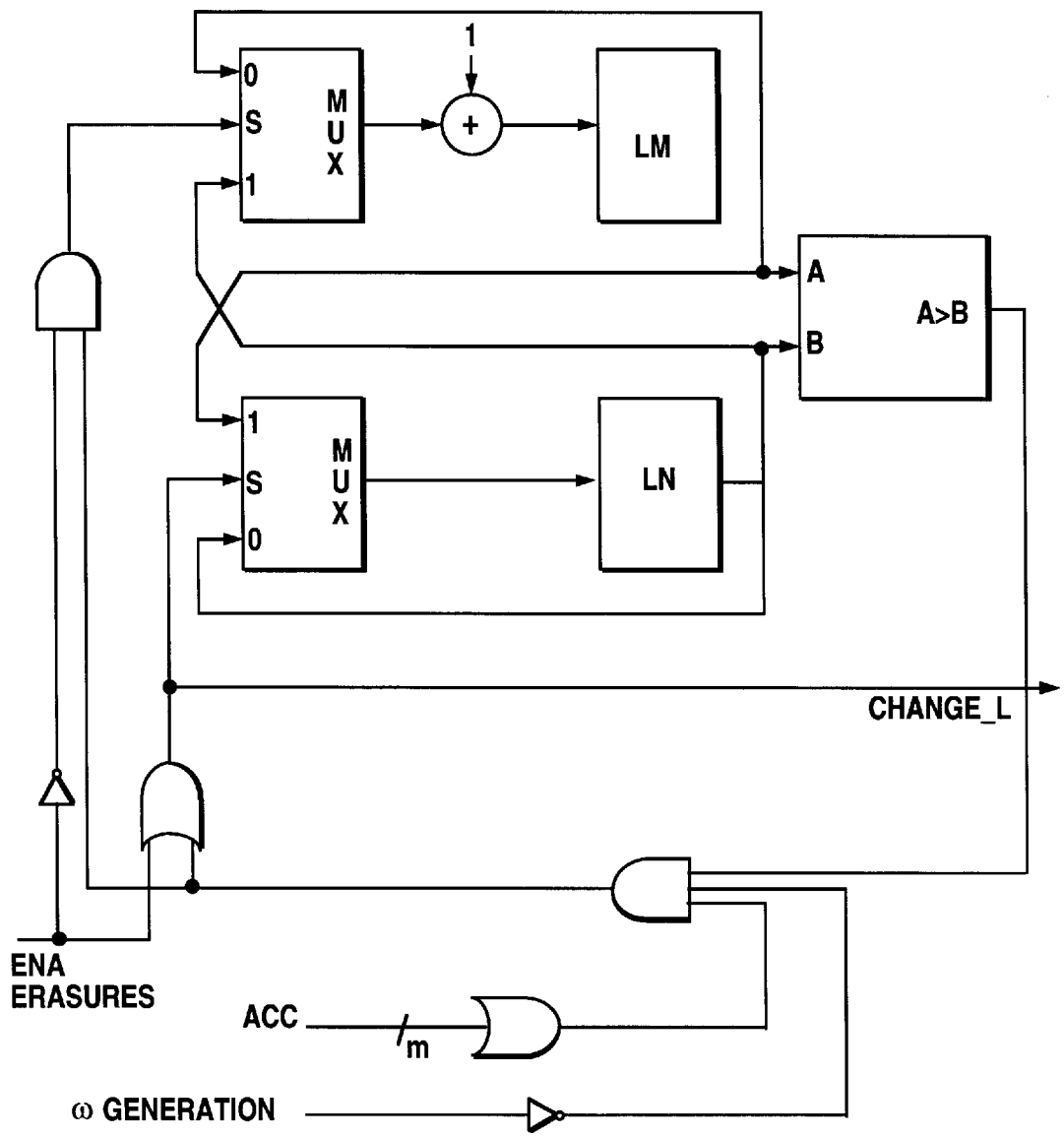
FIG. 16 is a schematic view of portions of a controller according to an embodiment of the invention.
Figure 17:
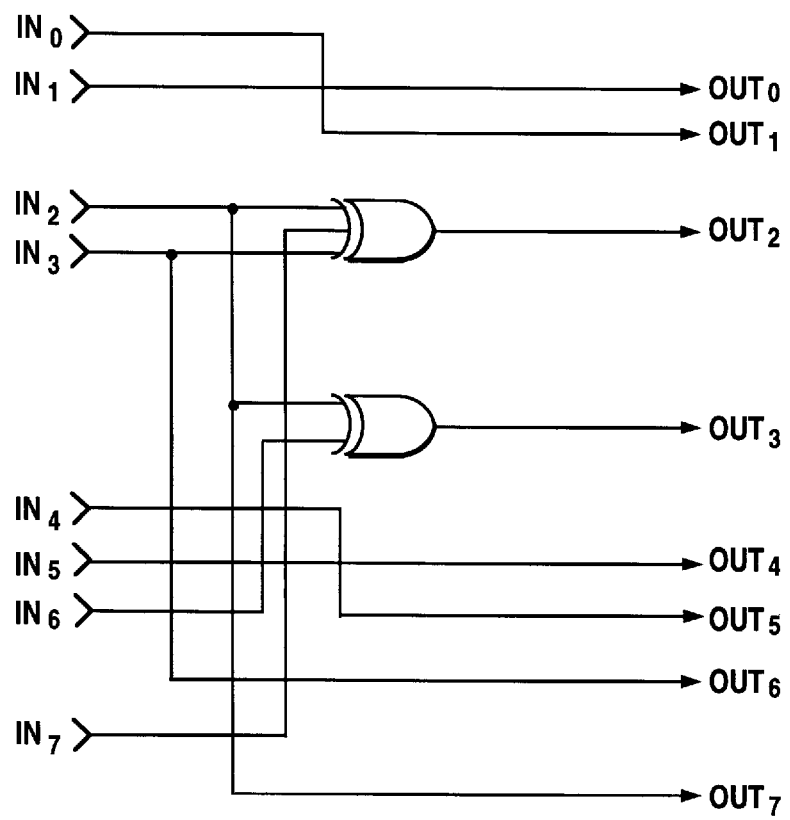
FIG. 17 is a schematic view of a circuit which translates from the dual (e.g., second) basis to the standard (e.g, first) basis.

Controller B213 uses the non-converted current discrepancy value $d_n$ obtained from circuit B212 to generate signals G and CHANGE_L in the manner depicted in FIG. 16. Signal CHANGE_L is applied to a first input pin of AND gate B219 and to slices $B207_k$ and B208A in the manner depicted in FIG. 12A, 12B and 12C. Signal CHANGE_L refers to a change in the length of the connection polynomial, which is understood by those skilled in the art.

DM-register controlling MUX B211 receives a plurality of selectable m-bit inputs, including the current discrepancy (in $\alpha$-basis representation from basis conversion circuit B214); the inverted prior discrepancy $d_{n-1}^{-1}$ (from inversion circuit B212); the value $\alpha^0$; erasure location values (from erasure location value generator B197.); and, an $\alpha$-multiple of the contents of DM register B210 (from multiplier feedback circuit B218). DM-register controlling MUX B211 is, in turn, controlled by timer/controller B198 which selects among the possible inputs in accordance e.g. with the iteration phase.

An output port of DM-register controlling MUX B211 is connected to an input port of DM register B210. An output port of DM register B210 is connected to the multiplier feedback circuit B218; to a first input of inner product circuit B209; and to slices $B207_k$ and B208A in the manner illustrated by FIGS. 11A and 11B. Inner product circuit B209 receives $\alpha^0$ as a second input and generates an output signal for application to a second pin of first slice $\tau$-AND gate B219.

The errors only decoding circuit of FIG. 11B differs slightly from the errors and erasures decoding circuit of FIG.

11A. In particular, for the errors only mode of FIG. 11B, slices $B207_{(t/2)-1}$ through $B207_{t-1}$ form a collective slice circuit B217 and DM-register controlling MUX B211 does not receive erasure location values.

It is understood from FIG. 10 and 11A, for example, that decoding circuit B199 comprises t number of slices, in particular nominal slices $B207_k$ and terminator slice B208A. Slices B207 and B208A are connected together in the manner shown in FIG. 11A for the errors and erasures mode and in the manner shown in FIG. 11B for the errors only mode. In both modes, slice $B207_k$ is representative for slice k for k=1,2, . . . ,t−1 and B208A represents slice t.

Figure 12A:
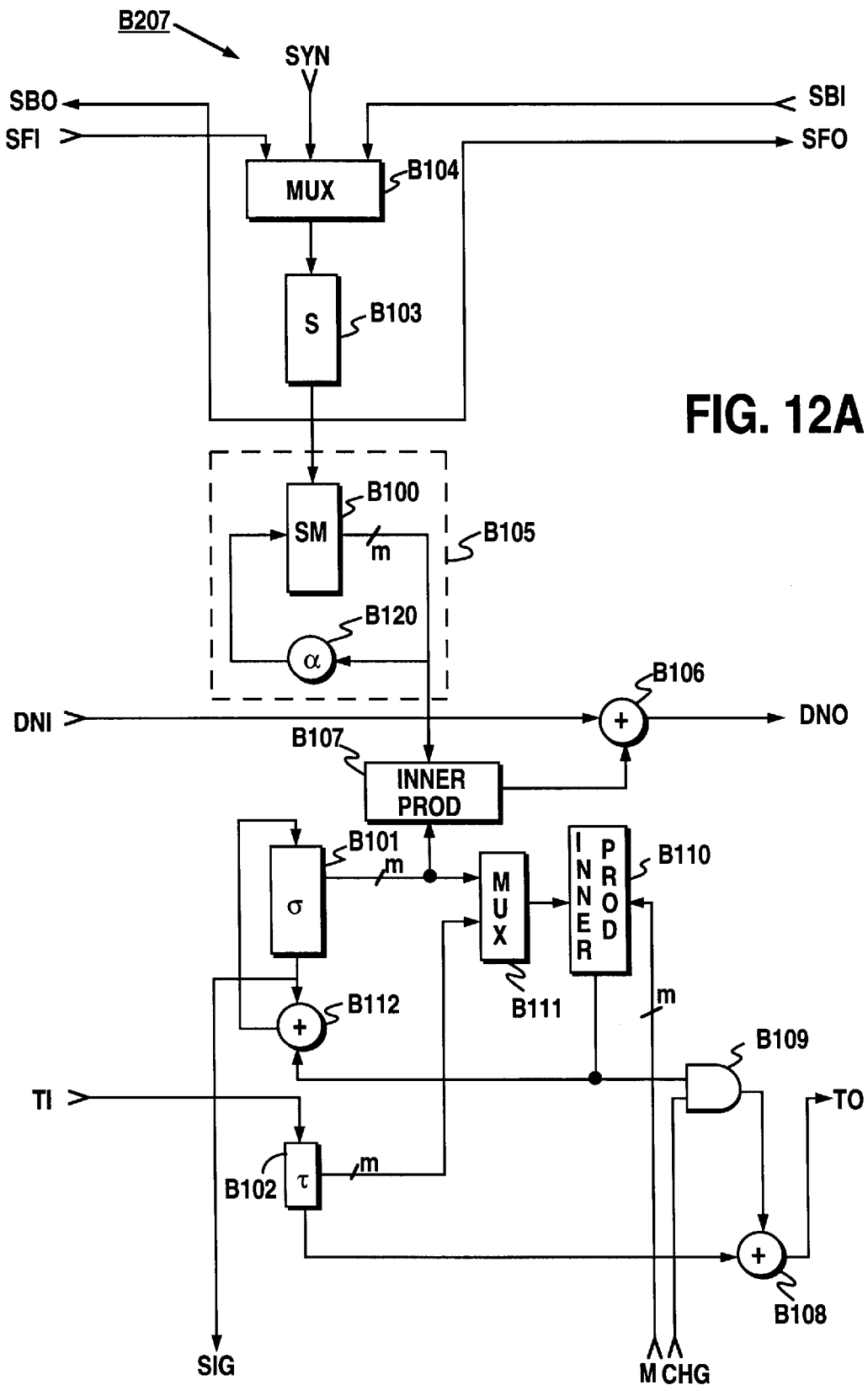
FIG. 12A is a schematic view of a slice of a decoder circuit (errors and erasures mode) according to an embodiment of the invention.
Figure 12B:
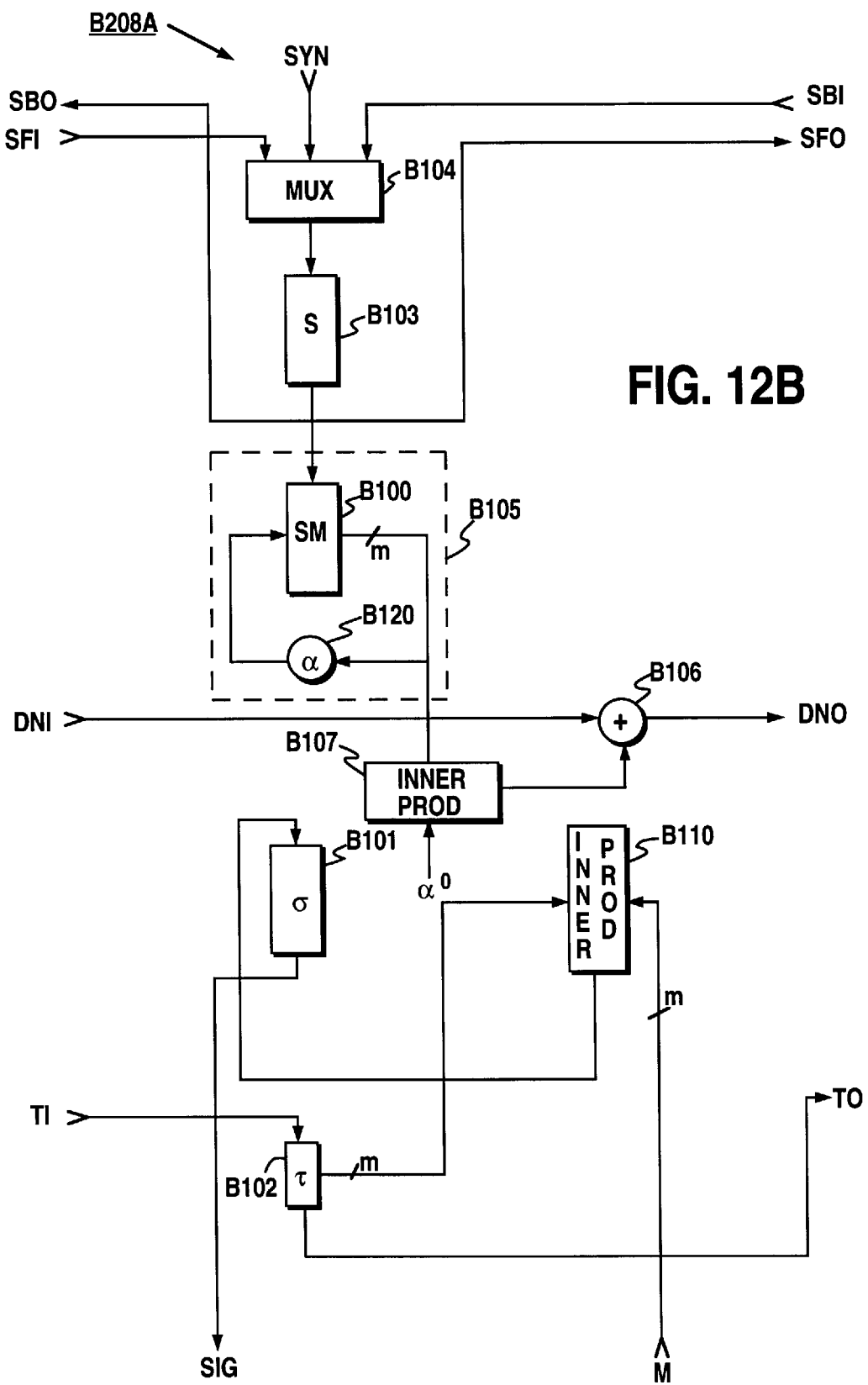
FIG. 12B is a schematic view of a terminal slice of a decoder circuit (errors and erasures mode) according to an embodiment of the invention.
Figure 12C:
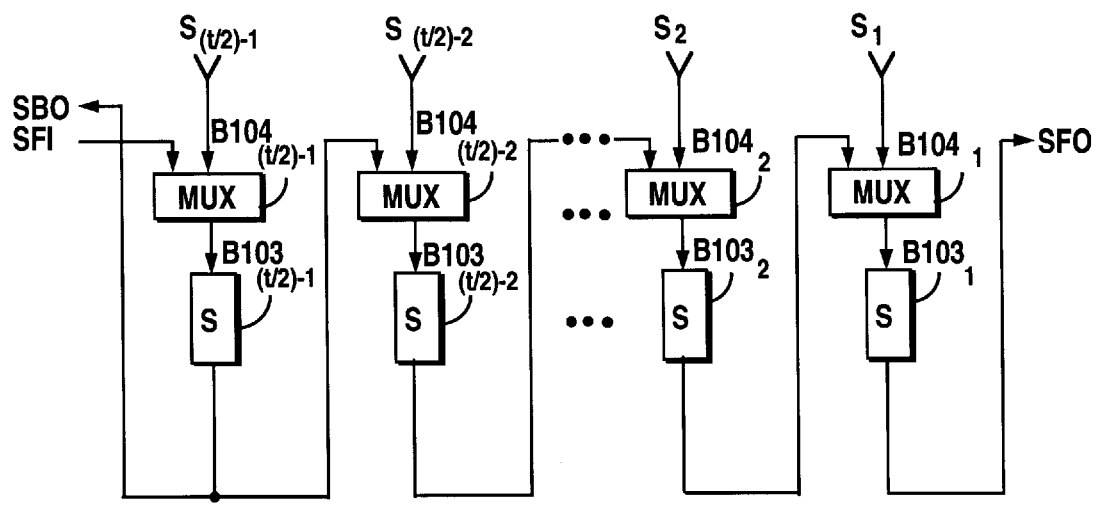
FIG. 12C is a schematic view of a collective slice circuit of a decoder circuit (errors only mode) according to an embodiment of the invention.
Figure 12D:
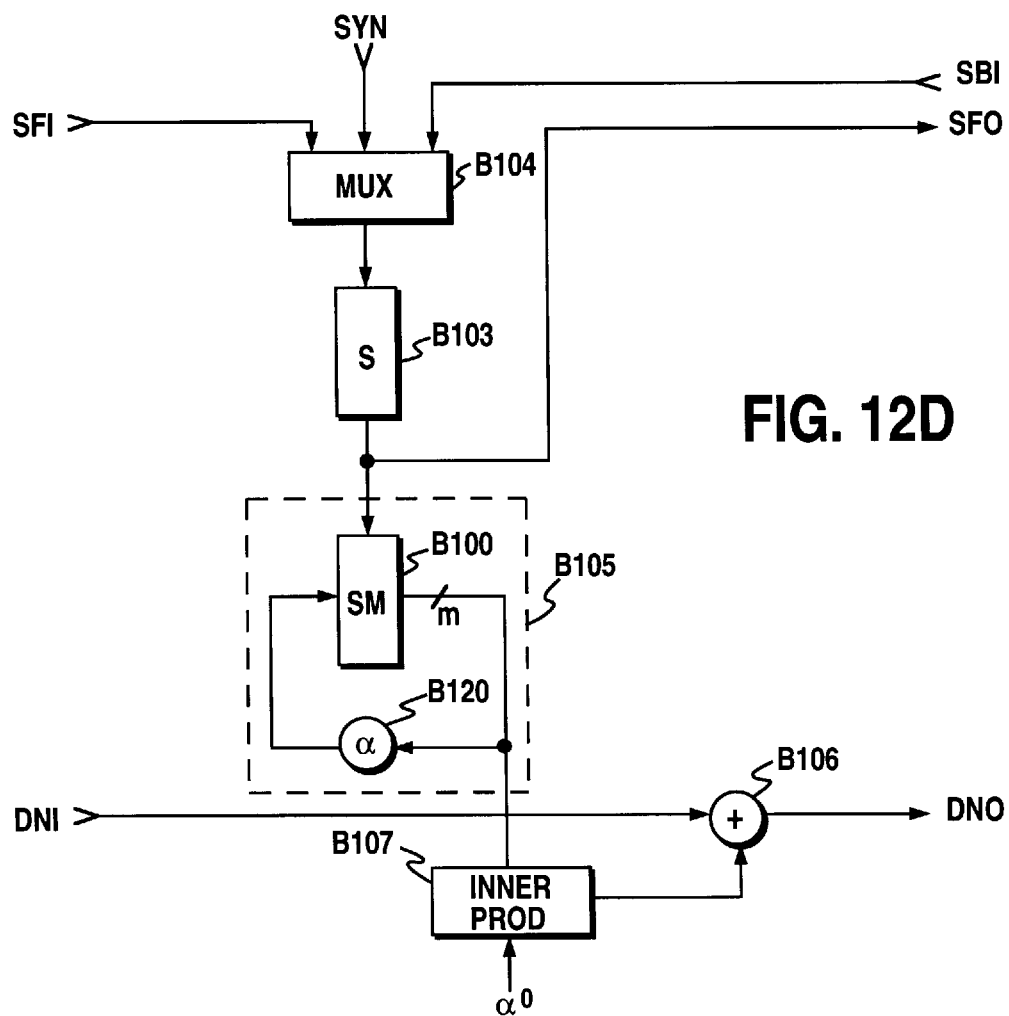
FIG. 12D is a schematic view of a terminal slice of a decoder circuit (errors only mode) according to an embodiment of the invention.

FIG. 12A shows details of slices $B207_k$ for the errors and erasure mode and FIG. 12B shows details of slice B208A for the errors and erasures mode. In the errors only mode of FIG. 11B, slice $B207_1$ through and including slice $B207_{t/2}$ are identical to the slices $B207_k$ illustrated in FIG. 12A. However, for the errors only mode, slices $B207_{(t/2)-1}$ through $B207_{t-1}$ form the collective slice circuit B217, shown in FIG. 12C, and slice 208B is as shown in FIG. 12D.

FIG. 12A shows that slices $B207_k$ comprise registers B101, B102, and B103. As also shown in FIG. 12A, syndrome register B103 is loaded via a MUX B104 with syndrome data either from syndrome generator 20 (signal SYN) or from a syndrome register in one of two adjacent slices (using either signal SFI or signal SBI). A select pin of MUX B104 is controlled by timer/controller B198 in accordance with iteration number, phase of iteration, and type of iteration. Error locator registers 101 and intermediate registers B102 are all initialized to zero.

Other components of slices $B207_k$ are included in register update circuit B50, in particular: modified-syndrome multiplication circuit B105; adder B106; discrepancy-contributing inner product circuit B107; adder B108; τ-output AND gate B109; an updating multiplier or inner product circuit B110; coefficient selecting-MUX B111; and adder B112. As with other MUXes described herein, coefficient selecting-MUX Bill is controlled by timer/controller B198 in accordance with iteration number, phase of iteration, and type of iteration.

A multiplicative product of each slice is generated by discrepancy-generating inner product generator circuit B107. Discrepancy-contributing inner product generator circuit B107 of a slice takes the inner product of the modified syndrome register B100 of the slice (in first or α basis representation) and the contents of the intermediate register B102 of the slice (in second or β basis representation). The product of two elements of $GF(2^m)$, where one element is represented in the standard or α basis and one element is represented in the dual or β basis, can be produced serially, i.e. one output bit per clock, by taking the inner product of the two elements and multiplying one of the elements by α on each clock. Thus, in connection with the inner product generated by the discrepancy-contributing inner product generator circuit B107, the modified syndrome register B100 initially receives the syndrome value of its corresponding syndrome register B103, but is updated to contain an α-multiple of the syndrome value by virtue of multiplier feedback circuit B105.

Output pins of error locator register B101 are connected both to a first port of inner product circuit B107 and to a first port of coefficient selecting-MUX B111. A second port of inner product circuit B107 is connected to modified-syndrome multiplication circuit B105. As shown in FIG. 12A, modified-syndrome multiplication circuit B105 includes a modified syndrome register B100 which receives a syndrome value from syndrome register B103 paired therewith. Modified syndrome register B100 has an α-multiple feedback circuit B120 connected thereto, such that the output of modified syndrome register B100 is an α-multiple of the syndrome value stored in register B103.

Figure 13:
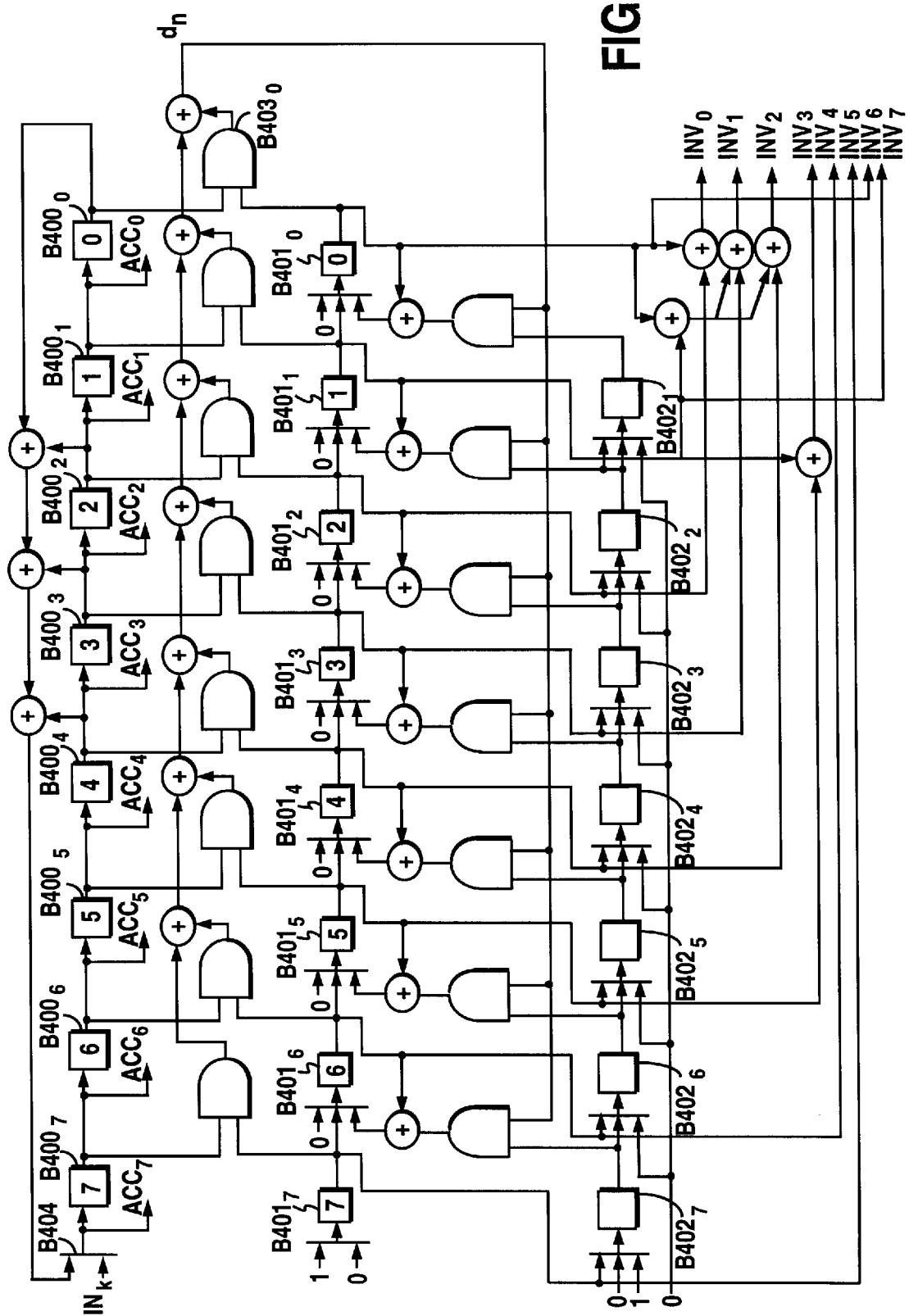
FIG. 13 is a schematic view of a circuit for calculating multiplicative inverses in $GF(2^8)$.

FIG. 13 is a schematic diagram of details of modified-syndrome multiplication circuit B105 for the example field $GF(2^8)$.

During a first phase of each error locator iteration, inner product circuit B107 takes the inner product of the m-bit quantity $\sigma^{(n)}$ (from the error locator coefficient register B101) and the m-bit quantity which is α-multiple of the syndrome value stored in register B103 (from modified syndrome register B100) to produce a bit for application to adder B106. Adder B106 adds the resultant bit from inner product circuit B107 to a signal input (from an upstream slice) on line DNI to yield output signal DNO (for application to a downstream slice).

Coefficient selecting-MUX B111 has its second input port connected to an output port of the intermediate register B102. An output port of MUX B111 is connected to a first input port of inner product register B110. A second input port of inner product register is connected by line M to DM register B210 in the manner already described. An output port of inner product register B110 is connected both to a first input pin of AND gate B109 and to a first input of adder B112. An output port of adder B112 is connected to an input port of error locator register B101. A serial output port of error locator register B101 is connected both to a second input of adder B112 and by serial line SIG to root search and error/erasure magnitude generator 26 (see 11A). A second output port of intermediate register B102 is connected to a first input port of adder B108. A second input port of adder B108 is connected to an output port of AND gate B109. AND gate B109 has its first input port connected to the output port of inner product circuit B110 and its second input port connected by line CHANGE_L to controller B213 in the manner already described.

Slice B208A of FIG. 12B (errors and erasures mode) differs slightly from slices $B207_k$, as appears from a comparison of FIG. 12A (slices $B207_k$) and FIG. 12B (slice B208A). In particular, in slice B208A, MUX B111, adder B108, AND gate B109, and adder B112 are eliminated. The output port of error locator register B101 is connected only to coefficient output line SIG. The discrepancy-contributing inner product circuit B107 of slice B208A receives the value $\alpha^0$ at its first port and has its second port connected to modified-syndrome multiplication circuit B105. Inner product circuit B110 has its input port connected to the output port of the intermediate register B102. The output of inner product circuit B110 is connected only (and directly) to the input port of locator coefficient register B101. The output port of intermediate register B102 is connected to line TO.

Slice B208A of FIG. 12D (errors only mode) differs from slice B208A of FIG. 12B (errors and erasures mode) by elimination of locator coefficient register B101, intermediate coefficient register B102, and inner product circuit B110.

The structure of discrepancy inversion circuit B212 of FIG. 11A and 11B is understood from the above referenced U.S. Pat. No. 5,467,297 entitled "FINITE FIELD INVERSION", which is incorporated herein by reference.

Figure 14:
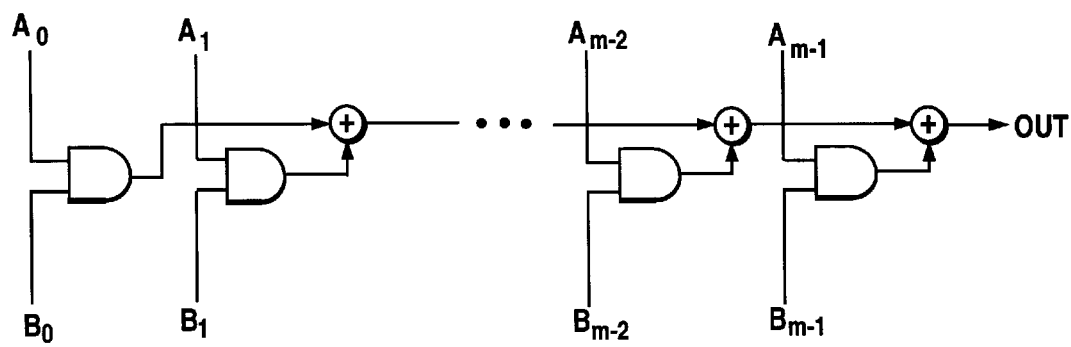
FIG. 14 is a schematic view of an inner product generator circuit.
Figure 15:
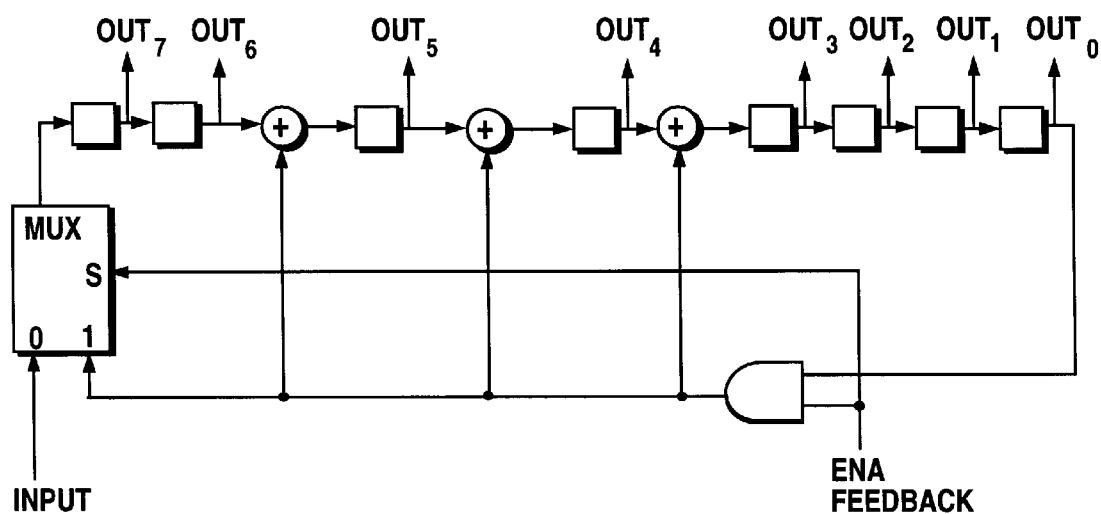
FIG. 15 is a schematic view of a modified-syndrome multiplication circuit according to an embodiment of the invention.

FIG. 14 shows a schematic diagram of inner product generator circuit B107 of FIG. 12A, 12B and 12D for one illustrative example of the invention. In the illustrative example of FIG. 14, it is assumed that the field is $GF(2^8)$ with field generator $x^8+x^4+x^3+x^2+1$. As taught in the above '297 U.S. Patent, the β representation of an element is governed by the choice for $\alpha_0$. For the illustrative example it is assumed that $\alpha_0$ is $\alpha^{-4}$.

Decoder Operation: Overview

Figure 18:
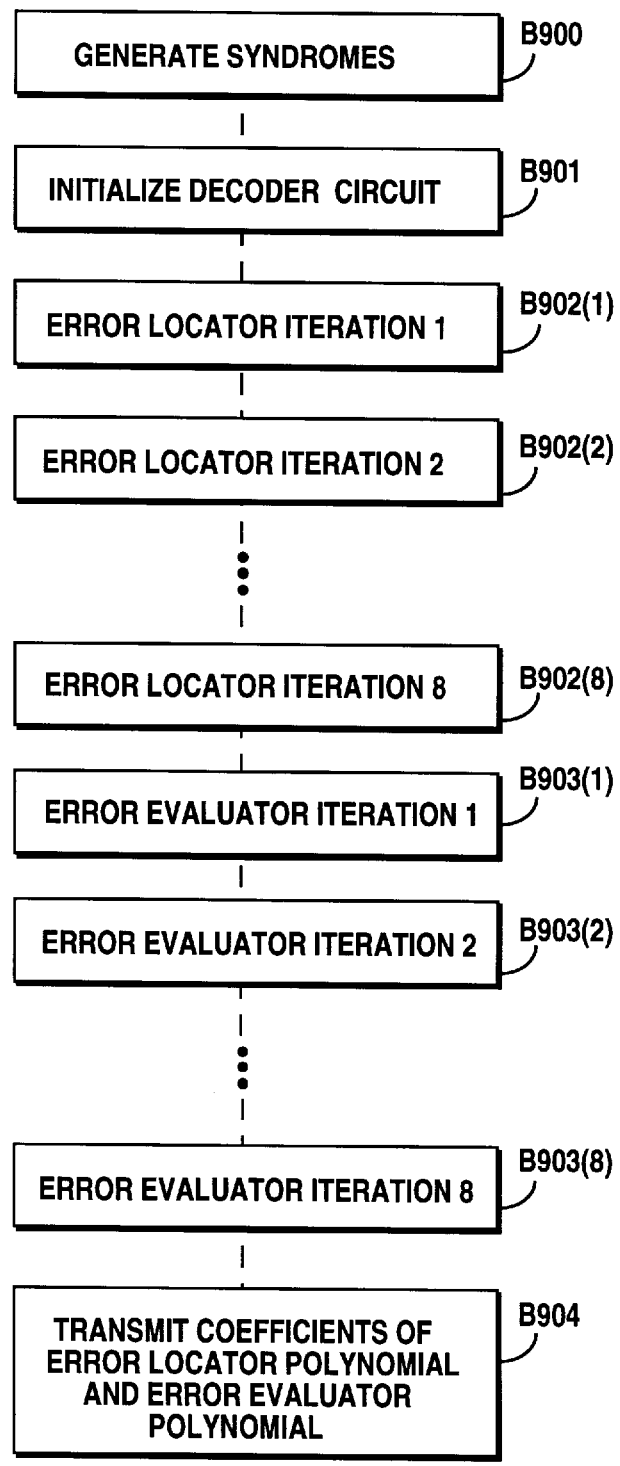
FIG. 18 is a flowchart showing general steps involved in error correction according to an embodiment of the invention.

FIG. 18 shows general steps involved in error correction of a codeword according to the present invention, beginning with generation of syndromes $S_0, S_1, \ldots S_7$ for a codeword at step B900 by syndrome generator 20 of FIG. 1C. Step B901 involves initializing the decoder circuit B199. After initialization, decoding circuit performs a plurality of error locator iterations (steps B902(1) through B902(8)) followed by a plurality of error evaluator iterations (steps B903(1) through B903(8)). The number of iterations depends on the number of check symbols in the codeword and is illustrated as eight in the present embodiment.

The error locator iterations determines coefficients of the error locator polynomial $\sigma(x)$ which are then stored in the error locator registers B101 of FIG. 12A and 12B. The error evaluator iterations obtain coefficients of the error evaluator polynomial $\omega(x)$ which are then stored in the intermediate registers ($\tau$ registers) B102 of FIG. 12A and 12B. After obtaining the final values of the coefficients, at step B904 the coefficients of the error locator polynomial $\sigma(x)$ [in the error locator registers B101] are serially transmitted on lines SIG, and the coefficients of the error evaluator polynomial $\omega(x)$ [in the intermediate registers ($\tau$ registers) B102] are serially transmitted on lines TO, to root search and error/erasure magnitude generator 26 of FIG. 1C.

As will be explained further herein, each error locator iteration comprises two phases or stages: a first phase (also called phase A), and a second phase (also called phase B). During phase A of each error locator iteration, the current discrepancy $d_n$ is generated and the coefficient values in the intermediate registers ($\tau$ registers) B102 are updated. During phase B of each error locator iteration, the coefficient values in the error locator registers ($\sigma$ registers) B101 are updated and, at the end of phase B, the inverse of the discrepancy $d_{n-1}$ is available (which becomes known as the inverse of the prior discrepancy or $d_{n-1}^{-1}$ during the next error locator iteration).

The error locator iterations of the present invention include an implementation of the Berlekamp-Massey algorithm based on the following recursion rules:

1) update $\tau$: $\tau^{(n)}(x)=x\tau^{(n-1)}(X)$ or
   $\tau^{(n)}(X)=x(\tau^{(n-1)}(x)+d_{n-1}^{-1}\sigma^{(n)}(x))$
   calculate $d_n$: $d_n = \Sigma \sigma_k S_{n-k}$
2) update $\sigma$: $\sigma^{(n+1)}(X)=\sigma^{(n)}(x)-d_n\tau^{(n)}(X)$ During the first m clocks (e.g., phase A) of an error locator iteration, the $\tau(x)$ for the previous iteration is calculated, i.e. $\tau^{(n)}(x)$ is calculated, not $\tau^{(n+1)}(x)$. According to the present invention, the coefficients of the polynomials $\tau(x)$ and $\sigma(x)$ need not be updated at the same time since they do not depend on each other, i.e. $\sigma^{(n+1)}(x)$ depends on $\tau^{(n)}(x)$ and $\tau^{(n)}(x)$ depends on $\sigma^{(n)}(X)$, not $\sigma^{(n-1)}(x)$ Therefore $\tau(x)$ can be updated using $\sigma(x)$ and then $\sigma(x)$ can be updated using the already updated $\tau(x)$. The final update for $\tau(x)$ is never done (which is acceptable since $\tau(x)$ is only useful for updating $\sigma(x)$ and, moreover, once the final update for $\sigma(x)$ is done the final update for $\tau(x)$ is not needed).

The recursion equation for $\tau(x)$ can be written as:
$\tau^{(n+1)}(x)=x\tau^{(n)}(x)$ or $x\tau^{(n)}(x)+xd_n^{-1}\sigma^{(n+1)}(x)$.

To show that these equations are valid, the recursion equation for $\sigma^{(n+1)}(X)$ is substituted into the recursion equation for $\tau(x)^{(n+1)}$ to yield:

$\tau^{(n+1)}(x)=x\tau^{(n)}(X)$ or
$x\tau^{(n)}(x)+xd_n^{-1}(\sigma^{(n)}(x)-d_n\tau^{(n)}(x))=x\tau^{(n)}(x)$ or
$xd_n^{-1}\sigma^{(n)}(x)$ which is identical to EQUATIONS 1.

During the first m clocks of an error locator iteration, the inverse of the discrepancy of the previous iteration (i.e., $d_{n-1}^{-1}$) is used. In accordance with an advantage of the present invention, a sequential method may be used for obtaining $d_{n-1}^{-1}$ instead of the usual $2^m \times m$ ROM. This sequential method is implemented by the discrepancy inversion circuit B212 of FIG. 11A and 11B, which is more fully described in U.S. Pat. No. 5,467,297 entitled "FINITE FIELD INVERSION" incorporated herein by reference.

In the update equation for $\tau^{(n)}(x)$, the first choice is taken when the order of $\sigma(x)$ is not changed and the second choice is taken when the order of $\sigma(x)$ is changed. If the signal CHANGE_L is used to indicate those iterations during which the order of $\sigma(x)$ is changed, then the recursion equations can be written according to EQUATIONS 3.

EQUATIONS 3:
1) update $\tau$: $\tau^{(n)}(x)=x(\tau^{(n-1)}(x)+d_{n-1}^{-1}\sigma(x)*\text{CHANGE\_L})$
   calculate dn:

$$d_n = \sum_{k=0}^{t-1} \sigma_k^{(n)} S_{n-k}$$

2) update $\sigma$: $\sigma^{(n+1)}(x)=\sigma^{(n)}(x)-d_n\tau^{(n)}(X)$

Decoder Operation: Syndrome Generation

The syndrome generation step B900 of FIG. 18 is conventional and understood by those skilled in the art. Assume the Reed-Solomon codeword generator polynomial is:

$$G(x) = \prod_{k=0}^{t-1} (x + \alpha^{L+k})$$

Then a data sequence $D(x)$ is coded into a codeword $C(x)$ in the following way: $C(x)=D(x)x^t-(D(x)x^t)$ mod $G(x)$. When a possibly corrupted codeword, $R(x)=C(x)+E(x)$, is received it is stored in buffer 32 and sent to the syndrome generator 20. At some later point, as determined by the asynchronous control of buffer 32, a byte-to-be corrected in the codeword $R(x)$ is sent to register 28 in FIG. 1C. The syndromes are calculated as:

$S_k=R(x)$ mod$(x+\alpha^{L+k})$ for $k=0,1, \ldots, t-1$.

decoder Operation: Initialization

In initialization step B901 (see FIG. 18), syndrome values $S_0, S_1, \ldots S_7$ are loaded into the syndrome registers B103. In addition, the error locator registers B101, intermediate registers B102, and other values are initialized.

In the loading of syndrome values, syndrome $S_k$ is shifted into slice $B207_{t-k}$ for $k=1,2, \ldots, t-1$ and $S_0$ is shifted into slice B208A. Within each slice, shown in FIG. 12A for example, a syndrome is shifted into the S register B103 via MUX B104. Thus, initially syndrome $S_0$ is loaded into syndrome register B103 of slice B208A, awhile syndrome values $S_1, S_2, \ldots S_7$ are loaded into syndrome registers of slices $B207_7, B207_6, \ldots B207_1$, respectively. The syndrome values are serially loaded (one bit at a time) from syndrome generator 20 into the respective registers B103.

After the syndromes are initially shifted into the S registers B103, a forward shift of the syndromes is then performed wherein the contents of each S register B103 is serially shifted out (from the SFO output of each slice) to the SFI input of the next slice, and gated into the S register B103 of the next slice via MUX B104. In this initialization shift, the output of slice t (block B208A) feeds the input of slice $B207_1$, thereby forming a circular shift. During this circular shifting, the output of the S register B103 of each slice is also shifted into its paired SM register B100.

Error locator registers B101 and intermediate registers B102 of slice B208A slices B207$_1$, B207$_2$, ... B207$_7$ are reset to zero (by timer/controller B198) before the first phase of the first error locator iteration for the codeword.

Controller B213 (see FIG. 11A, for example) outputs the CHANGE_L signal to the CHG inputs of each slice. The CHANGE_L signal is initialized to "1" before starting the first iteration. The controller B213 also maintains two variables, LN and LM, which are initialized to 0 and 1 respectively. Also the DM register B210 is initialized to the alpha basis representation of $\alpha^0$ via MUX B211, which is the initial value for $d_{n-1}^{-1}$.

Decoder Operation: Discrepancy Generation

This brief discussion of generation of the current discrepancy $d_n$ is a prelude to a discussion of actual error locator iterations. Using the expression for $d_n$ from EQUATION 3

$$d_n = \sum_{k=0}^{t-1} \sigma_k^{(n)} S_{n-k}$$

it is seen that the discrepancy $d_n$ is derived from values in the locator coefficient registers B101 (i.e., the $\alpha$ registers) and the syndromes. Whereas the values stored in the locator coefficient registers B101 are in beta or second basis representation, the syndrome values are in the alpha or first basis representation. Accordingly, in order to multiply these two values together, one of the values must be repetitively multiplied by $\alpha$. In the illustrated embodiment, the syndromes are multiplied by $\alpha$ using the modified-syndrome multiplication circuit B105 as afore described.

The multiplication which yields the current discrepancy is partially accomplished using inner product circuit B107 (shown in more detail for one example field in FIG. 14). Inner product circuit B107 comprises part of a multiplier which forms part of a larger sinner product (a term of the current discrepancy $d_n$) In particular, inner product circuit B107 (together with $\alpha$ register B101 and the modified-syndrome multiplication circuit B105) comprises a multiplier structure that produces, for each clock pulse, a serial output which is applied to adder B106.

Adder B106 sums the serial outputs of comparable multipliers of other slices to obtain an inner product of the syndromes with the current coefficients of the error locator polynomial. Thus, it should be understood that all slices are simultaneously conducting a multiplication and producing a one-bit output per clock cycle, which one-bit output is added (by adders B106) to the output of other slices to obtain a bit of the current discrepancy. Moreover, during the clock cycle in which a bit of the discrepancy $d_n$ is generated, that bit is transmitted to the discrepancy inversion circuit B212.

Decoder Operation: Error Locater Iteration, (Phase A)

As mentioned before, each error locator iteration includes both a first phase (also known as phase A) and a second phase (also known as phase B).

During the first error locator iteration for each codeword, all slices B207$_1$–B207$_7$ and B208A have zero initialized in the error allocator registers (i.e., $\alpha$ registers) B101. Accordingly, slices B207$_1$–B207$_7$ contribute nothing to the discrepancy sum taking place during phase A of the first iteration. However, during the first terror locator iteration, slice B208A (which has been initialized with syndrome $S_0$ and with $\alpha^0$ as the other input to inner product circuit CB107) will produce a non-zero output (basically, $S_0\alpha^0$= $S^0$). Thus, during the first clock of phase A, inner product circuit B107 of slices B207 put out a bit of zero as their product. These bit zeros are added together by adders B106 to the non-zero output of slice B208A, which sum is bit 0 of the current discrepancy $d_n$. The thusly-obtained bit 0 of the current discrepancy $d_n$ is shifted during the same clock cycle to discrepancy inversion circuit B212 (see FIG. 13), which immediately begins its inversion.

During each clock cycle of the first error locator iteration, a further bit of the first term of the current discrepancy is obtained (from slice B208A exclusively during the first iteration) and applied to discrepancy inversion circuit B212.

During phase A of the first iteration, the intermediate registers (i.e., $\tau$ registers) B102 have all been initialized to zero. During the first iteration, $\tau_0$ (register B102 in slice B207$_1$) is initialized to $\alpha^0$ by virtue of the fact that DM register B210 has been initialized to $\alpha^0$ and CHANGE-L has been initialized to 1.

During error locator iterations other than the first iteration for a codeword, the values in the intermediate registers ($\tau$ registers) B102 are updated. The manner in which the update of $\tau$ registers B102 is updated depends on the result of the previous iteration (e.g. whether there was a length change as indicated by signal CHANGE_L).

Basically, in order to update the values in the intermediate registers ($\tau$ registers) B102 during phase A, decoder circuit B199 multiplies values in the error locator registers B101 (e.g., $\sigma$ registers) by $d_{n-1}^{-1}$. This implements EQUATIONS 3, which state in part $\tau^{(n)}(x)=x(\tau^{(n-1)}(x)+d_{n-1}^{-1}\sigma(x)*CHANGE\_L)$ The quantity $d_{n-1}^{-1}$ is initialized to $\alpha^0$ in the DM register B210 for the first iteration, and thereafter is generated by discrepancy inversion circuit B212 and loaded into DM register B210 via MUX B211.

More specifically describing the update of the intermediate register B102, during phase A the contents of the error locator register B101 is transmitted via MUX Bill to a first port of inner product circuit B110. The second input port of inner product register is connected by line M to DM register B210 to receive an $\alpha$ multiple of $d_{n-1}^{-1}$. The output of inner product circuit B110 is applied to AND gate B109 and (if required by signal CHANGE_L) is added (by adder B108) to the contents of the intermediate register B102 (i.e., $\tau$register) for application on line TO to the $\tau$ register B102 of the rightwardly neighboring slice. If signal CHANGE_L does not require, the contents of the intermediate register B102 (i.e., $\tau$ register) are directly applied on line TO to the $\tau$ register B102 of the rightwardly neighboring slice without addition of the output of inner product circuit B110. Thus, it requires all clocks of phase A in order to update the intermediate registers B102 (i.e., $\tau$ register) of all slices.

The values in the error locator registers (e.g., $\sigma$ registers) B101 do not change during the first phase of an error locator iteration. However, the value in register SM B100 (initially loaded with the syndrome) is being clocked with $\alpha$ feedback during each clock cycle. The original syndrome value remains in register B103 during the first phase of each iteration.

At the end of phase A, all 8 bits of the current discrepancy have been shifted (in second or beta basis representation) into discrepancy inversion circuit B212; have been converted into first or $\alpha$ basis representation (by conversion circuit B214); and, have been muxed into DM register B210 for use during phase B. However, at the end of phase A, discrepancy inversion circuit B212 still needs another eight clock cycles (e.g., the duration of phase B) in order to generate the inverse of $d_n$.

Phase A execution of decoding circuit B199 differs from iteration to iteration primarily by the fact that registers B103 (and hence registers B100) and α registers B101 have been loaded/updated with different values. As explained below, during phase B syndrome values are circularly shifted and α register values are updated. Hence, during a second error locator iteration for a codeword, two slices (e.g, slices B208A and slice B207$_1$) will be operative in yielding current discrepancy d$_n$. Similarly, with respect to discrepancy generation, three slices will be operative during a third iteration, four slices during a forth iteration, and so on until all slices are operative during the eight (last) error locator iteration. At the end of each phase A execution, decoder circuit B199 has generated d$_n$; has shifted dn into discrepancy inversion circuit B212; and, has updated intermediate registers B102 (i.e., τ register) of all slices.

Decoder Operation: Error Locater Iteration, Phase B

Phase B also has, in the illustrated embodiment, eight clock cycles. Three major actions occur during phase B: the syndromes are serially shifted to an adjacent slice; generation of the inverse of d$_n$ (which will be known as d$_{n-1}^{-1}$ during the next error locator iteration) is completed; and, values in the error locator registers (σ registers B101) are updated using the values in the intermediate registers B102 and the value of d$_n$ which was just generated during phase A.

During phase B of each error locator iteration, decoder circuit B199 serially shifts the syndrome values in preparation for the next phase A so that a new d$_n$ can be generated during the next phase A. In this respect, a forward shift of the syndromes is performed wherein the contents of each S register B103 is shifted out the slice SFO output to the SFI input of the next slice and into the S register B103 of the next slice (via MUX B104). The output of slice B208A feeds the input of slice B207$_1$ forming a circular shift. During this shifting, the transmitting slice also shifts the outgoing syndrome value into its SM register B100.

At the beginning of phase B, DM register B210 contains not d$_{n-1}^{-1}$, but d$_n$ of the current iteration (which was just determined during phase A). The value dn in DM register B210 has been converted (by conversion circuit B214) to alpha representation, which is necessary for conducting an inner product operation with respect to the contents of the intermediate registers B102 (τ registers) which are in β basis representation. After the first clock cycle of phase B, the value of d$_n$ is multiplied by α so that the contents of DM register becomes an α-multiple of d$_n$ for use in phase B.

During phase A, the intermediate registers B102 (i.e., τ registers) were updated by shifted values while the error locator registers (e.g., σ registers) B101 stayed fixed. During phase B, on the other hand, the error locator registers (e.g., σ registers) 101 are updated while the intermediate registers B102 (i.e., τ registers) remain fixed. In fact, it is the intermediate registers B102 (i.e., τregisters) that are used to update the values of the coefficients of the error locator polynomial stored in the error locator registers B102.

During phase B, the coefficients of the error locator polynomial are updated according to EQUATIONS 3

$$\sigma^{(n+1)}(X) = \sigma^{(n)}(x) - d_{n\tau}^{(n)}(X)$$

The contents of the intermediate registers B102 (i.e., τ registers) are applied through MUX B111 to the first input port of inner product circuit B110. Inner product circuit B110 forms an inner product with the contents of the τ register and d$_n$ (dn having been applied on line M). The output of inner product circuit B110 is a serial bit (one bit per clock of phase B), which is added by single bit adder B112 to the serially shifted-out contents of error locator register (e.g., σ register) B101. Thus, it takes eight clock cycles to update the contents of the error locator register (e.g., σ register) B101 for each slice. The updating operation just-described for error locator register (e.g., σ register) B101 of one slice simultaneously occurs for all slices (there being, of course, differing values in the σ registers B101 of differing slices).

Thus, when phase A of the next error locator iteration begins, the phase A operations will be executed with the new values in the σ registers B101 as updated during the previous phase B. Also, at the end of phase B, discrepancy inversion circuit B212 has completed the inversion of d$_n$, which is available at the INV outputs and applied via MUX B211 into DM register B210 for use as d$_{n-1}^{-1}$ during phase A of the next error locator iteration.

At the end of phase B of the last (eighth) error locator iteration, the final values of the coefficients of the error locator polynomial for the codeword are stored in the a registers B101.

Decoder Operation: Error Evaluator Iteration

After completion of the last error locator iteration for a codeword (e.g., after step B902(8) of FIG. 18, the final values of the coefficients of the error locator polynomial for the codeword are stored in the σ registers B101. Yet remaining is the generation of coefficients for the error evaluator polynomial. Advantageously, using another eight iterations (distinctly known as error evaluator iterations) as depicted by steps B903(1)–B903(8) of FIG. 18, decoder circuit B199 generates the error evaluator coefficients and stores those coefficients in the intermediate registers B102 (τ registers).

The final values of the coefficients of the error locator polynomial for the codeword are used to generate the error evaluator polynomial ω(x). The coefficients of the error evaluator polynomial ω(x) are defined as:

$$\omega_k = \sum_{j=0}^{k} \sigma_j S_{k-j}$$

for k=0,1, . . . , t−1. Because the form of the error evaluator polynomial ω(x) is the same as that for calculating d$_n$, the decoding circuit B199 can find coefficients for both polynomials. The coefficients are generated in t double phase iterations (assuming t errors to correct).

The error evaluator iterations are similar to phase A of the error locator iterations with the following modifications:

(1) During phase A of the last error locator algorithm iteration (e.g., step B902(8) of FIG. 18), the syndrome registers B103 in each slice are backward shifted, i.e. the contents of the S registers B103 are shifted out SBO output and into the SBI input of the preceding slice and into the S register B103 of the previous slice via MUX B104. A signal G from controller B213 is set to "1" during this backward shift of syndromes.

(2) During phase B of the last error locator iteration (e.g., step 3902(8) of FIG. 18), the S registers B103 in each slice are again backward shifted and at the same time the output of the S register B103 in each slice is shifted into the SM register B100. During this and all subsequent backward shifts the signal G output from controller B213 is set to "0". Setting signal G in this manner forces "0"s into the SBI input of slice t−1 by AND gate 3216.

(3) During phase A of each error evaluator iteration (also known as an iteration), the DNO output of slice t is ω$_k$ where k is t−1 for the first ω iteration, t−2 for the second, etc., and 0 for the last ω iteration, $\omega_k$ is shifted into the TI input of slice 1 via MUX 3215.

(4) During phase B of each ω iteration, the S registers B104 are backward shifted and also shifted into the SM registers 3100. The σ registers B101 do not shift.

(5) The value of CHANGE_L is fixed at "0" as shown in FIG. 16. This allows all of the t registers to function as a single shift register so that after the t iterations the τ register in slice k contains $\omega_{k-1}$.

For example, after completion of the 8 clocks of a first error evaluator iteration, the eight bits of $\omega_7$ are loaded into τ register B102 of slice B207$_1$. After completion of a second error evaluator iteration, the eight bits of $\omega_6$ are loaded into τ register B102 of slice B207$_1$ and $\omega_7$ is transferred into τ register B102 of slice B207$_2$. Similar processing continues for all eight error evaluator iterations until all coefficients $\omega_0$–$\omega_7$ are stored in slices B207$_1$–B208A, respectively.

During the error evaluator iterations, the previously-determined final σ coefficients remain undisturbed in σ registers B101.

After the t iterations the σ and t registers are then shifted m more times so that the error locator and error evaluator polynomials can be transferred to root search and error/erasure magnitude generator 26 (see FIG. 1C).

Decoder Operation: Coefficient Transfer

After completion of all error locator iterations and all error locator iterations, and as reflected by step B904 of FIG. 18, decoder circuit B199 transfers the final values for the coefficients of the error locator polynomial (stored in the σ a registers B101) and the final values for the coefficients of the error evaluator polynomial (stored in the τ registers B102) to root search and error/erasure magnitude generator 26. Each slice of decoder circuit B199 has one σ coefficient in its σ register B101 and one ω coefficient in its τ register B102. Transfer from the σ register B101 and the τ register B102 occur (on lines SIG and TO, respectively) at a rate of one bit per clock (serial transfer), with serial transfers from both registers B101 and B102 occurring simultaneously. Thus, root search and error/erasure magnitude generator 26 receives simultaneously one bit of a σ coefficient from each slice and one bit of an ω coefficient from each slice.

Root search and error/erasure magnitude generator 26 supplies error patterns to adder B202 to correct data as it is retrieved from register B195. Error locations are found with a root search for σ(x), i.e. byte k is in error whenever $\sigma(\alpha^{-k})=0$. The error magnitude is then calculated as:

$$E_k = \frac{\alpha^{-k(L-1)}\omega(\alpha^{-k})}{\sigma'(\alpha^{-k})}$$

where σ' represents the first derivative of σ.

Decoder Operation: Erasures

Erasure pointers decrease the complexity of the Reed-Solomon decoder by decreasing the redundancy needed to correct t errors. Without erasure pointers, the Reed-Solomon decoder requires 2t redundancy symbols to correct t data symbols. For every correct erasure pointer, however, the number of necessary redundancy symbols decreases by one.

If the received sequence R(x) contains v erasures, then the erasure pointers are input during the first v error locator iterations which are modified in the following way:

(1) At the end of each phase A of the first v iterations, instead of loading $d_n$ into DM register B210, an erasure value in the form of α raised to the $e_k$ power is loaded into DM register B210 via MUX B211 (see FIG. 11A). In this nomenclature, $e_k$ is the location of the $k^{th}$ erasure, i.e., the $e_k^{th}$ coefficient of R(x).

(2) At the end of each phase B of the first v iterations, instead of loading $d_{n-1}$ into DM B210, $\alpha^0$ is loaded into DM register B210 via MUX B211.

(3) The signal CHANGE_L is fixed at "1" and at the end of each phase A, LN gets LM and LM gets LM+1. This is illustrated in FIG. 16.

Slice t, detailed in FIG. 12B, does not contain adder B112, since the only time that $\sigma_t$ is generated is when there are t erasures and no errors (in which case all iterations will be erasure iterations and the only time that the σ register in slice t will receive a non-zero value will be on the last iteration).

Decoder Operation: Errors Only Decoding

FIG. 11B shows an error correction system of the invention which (unlike the system of FIG. 11A) does not incorporate erasure correction. Since at most t/2 errors may be corrected, only t/2 Berlekamp-Massey algorithm slices are needed. Thus, in the embodiment of FIG. 11B slices (t/2)+1 to t−1 are replaced with the collective modified slice circuit B217, detailed in FIG. 12C. The slices of circuit B217 contain only an S register B103 and associated MUX B104. Slice t of the system of FIG. 11B is replaced with a modified slice B208B which is detailed in FIG. 12D. Slice B208B of FIG. 12D which contains only S register B103 (with associated MUX B104); modified-syndrome multiplication circuit B105; and inner product circuit B107. During initialization of the system of FIG. 11B, the S register B103 in slice k is loaded with $S_{t-k}$, as before, with k=1,2, ... , t/2. $S_0$ is loaded into slice B208B, as before, and the remaining syndromes are loaded into the S registers B103 contained in circuit B217. There are t iterations for generating σ(x) and then t/2 iterations for generating ω(x). The ω(x) calculated by this system has coefficients:

$$\omega_k = \sum_{j=0}^{k} \sigma_j S_{k-j+\frac{t}{2}}$$

for k=0, 1, ... , t/2−1.

The t/2 coefficients of σ(x) and the t/2 coefficients of ω(x) are then transferred into root search and error/erasure magnitude generator 26 to correct errors. A root search is performed as before and then the error magnitude is then calculated as:

$$E_k = \frac{\alpha^{-k(L-1)}\omega(\alpha^{-k})}{\sigma'(\alpha^{-k})}$$

The objects of the invention have been fully realized through the embodiments disclosed herein. Those skilled in the art will appreciate that the various aspects of the invention can be achieved through different embodiments without departing from the essential function. The particular embodiments disclosed are illustrative and not meant to limit the scope of the invention as appropriately construed from the following claims.

We claim:

1. An error correction apparatus for use in a disc storage device, wherein the disc comprises a plurality of data tracks recorded thereon, a data track comprises a plurality of data sectors and at least one redundancy sector, and a sector comprises sector data bytes and sector redundancy bytes, the error correction apparatus comprising:

(a) a data buffer connected to receive and store a data sector read from a target track;

(b) a redundancy buffer for storing track level redundancy data associated with the redundancy sector;

(c) a sector level error correction system for detecting and correcting errors in the sector data using the sector redundancy bytes; and (d) a track level error correction system for correcting an unrecoverable data sector using the redundancy sector, thereby forming a reconstructed data sector;

wherein:

the unrecoverable data sector is an uncorrectable sector containing a number of bytes in error which exceeds the error correction capability of the sector level error correction system; and the unrecoverable data sector is corrected by combining the unrecoverable data sector with the contents of the redundancy buffer according to a predetermined error correction operation.

2. The error correction apparatus as recited in claim 1, wherein:

(a) the data buffer is connected to receive and store at least two sectors of user data from a host system to be written to the disc;

(b) the sector level error correction system is connected to receive the user data from the data buffer for generating the sector redundancy bytes before writing the data sector to the disc;

(c) the track level error correction system is connected to receive the user data from the data buffer for generating track level redundancy data stored in the redundancy buffer; and (d) the sector level error correction system is connected to receive the track level redundancy data from the redundancy buffer for generating the sector redundancy bytes for the redundancy sector before writing the redundancy sector to the disc.

3. The error correction apparatus as recited in claim 1, wherein:

(a) the data buffer is connected to receive and store sector data bytes of at least two sectors read from the disc; and (b) the sector level error correction system is connected to receive and correct erroneous sector data bytes from the data buffer, the erroneous sector data bytes in the data buffer being replaced with corrected sector data bytes.

4. The error correction apparatus as recited in claim 3, wherein the track level error correction system is connected to receive corrected sector data bytes from the data buffer for generating the track level redundancy data according to a predetermined error correction operation.

5. The error correction apparatus as recited in claim 1, wherein:

(a) the track level error correction system is connected to receive uncorrected sector data bytes read from the disc for generating the track level redundancy data according to a predetermined error correction operation;

(b) the sector level error correction system generates data sector correction values for correcting a data sector stored in the data buffer; and (c) the data sector correction values are used to correct the track level redundancy bytes stored in the redundancy buffer.

6. The error correction apparatus as recited in claim 1, wherein the track level redundancy data is generated by reading all readable bytes in at least two data sectors of a selected track, and combining the readable bytes according to a predetermined error correction operation.

7. The error correction apparatus as recited in claim 6, wherein the error correction operation is an XOR operation.

8. The error correction apparatus as recited in claim 1, wherein the sector level error correction system operates on-the-fly.

9. The error correction apparatus as recited in claim 8, wherein the sector level error correction system is a Reed-Solomon error correction system capable of correcting at least three random burst errors.

10. The error correction apparatus as recited in claim 8, wherein the track level redundancy data is corrected on-the-fly using data sector correction values generated by the sector level error correction system.

11. An error correction apparatus for use in a disc storage device, wherein the disc comprises a plurality of data tracks recorded thereon, a data track comprises a plurality of data sectors and at least one redundancy sector, and a sector comprises sector data bytes and sector redundancy bytes, the error correction apparatus comprising:

(a) a data buffer connected to receive and store a data sector read from a target track;

(b) a redundancy buffer for storing track level redundancy data associated with the redundancy sector;

(c) a sector level error correction system for detecting and correcting errors in the sector data using the sector redundancy bytes;

(d) a track level error correction system for reconstructing an unrecoverable data sector using the redundancy sector, thereby forming a reconstructed data sector; and (e) a means for mapping the unrecoverable data sector to a spare data sector.

12. The error correction apparatus as recited in claim 11, further comprising a means for sector slipping the target track during idle time of the storage device.

13. An error correction apparatus for use in a disc storage device, wherein the disc comprises a plurality of data tracks recorded thereon, a data track comprises a plurality of data sectors and at least one redundancy sector, and a sector comprises sector data bytes and sector redundancy bytes, the error correction apparatus comprising:

(a) a data buffer connected to receive and store a data sector read from a target track;

(b) a redundancy buffer for storing track level redundancy data associated with the redundancy sector;

(c) a sector level error correction system for detecting and correcting errors in the sector data using the sector redundancy bytes;

(d) a track level error correction system for reconstructing an unrecoverable data sector using the redundancy sector, thereby forming a reconstructed data sector; and (e) a means for writing the reconstructed data sector to the unrecoverable data sector and rereading the unrecoverable data sector to determine if the unrecoverability persists.

14. In a disc storage device, wherein the disc comprises a plurality of data tracks recorded thereon, a data track comprises a plurality of data sectors and at least one redundancy sector, and a sector comprises sector data bytes and sector redundancy bytes, a method for correcting errors in at least one data sector comprising the steps of:

(a) reading and storing a data sector in a data buffer;

(b) correcting errors in the data sector stored in the data buffer using the sector redundancy bytes;

(c) generating track level redundancy bytes by combining two or more uncorrected sectors read from the disc according to a predetermined error correction operation;

(d) storing the track level redundancy bytes in a redundancy buffer; and (e) correcting errors in the track level redundancy bytes stored in the redundancy buffer using correction information generated in step (b).

15. The method for correcting errors as recited in claim 14 wherein the predetermined error correction operation of step (c) is an XOR operation.

16. The method for correcting errors as recited in claim 14, wherein the step of correcting errors using the sector redundancy bytes occurs on-the-fly using a Reed-Solomon code capable of correcting at least three random burst errors.

17. The method for correcting errors as recited in claim 14, further comprising the step of correcting errors in one of the data sectors stored in the data buffer by combining the data sector with the contents of the redundancy buffer according to a predetermined error correction operation.

18. The method for correcting errors as recited in claim 14, further comprising the step of correcting errors in one of the data sectors stored in the data buffer by replacing bytes in the data sector with bytes in the redundancy buffer.

19. The method for correcting errors as recited in claim 14, wherein the step of correcting errors in the track level redundancy bytes is performed on-the-fly.

20. The method for correcting errors as recited in claim 14, further comprising the step of flagging a catastrophic error event if no unrecoverable data sectors are detected and the track level redundancy after step (e) is not a predetermined value.

21. In a disc storage device, wherein the disc comprises a plurality of data tracks recorded thereon, a data track comprises a plurality of data sectors and at least one redundancy sector, and a sector comprises sector data bytes and sector redundancy bytes, a method for writing a data sector to the disc comprising the steps of:

(a) receiving a data sector from a host system to be written to the disc;

(b) storing the received data sector in a data buffer;

(c) reading the data sector from the data buffer and generating sector level redundancy bytes and track level redundancy bytes in response thereto, the track level redundancy bytes being stored in a redundancy buffer;

(d) appending the sector level redundancy bytes of step (c) to the data sector of step (c) to generate a data codeword and writing the data codeword to the disc;

(e) repeating steps (c) and (d) at least once;

(f) reading the track level redundancy bytes from the redundancy buffer and generating sector level redundancy bytes in response thereto; and (g) appending the sector level redundancy bytes of step (f) to the track level redundancy bytes of step (f) to generate a redundancy codeword and writing the redundancy codeword to the disc.

22. The method of writing a data sector as recited in claim 21; wherein the track level redundancy bytes are further generated by reading at least one data sector form the disc and combining the data sector with the redundancy buffer according to a predetermined error correction operation.

23. An error correction apparatus for use in a disc storage device, wherein the disc comprises a plurality of data tracks recorded thereon, a data track comprises a plurality of data sectors and at least one redundancy sector, and a sector comprises sector data bytes and sector redundancy bytes, the error correction apparatus comprising:

(a) a redundancy buffer for storing track level redundancy data associated with the redundancy sector;

(b) a sector level error correction system for detecting and correcting errors in the sector data using the sector redundancy bytes; and (c) a track level error correction system for reconstructing an unrecoverable data sector using the redundancy sector and the redundancy buffer, thereby forming a reconstructed data sector, wherein the track level error correction system modifies the track level redundancy data stored in the redundancy buffer using correction data generated by the sector level error correction system.

* * * * *